(12) United States Patent
Davis

(10) Patent No.: US 9,478,422 B2
(45) Date of Patent: Oct. 25, 2016

(54) METHODS FOR FABRICATING REFINED GRAPHITE-BASED STRUCTURES AND DEVICES MADE THEREFROM

(71) Applicant: Solan, LLC, Salt Lake City, UT (US)

(72) Inventor: Mark Alan Davis, Springville, UT (US)

(73) Assignee: Solan, LLC, Salt Lake City, UT (US)

( * ) Notice: Subject to any disclaimer, the term of this patent is extended or adjusted under 35 U.S.C. 154(b) by 0 days.

(21) Appl. No.: 14/396,039

(22) PCT Filed: Feb. 25, 2014

(86) PCT No.: PCT/US2014/018420
§ 371 (c)(1),
(2) Date: Oct. 21, 2014

(87) PCT Pub. No.: WO2014/131043
PCT Pub. Date: Aug. 28, 2014

(65) Prior Publication Data
US 2015/0371854 A1  Dec. 24, 2015

Related U.S. Application Data

(60) Provisional application No. 61/769,170, filed on Feb. 25, 2013.

(51) Int. Cl.
| | |
|---|---|
| *H01B 13/00* | (2006.01) |
| *H01L 21/302* | (2006.01) |
| *H01L 21/461* | (2006.01) |
| *H01L 21/04* | (2006.01) |
| *H01L 21/02* | (2006.01) |
| *H01L 21/306* | (2006.01) |
| *C23C 16/26* | (2006.01) |
| *C23C 16/56* | (2006.01) |
| *H01L 21/203* | (2006.01) |

(52) U.S. Cl.
CPC ............ *H01L 21/042* (2013.01); *C23C 16/26* (2013.01); *C23C 16/56* (2013.01); *H01L 21/0226* (2013.01); *H01L 21/0262* (2013.01); *H01L 21/02263* (2013.01); *H01L 21/02373* (2013.01); *H01L 21/02527* (2013.01); *H01L 21/2033* (2013.01); *H01L 21/30604* (2013.01)

(58) Field of Classification Search
None
See application file for complete search history.

(56) References Cited

U.S. PATENT DOCUMENTS

| | | |
|---|---|---|
| 4,058,430 A | 11/1977 | Suntola et al. |
| 4,413,022 A | 11/1983 | Suntola et al. |

(Continued)

FOREIGN PATENT DOCUMENTS

KR  10-2011-0018851 A  2/2011

OTHER PUBLICATIONS

International Search Report mailed Jun. 19, 2014, for International Patent Application No. PCT/US2014/018420, 4 pages.

*Primary Examiner* — Stephanie Duclair
(74) *Attorney, Agent, or Firm* — Morgan, Lewis & Bockius LLP

(57) ABSTRACT

Graphite-based devices with a reduced characteristic dimension and methods for forming such devices are provided. One or more thin films are deposited onto a substrate and undesired portions of the deposited thin film or thin films are removed to produce processed elements with reduced characteristic dimensions. Graphene layers are generated on selected processed elements or exposed portions of the substrate after removal of the processed elements. Multiple sets of graphene layers can be generated, each with a different physical characteristic, thereby producing a graphite-based device with multiple functionalities in the same device.

50 Claims, 23 Drawing Sheets

(56) References Cited

U.S. PATENT DOCUMENTS

Figure 1A:
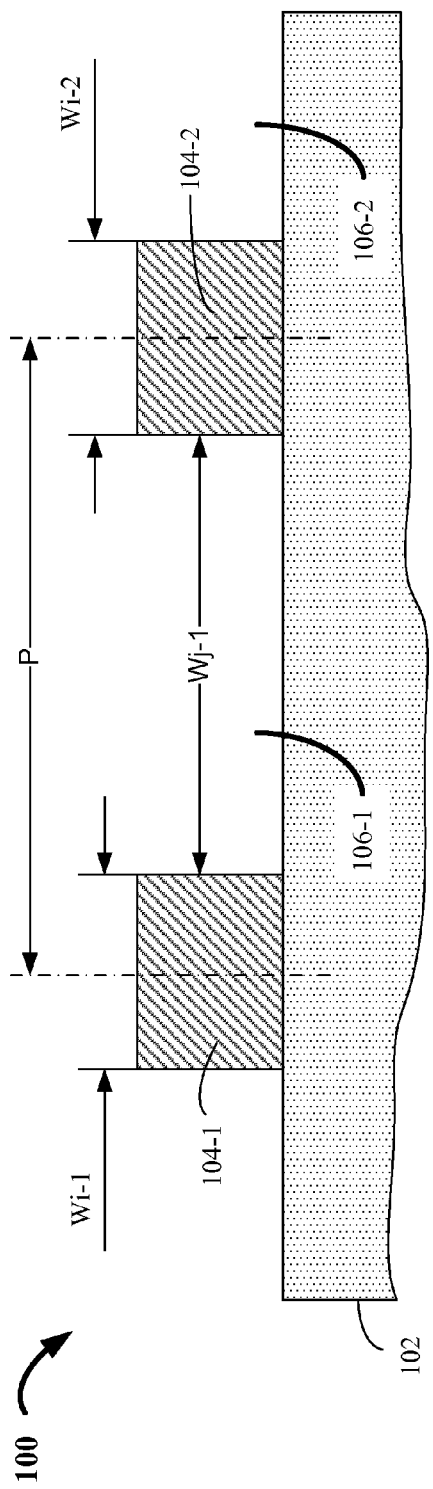

| | | |
|---|---|---|
| 4,681,773 A | 7/1987 | Bean |
| 5,049,405 A | 9/1991 | Cheung |
| 5,203,977 A | 4/1993 | Makowiecki et al. |
| 5,486,277 A | 1/1996 | Barbee, Jr. et al. |
| 5,742,471 A | 4/1998 | Barbee, Jr. et al. |
| 6,458,715 B2 | 10/2002 | Sano et al. |
| 2010/0055388 A1 | 3/2010 | Chen et al. |
| 2012/0168723 A1 | 7/2012 | Park |
| 2012/0193603 A1 | 8/2012 | Chu et al. |
| 2013/0026444 A1 | 1/2013 | Colombo et al. |

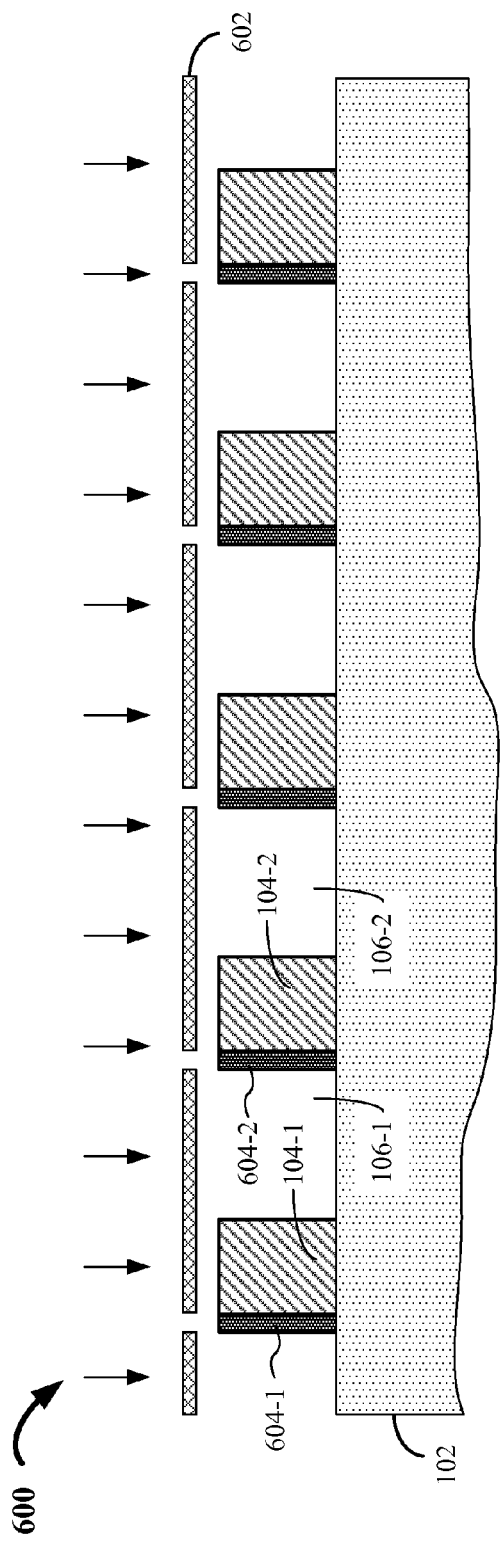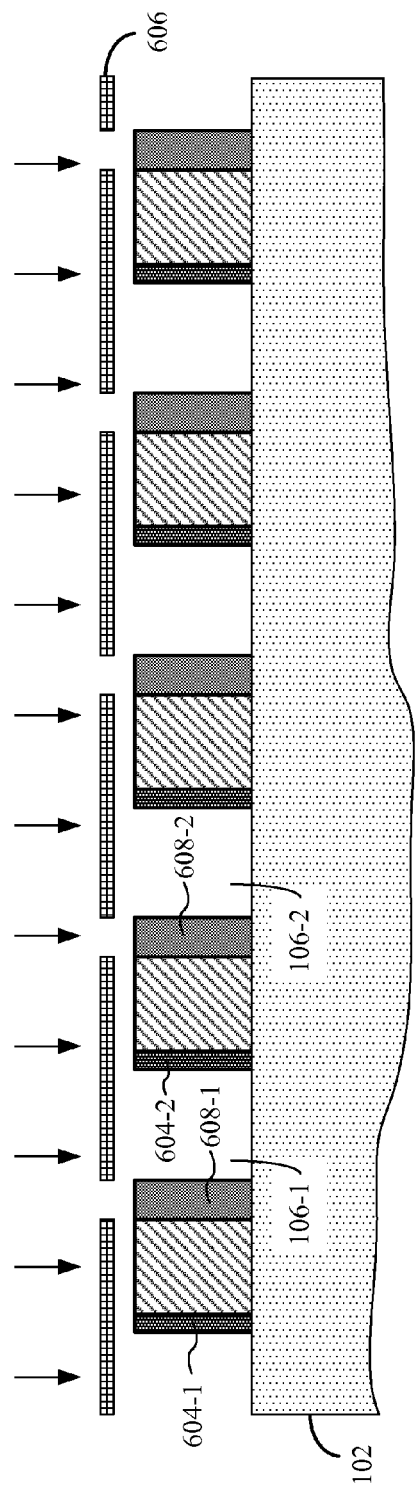
FIG. 6A
FIG. 6B

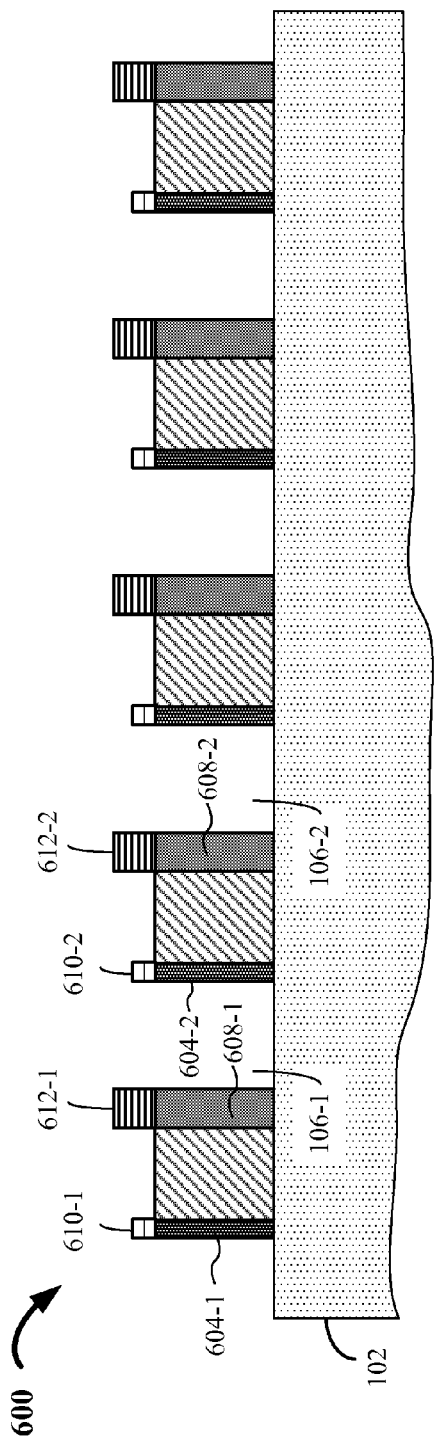
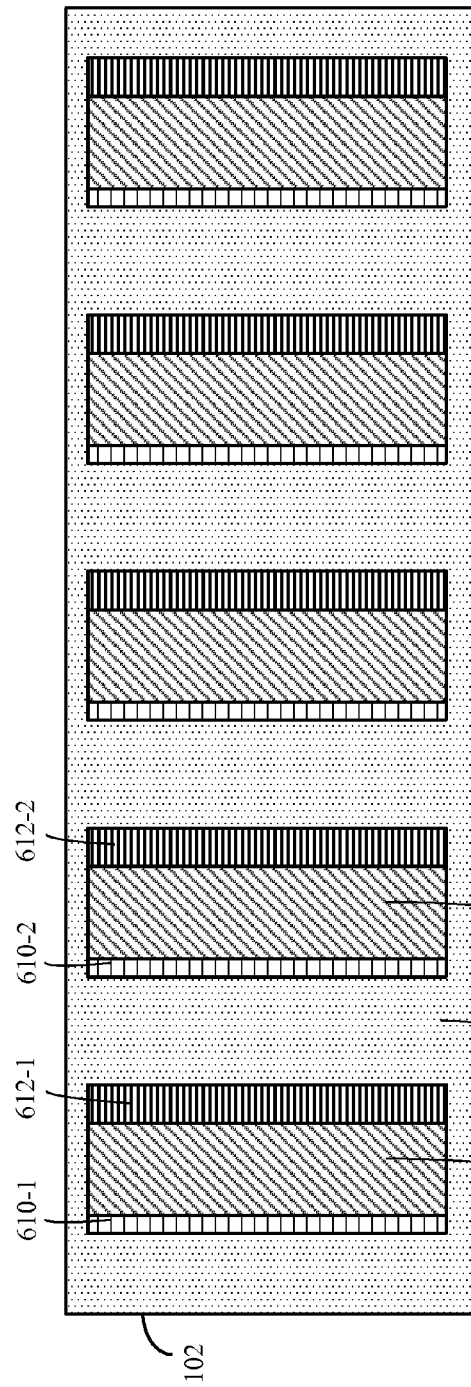

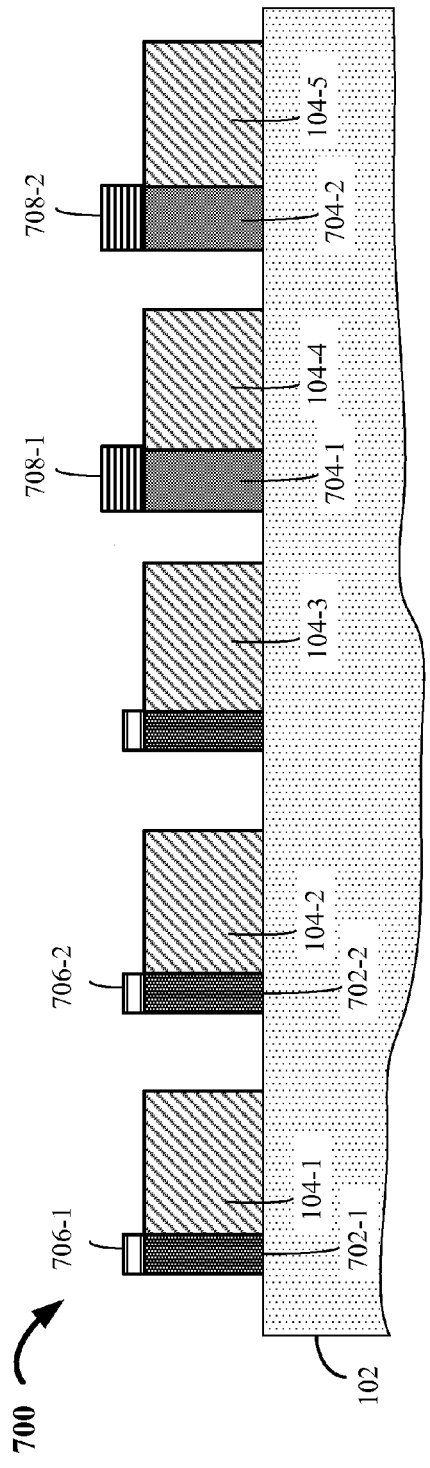
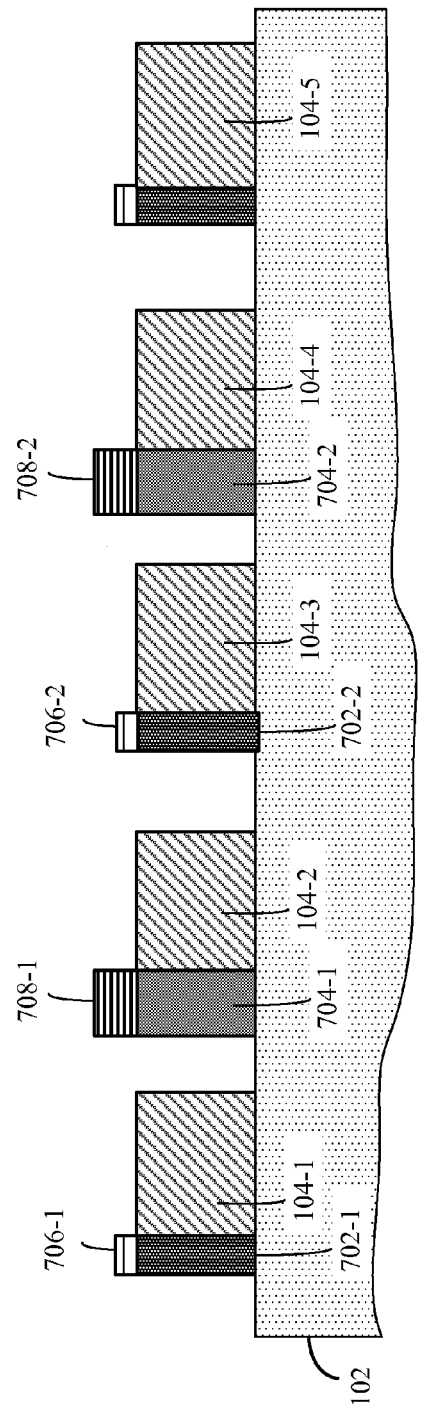
FIG. 7A
FIG. 7B

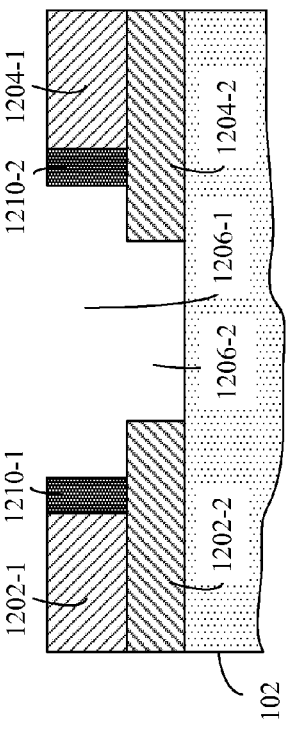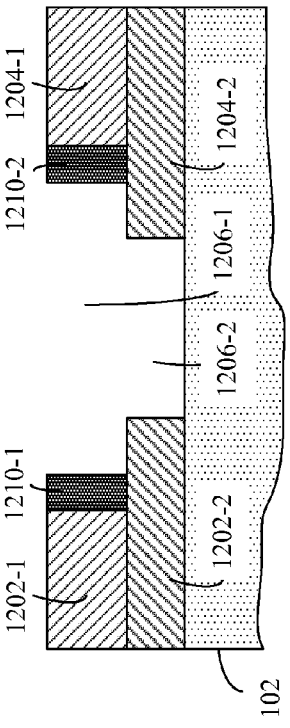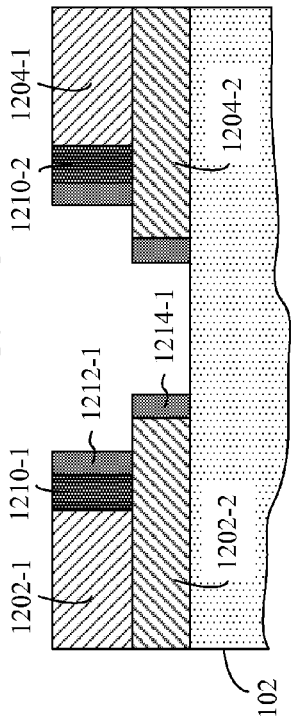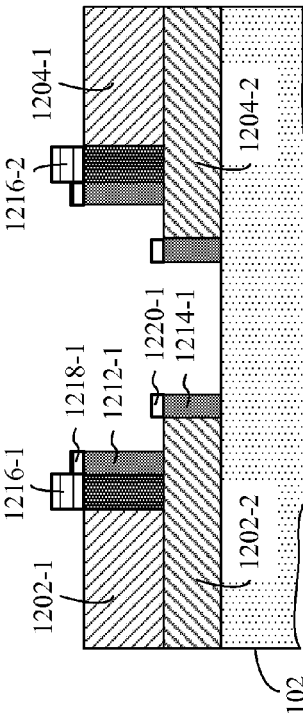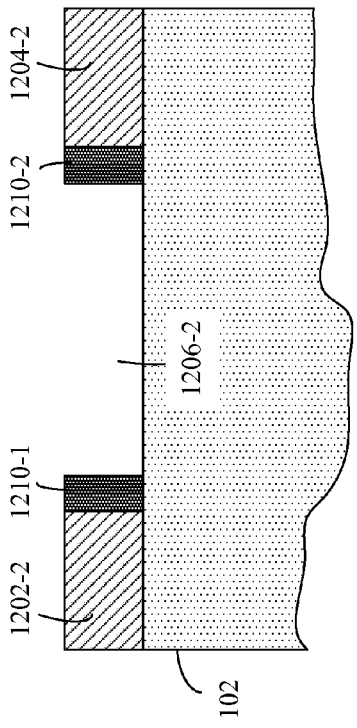

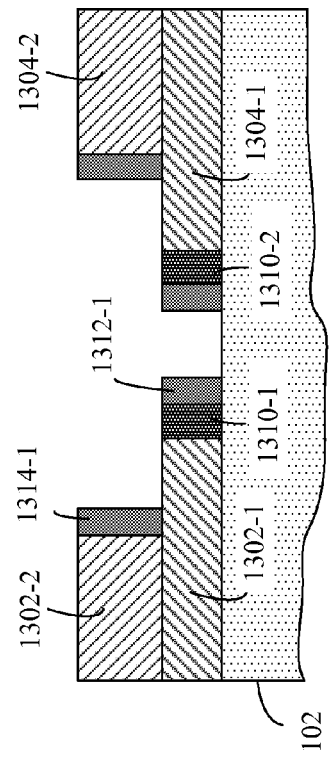
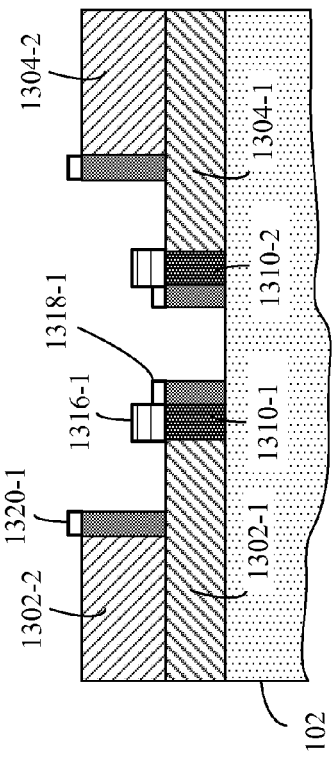
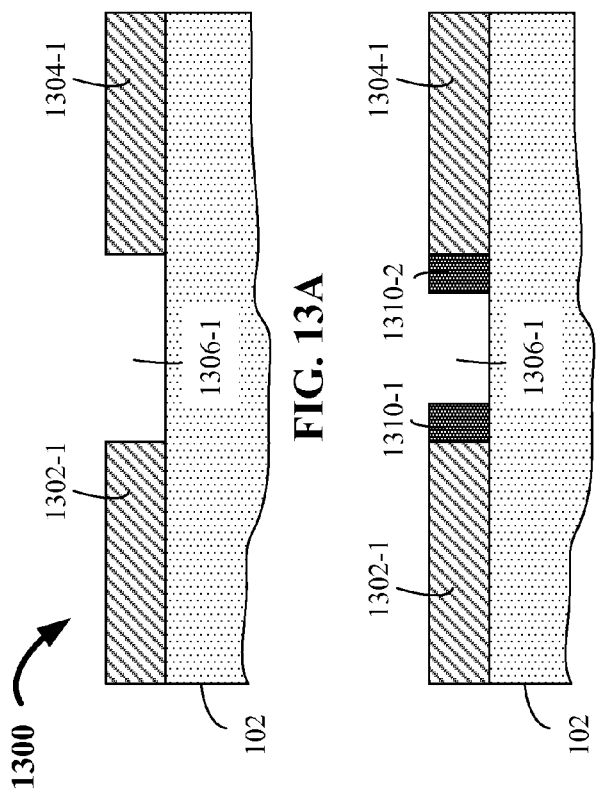
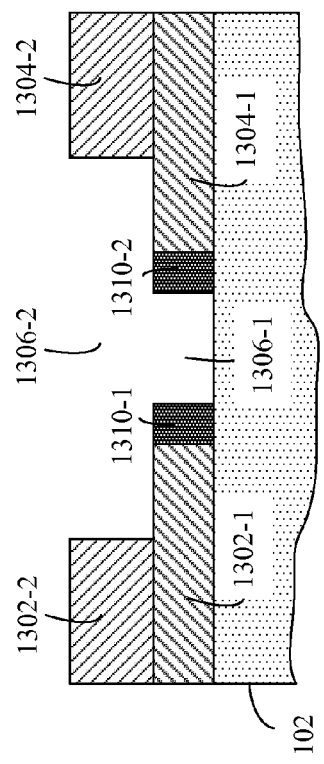

METHODS FOR FABRICATING REFINED GRAPHITE-BASED STRUCTURES AND DEVICES MADE THEREFROM

CROSS REFERENCE TO RELATED APPLICATION

This application claims priority to International Application No. PCT/US2014/18420, having an International Filing Date of Feb. 25, 2014, which claims priority to U.S. Patent Application No. 61/769,170, filed Feb. 25, 2013, entitled "METHOD FOR FABRICATING REFINED GRAPHITE-BASED STRUCTURES AND DEVICES MADE THEREFROM," each of which is hereby incorporated by reference herein in its entirety.

1. FIELD OF THE DISCLOSURE

The present disclosure is generally related to methods for forming graphite-based devices with a reduced characteristic dimension and the graphite-based devices made therefrom.

2. BACKGROUND

Graphite-based structures or devices, e.g. graphene quantum dots, graphene nanoribbons (GNRs), graphene nanonetworks, graphene plasmonics and graphene super-lattices, exhibit many exceptional chemical, mechanical, electronic and optical properties, and are very desirable for use in electronic devices, composite materials, and energy generation and storage. Such graphite-based structures in general comprise a graphene layer, typically nanometers thick and having a characteristic dimension also in nanometers range. For example, in order to obtain adequate band gaps for operation at room temperature, GNRs are required to have a width within a few nanometers due to the inverse relationship between the band gap and the width of the GNRs. Moreover, graphene layers with multiple levels, different pitch and duty cycle combinations are very desirable, which allows for the design of graphene devices with multiple functions, enhanced efficiency, and/or high packing density.

Current methods for fabricating such graphite-based structures are complicated, expensive, inefficient and highly inconsistent, and are mainly limited to laboratories. These methods can be broadly classified as epitaxial growth, chemical vapor deposition (CVD) growth, colloidal suspension, unconventional methods and exfoliation (See, e.g., Jayasen and Subbiah, 2011, Nanoscale Research Letter, 6:95; Parrish, "Graphene Growth Techniques for Use in Nanoelectronics).

Current fabrication methods generally involve patterning graphene, after graphene generation, into desired shapes and sizes. Patterning graphene, however, is very difficult because maintaining selectivity when etching carbon based materials is difficult in relation to other materials. It is in particular a notoriously difficult process in the nanoscale dimensions. As a result, current methods have several drawbacks. For example, the required etching for patterning graphene sheets into desired shapes often produce graphite-based structures with unpredictable geometries and erratic edge structures, yielding unsatisfactory functionalities of the graphene devices. Also, current methods generally use horizontal isolation, resulting in less usable surface area, lower packing density and accordingly lower efficiency of the graphene devices.

Given the above background, there is a need in the art for fabrication methods that can produce controllable, reliable and precise graphite-based structures without patterning the graphene layers, and in some cases, with multiple functionalities or high packing density.

3. SUMMARY

The present disclosure advantageously provides methods for fabricating graphite-based devices with a reduced characteristic dimension, particularly in the nanoscale range, and graphite-based devices formed without any requirement for patterning graphene. For instance, one aspect of the present disclosure provides a method for fabricating a graphite-based structure with positive polarity on a patterned substrate. The method includes depositing a first material on the patterned substrate thereby producing a first thin film overlaying the patterned substrate. The first thin film is characterized by a first thickness that does not exceed the minimum initial element width or the minimum initial trench width. The method also includes anisotropically etching the substrate to remove undesired portions of the first thin film thereby producing a plurality of processed elements. Each of the processed elements in the plurality of processed elements thus has a reduced characteristic dimension that corresponds to the first thickness. The method further includes generating a plurality of graphene layers on the processed elements.

In some embodiments, initial elements of the patterned substrate remain in the final devices and act as a structure support for the processed elements. In some embodiments, the initial elements of the patterned substrate are optionally removed. In some embodiments, deposition of a thin film and removal of undesired portions of the deposited thin film are repeated before the generation of graphene layers to produce the processed elements with desired physical parameters, e.g., desired characteristic dimensions or pitches. In some embodiments, the first thin film comprises a graphene generation material that is suitable for growing graphene or promotes graphene growth.

Another aspect of the present disclosure provides a method for fabricating a graphite-based structure or device with negative polarity on a patterned substrate. The method includes depositing a first material on the patterned substrate thereby producing a first thin film overlaying the patterned substrate. The first thin film is characterized by a first thickness that does not exceed the minimum initial element width or the minimum initial trench width. Undesired portions of the first thin film are removed to produce a plurality of processed elements. The method also includes backfilling the substrate and then removing the plurality of processed element thereby exposing portions of the substrate underneath the plurality of processed elements. Each of the exposed portions of the substrate is characterized by a reduced characteristic dimension that corresponds to the first thickness. The method further includes generating a plurality of graphene layers on exposed portions of the substrate.

Another aspect of the present disclosure provides a method for fabricating multi-functional graphite-based structures or devices on a patterned substrate. The method includes sequentially depositing a plurality of thin films on a patterned substrate. Each thin film in the plurality of thin films has a thickness that does not exceed the minimum initial element width, and the total thickness of the plurality of thin films does not exceed the minimum initial trench width. In some embodiments, each thin film in the plurality of thin films comprises a material that is different than an adjacent thin film in the plurality of thin films. The method also includes removing portions of the plurality of thin films overlaid on the tops of initial elements in the plurality of initial elements thereby producing a plurality of processed element sets. The method further includes generating one or more pluralities of graphene layers on one or more selected processed element sets, thereby producing graphite-based structures or devices with isolated graphene layers having one or more reduced widths. In some embodiments, the plurality of the initial elements comprises a foundation material, and the method further includes generating a plurality of graphene layers on the plurality of the initial elements, concurrently or sequentially with the graphene generation on the selected processed element sets.

In some embodiments, three thin films are deposited on the patterned substrate, with the first and third thin films comprising foundation materials. In such embodiments, the processed elements formed by the first and third thin films are selected to form graphene layers. The first and third thin films can comprise either the same or different foundation materials. In some embodiments, the first thin film comprises nickel (Ni) and the third thin film comprises copper (Cu), resulting in the generated graphene layers having different number of graphene sheets. In some embodiments, four thin films are deposited on the patterned substrate, with the second and fourth thin films comprising either the same or different foundation materials. In such embodiments, the graphene layers are generated on the processed elements formed by the second and fourth thin films. In some embodiments, a thin film comprising a foundation material is alternated with a thin film comprising a non-foundation material. In some embodiments, a processed element in one processed element set has a top surface at an elevation different than an elevation of a corresponding top surface of a processed element in another processed element set in the plurality of processed element sets. In some other embodiments, a processed element in one processed element set in the plurality of processed element sets has a top surface at a same elevation as a top surface of a processed element in another processed element set in the plurality of processed element sets.

Another aspect of the present disclosure provides methods for fabricating graphite-based structures or devices on a patterned substrate, in particular devices with interdigital patterns. The patterned substrate is protected with a first protective mask and a first material is deposited through the first protective mark to produce a first plurality of processed elements on the patterned substrate. The methods also include protecting the patterned substrate with a second protective mask and depositing a second material through the second protective mark to produce a second plurality of processed elements on the patterned substrate. The first protective mask comprises a plurality of isolated openings that is characterized by a first opening width and the second protective mask comprises a plurality of isolated openings that is characterized by a second opening width. Neither the first nor the second opening width exceeds the minimum initial element width or the minimum initial trench width. As a result, the processed elements and graphene layers generated in such processed elements have reduced characteristic dimensions that correspond to the first or second opening width.

In some embodiments, the first plurality of processed elements is formed in a first subset of initial elements and the second plurality of processed elements is formed in a second subset of initial elements with the second subset not overlapping the first subset of initial elements. In some embodiments, the first and second protective masks are patterned or aligned with the substrate such that the first and second pluralities of processed elements form an interdigital pattern. In some embodiments, a processed element in the first plurality of processed elements is formed on a side wall of an initial element, and a processed element in the second plurality of processed elements is formed on another side wall of the same initial element, thereby producing an interdigital pattern. In some embodiments, the first and the second materials comprise either the same or different foundation materials. In some embodiments, the first and second opening widths are the same or different.

Another aspect of the present disclosure provides a method for fabricating multi-level graphite-based structures or devices on a substrate. The method includes patterning the substrate to form a plurality of initial elements and a plurality of initial trenches. Each initial element comprises at least a first level and a second level. In some embodiments, the second level is wider than the first level, thus forming a protrusion. Accordingly, each initial trench comprises at least a first level and a second level that correspond to the first and second levels of adjacent initial elements in the plurality of initial elements. The method also includes backfilling the second level of each trench with a backfill material, followed by depositing a first material to produce a first thin film on the backfilled substrate and removing undesired portions of the first thin film to produce a first plurality of processed elements on the first levels of initial elements. The method also includes removing the backfilling material to expose the second level of each initial element, followed by depositing a second material to produce a second thin film on the substrate and removing undesired portions of the second thin film to produce second and third pluralities of processed elements, one on the first levels of initial elements and the other on the second levels of initial elements. Elements in the first, second, or third plurality of processed elements each have a reduced characteristic dimension that does not exceed the minimum protrusion width or the minimum initial trench width.

Another aspect of the present disclosure provides an alternative method for fabricating multi-level graphite-based structures or devices on a substrate. The method includes patterning the substrate to form a first level of each initial element in a plurality of initial elements and a first level of each initial trench in a plurality of initial trenches. The method then includes depositing a first material on the patterned substrate to produce producing a first thin film overlaying the patterned substrate and removing undesired portions of the first thin film to produce a first plurality of processed elements. The first thin film is deposited such that the first thickness of the first thin film does not exceed the minimum initial element width or half of the minimum initial trench width. Accordingly, the corresponding characteristic dimension of the first plurality of processed elements does not exceed the minimum initial element width or half of the minimum initial trench width. After the formation of the first plurality of processed elements, the method further includes patterning the substrate to form a second level of each initial element and a second level of each initial trench, and the second level of each initial element has a width different than the first level of the same initial element thereby forming a protrusion. Then the method further includes depositing a second material on the patterned substrate to produce a second thin film on the substrate, and removing undesired portions of the second thin film to produce second and third pluralities of processed elements, one on the first levels of initial elements and the other on the second levels of initial elements. Elements in the first, second, or third plurality of processed elements each have a reduced characteristic dimension that does not exceed the minimum protrusion width or the minimum initial trench width.

In some embodiments, patterning the substrate to form the second level of each initial element in the plurality of initial elements comprises depositing the second level on the first level of each initial element in the plurality of initial elements, thereby producing the second level on top of the first level. In some embodiments, patterning the substrate to form the second level of each initial element in the plurality of initial elements comprises etching corresponding initial trenches in the plurality of initial trenches, thereby producing the second level below the first level.

Various other aspects of the present disclosure provide a variety of exemplary graphite-based structures or devices formed by the disclosed exemplary methods. The exemplary graphite-based structures or devices in general include graphene layers with reduced characteristic dimensions ranging from 2 nm to 100 nm and comprising 1-500 graphene sheets. In some embodiments, the exemplary graphite-based structures or devices include two or more different sets of graphene layers; each set having different physical characteristics (e.g., having different characteristic dimension or comprising different number of graphene sheets). In some embodiments, the exemplary graphite-based structures or devices also include graphene layers generated on initial elements with a characteristic dimension ranging from 50 nm to 1000 nm. In some embodiments, the exemplary graphite-based structures or devices are configured to have multi-levels and different sets of graphene layers are generated at different levels. In some embodiments, the exemplary graphite-based structures or devices are configured to have multiple pitches.

In some embodiments, a graphite-based structure or device comprises a substrate and a plurality of elements formed on the substrate. Each element in the plurality of elements comprises a supporting part, one or more accompanying parts and a first plurality of graphene layers. The first accompanying part in the one or more accompanying parts is formed on a side of the supporting part, and has a first width that is less than a width of the corresponding supporting part. In some embodiments, the first width is between 2 nm and 100 nm. In some embodiments, each respective graphene layer in the first plurality of graphene layers is formed on a top surface of a first accompanying part of a corresponding element in the plurality of elements.

In some embodiments, a graphite-based structure or device comprises a substrate, a plurality of elements formed on the substrate, and a plurality of graphene sets. In some embodiments, each respective element in the plurality of elements comprises a corresponding supporting part and a corresponding plurality of accompanying parts. The plurality of corresponding accompanying parts is juxtaposed on the sides of the corresponding supporting part in the respective element, with each accompanying part in the corresponding plurality of accompanying parts having a first width that is less than the width of the corresponding supporting part. In some embodiments, the first width is between 2 nm and 100 nm. In some embodiments, each set in the plurality of graphene sets comprises a plurality of graphene layers. Each respective graphene layer in the plurality of graphene layers in a graphene set in the plurality of graphene sets is overlaid on one of (a) a top surface of the supporting part or (b) a top surface of an accompanying part in the plurality of accompanying parts of an element in the plurality of elements.

In some embodiments, a graphite-based structure or device comprises a substrate, a plurality of elements, a plurality of trenches on the substrate, and a plurality of graphene sets. In some embodiments, each respective element in the plurality of elements is separated from an adjacent element in the plurality of elements by a corresponding trench in the plurality of trenches. Each respective element in the plurality of elements comprises a plurality of supporting parts and a plurality of accompanying parts. For each respective element in the plurality of elements, (i) a second supporting part in the plurality of supporting parts is formed on top of a first supporting part in the plurality of supporting parts, (ii) the first supporting part in the plurality of supporting parts is wider than the second supporting part in the plurality of supporting parts thereby forming a protrusion, (iii) a first accompanying part in the plurality of accompanying parts is formed on a first side wall of the first supporting part in the plurality of supporting parts, (iv) a second accompanying part in the plurality of accompanying parts is formed on a first side wall of the second supporting part in the plurality of supporting parts, and (v) each accompanying part in the plurality of accompanying parts has a reduced width that is less than a width of each supporting part in the plurality of supporting parts. In some embodiments, the reduced width is between 2 nm and 100 nm. In some embodiments, each graphene set in the plurality of graphene sets comprises a plurality of graphene layers. Each respective graphene layer in the plurality of graphene layers in one graphene set in the plurality of graphene sets is overlaid on a top surface of an accompanying part in the plurality of accompanying parts of a corresponding element in the plurality of elements.

4. BRIEF DESCRIPTION OF THE DRAWINGS

The accompanying drawings, which are incorporated into and constitute a part of this specification, illustrate one or more embodiments of the present application and, together with the detailed description, serve to explain the principles and implementations of the application.

FIGS. 1A-1F provide a detailed graphical representation of an exemplary method for forming graphene devices having positive polarity on a substrate, in accordance with some embodiments of the present disclosure.

Figure 2:
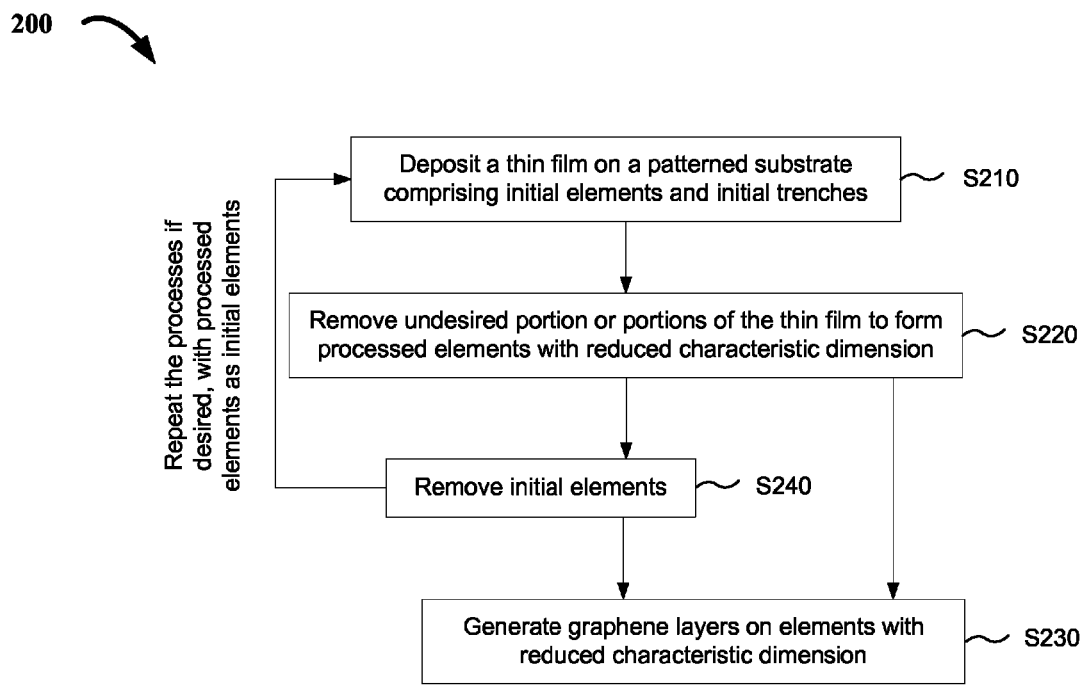

FIG. 2 provides a flow chart of an exemplary method for forming graphene devices having positive polarity on a substrate, in accordance with some embodiments of the present disclosure.

FIGS. 3A-3H provide graphical representations of exemplary graphene devices with variable configurations on a substrate, in accordance with some embodiments of the present disclosure.

FIGS. 4A-4F provide a detailed graphical representation of an exemplary method for forming graphene devices having negative polarity on a substrate, in accordance with some embodiments of the present disclosure.

Figure 5:
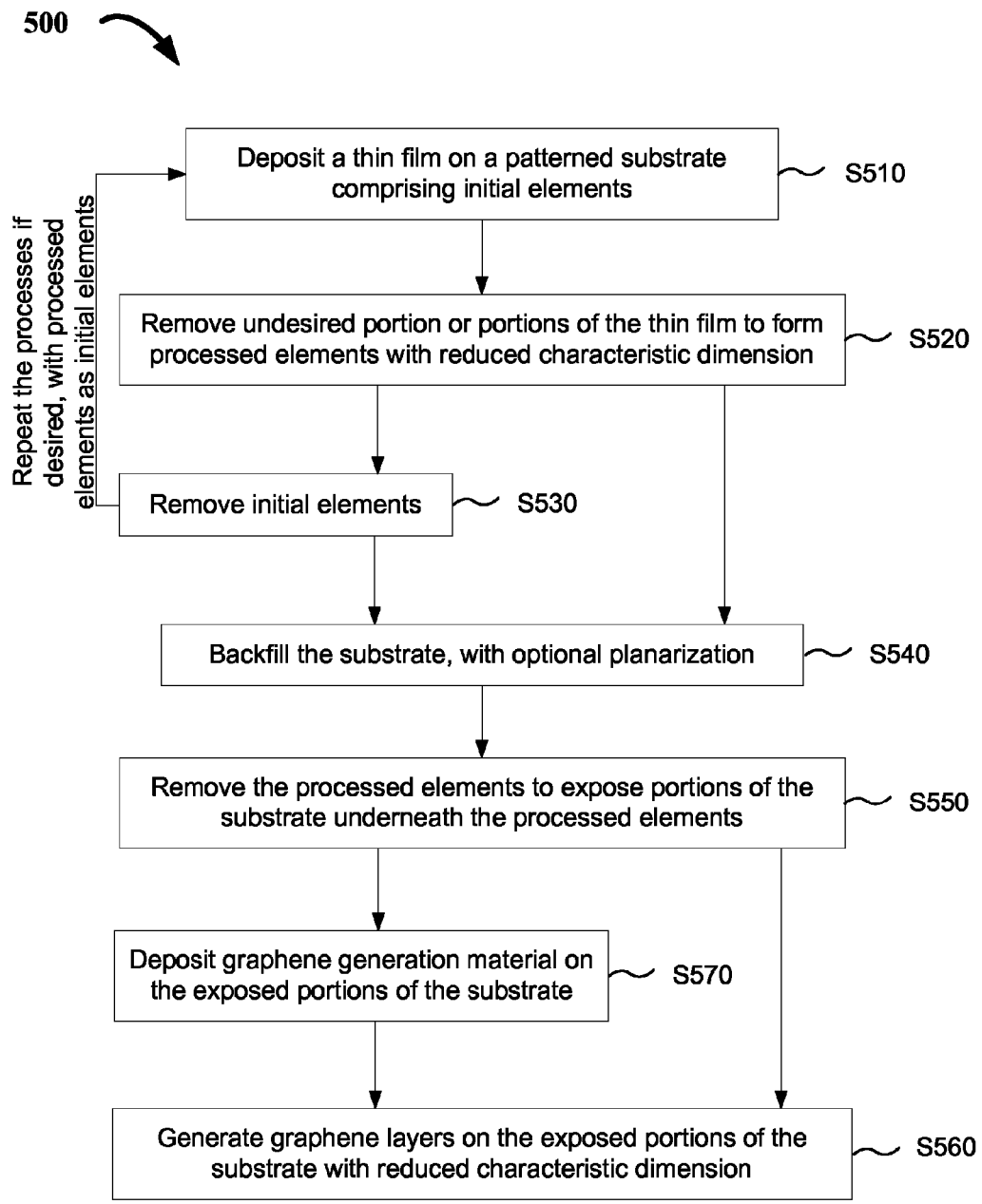

FIG. 5 provides a flow chart of an exemplary method for forming graphene devices having negative polarity on a substrate, in accordance with some embodiments of the present disclosure.

FIGS. 6A-6D provide a detailed graphical representation of an exemplary method for forming graphene devices with interdigital patterns on a substrate, in accordance with some embodiments of the present disclosure.

FIGS. 7A-7D provide graphical representations of exemplary graphene devices without or variable interdigital patterns, in accordance with some embodiments of the present disclosure.

Figure 8:
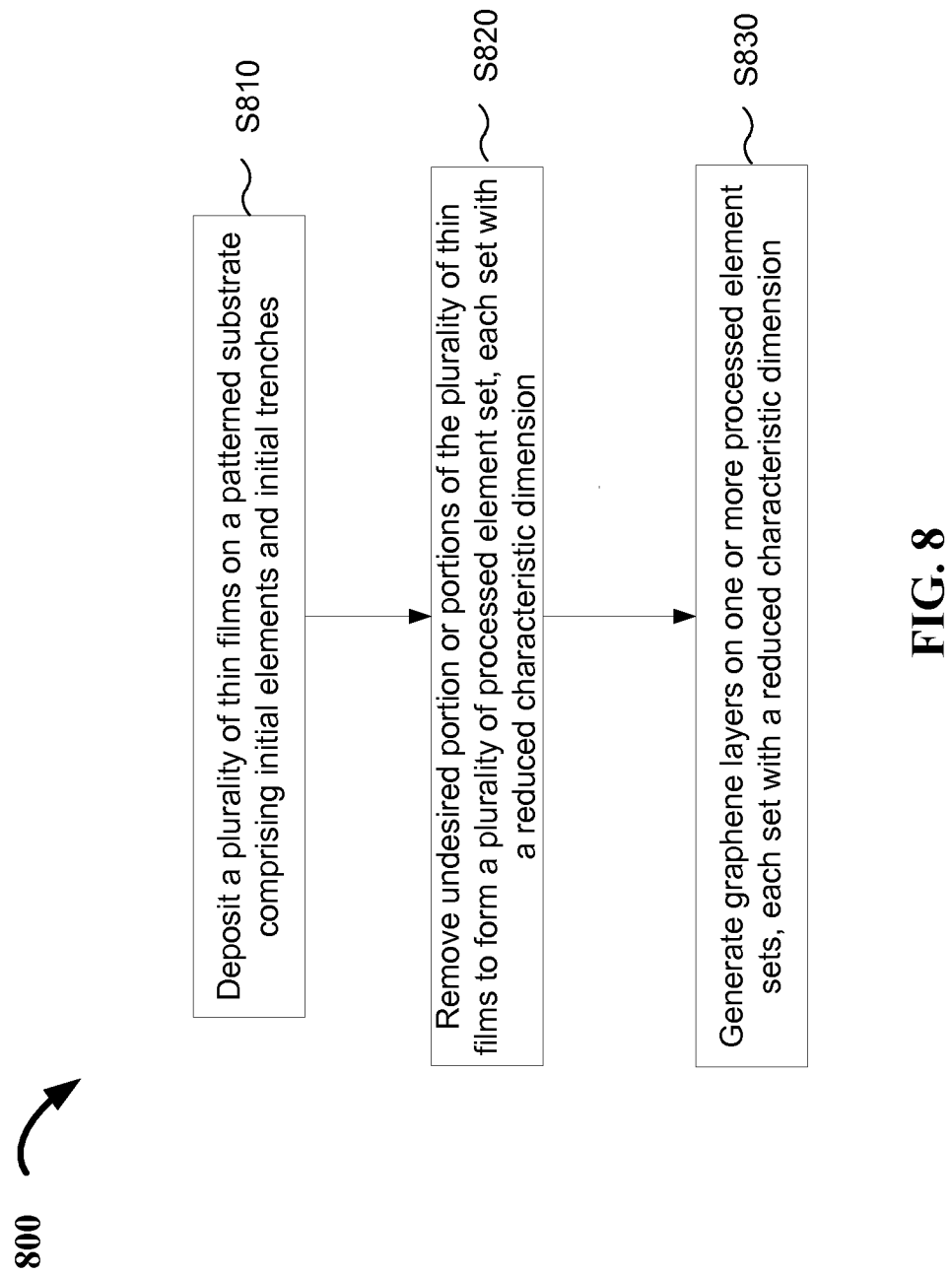

FIG. 8 provides a flow chart of another exemplary method for forming multi-functional graphene devices (e.g., multiple band gaps) on a substrate, in accordance with some embodiments of the present disclosure.

FIGS. 9A-9E provide a detailed graphical representation of an exemplary method for forming multi-functional graphene devices (e.g., multiple band gaps) on a substrate, in accordance with some embodiments of the present disclosure.

FIGS. 10A-11E depict detailed graphical representations of exemplary multi-functional bandgap graphene devices with variable configurations on a substrate, in accordance with some embodiments of the present disclosure.

FIGS. 11A-11F provide a detailed graphical representation of an exemplary method for forming multi-level graphene devices on a substrate, in accordance with some embodiments of the present disclosure.

FIGS. 12A-12E provide a detailed graphical representation of an alternative exemplary method for forming multi-level graphene devices on a substrate, in accordance with some embodiments of the present disclosure.

FIGS. 12A-12E provide a detailed graphical representation of an alternative exemplary method for forming multi-level graphene devices on a substrate, in accordance with some embodiments of the present disclosure.

FIG. 13A, FIG. 13B, FIG. 13C, FIG. 13D and FIG. 13E provide a detailed graphical representation of an alternative exemplary method for forming multi-level graphene devices on a substrate, in accordance with some embodiments of the present disclosure.

5. DETAILED DESCRIPTION

Embodiments of the present disclosure are described in the context of methods for fabricating graphene devices with reduced critical dimension and in the context of graphene structures or devices made therefrom. In some embodiments, various methods are provided for fabricating graphite-based structures while achieving desired size, specified geometries, and characterized electronic/photonic properties of the graphite-based structures. These methods include deposition of a thin film on a patterned substrate and anisotropic etching of the thin film to form processed elements with a reduced characteristic dimension. Graphene layers are then generated on selected processed elements, producing graphene structures or devices with the reduced characteristic dimension. Exemplary methods further include various additional, optional, or alternative processes such as doping or deposition processes if desired. Exemplary methods of the present application can be used to fabricate a wide variety of graphite-based structures or devices, including diodes, transistors, LEDs, solar cells, photodetectors, or other devices, or any combination thereof.

The present disclosure provides for the fabrication of any number of graphene layers in various configurations. In some instances, the graphene layers include multiple sets, with graphene layers in one given set having a different characteristic dimension or comprising a different number of graphene sheets than another set. In some instances, graphene layers from two different sets are generated in different levels. This advantageously provides for the ability to generate a wide array of devices, include devices in which graphene layers in one set perform one function while the graphene layers in another set perform another function). This diversity gives rise to the ability to design a wide variety of graphene devices as disclosed herein. Moreover, this is all accomplished without any requirement to post process graphene once the graphene has been formed.

The ability to provide multiple functions in the same device allows for more versatile and efficient devices (such as solar devices), integration of broadband devices (EUV through IR), increased efficiency by the design of elements to capture maximum peak wavelength energy, generation of 'neighboring effects of different' functionality of graphene (single and multiple layers), reduced resistivity by use of more sheets, band gap tune ability, work function definition, denser packing of device, shorter mean free paths, better capture of photons, cascade devices (sometimes called stair case devices) where photons or wavelengths are stripped from top to bottom, advantageous optical properties and electrical interactions (e.g., sensing and response to specific wavelength at each level).

Exemplary methods of the present disclosure have many other advantages, which are described throughout the present disclosure and in advantages section 6.

Those of ordinary skill in the art will realize that the following detailed description of the present application is illustrative only and is not intended to be in any way limiting. Other embodiments of the present application will readily suggest themselves to such skilled persons having benefit of this disclosure. Reference will now be made in detail to implementations of the present application as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

5.1 Definitions

As used herein, the term "substrate" refers to a solid substance generally in a form of a thin slice. The substrate can be planar or flexible, and can comprise dielectric, semiconducting or metallic materials, such as glass, Si, $SiO_2$, SiC, Cu, Ni, or other materials. It can include one layer or multiple layers. In some embodiments, a substrate comprises multiple layers, each with a different material. In some embodiments, a layer of another substance is applied onto the substrate. In some embodiments, the substrate has crystallographic symmetry. In some embodiments, the substrate is made of poly methyl methacrylate (PMMA), polyethylene terephthalate (PET), polyvinyl alcohol (PVA), or cellulose acetate (CA). When referring to multiple layers, the term "substrate" is equivalent to and interchangeable with the term "substrate stack."

As used herein, the term "sheet" refers to a substantially two-dimensional or one-atom thick substance. For example, a "graphene sheet" refers to one-atom-thick substance with carbon atoms arranged in a hexagonal lattice (i.e., a single sheet composed of $sp^2$-hybridized carbon). A "graphene sheet" also refers to a carbon-based sheet which comprises additional materials such as boron, oxides, dopants and/or edge atomic substitutes.

As used herein, the term "graphene layer" or "graphite layer" refers to one or more graphene sheets (e.g., one, a few, several, several tens, several hundreds or several thousands of graphene sheets). The collective thickness of a graphene layer can therefore range between a nanometer to several micrometers, or to several tens of micrometers depending upon the number of graphene sheets in the graphene layer. Final graphene layers produced by the processes disclosed in this application can have a thickness in nanometers, and preferably less than fifty nanometers. The terms "graphene layer" and "graphite layer" are interchangeable in the present disclosure.

As used herein, the term "graphite-based structure," "graphene structure," "graphene device," "graphene device topography" refers to any structure incorporating a graphene layer. Examples of such structures or devices include, but are not limited to, graphene nanoribbons, graphene nanonetworks, graphene poles/pillars, and graphene based nanohole superlattices. The terms "graphite-based structure," "graphene structure," "graphene device," "graphene device topography" are interchangeable in the present disclosure.

As used herein, the term "element" refers to a feature configured or generated on a substrate. In general, at least a portion of the element is on or above the substrate. The element can be of any shape, size, or orientation. Exemplary elements include ribs, ribbons, pillars, mesas, geometries that produce or promote plasmonic effects or other configurations. "Rib" or "ribbon" herein refers to a feature having a width that is less than the length. In some embodiments, "rib" and "ribbon" are interchangeable. "Pillar" herein refers to substantially circular, ovoid, regular or irregular features. "Mesa" herein refers to an island isolated from other features on the substrate or a plateau on the substrate. In general, a mesa has at least one dimension that is relatively large and thus can be used as a base for further processing of more complex structures. In some embodiments, a mesa has a topographical height feature, providing a capability for vertical isolation and/or size for desired functionality.

As used herein, the term "trench" refers to a space that separates two adjacent elements. It can be a recess formed in the substrate such as by etching, a space on or above the substrate formed for example by depositing two adjacent elements on or above the substrate, or a combination thereof. A trench can be of any shape or size as long as it separates two adjacent elements. In some embodiments, it is deep and/or has a width that is smaller than a characteristic length.

As used herein, the terms "left" or "right", "top" or "bottom", "horizontal" or "vertical", "upper" or "lower", etc., are used to describe features of the exemplary embodiments with reference to the positions of such features as displayed in the figures. They are used for convenience in explanation, and do not limit features in such positions.

As used herein, the term "width" refers to a characteristic dimension, generally along a substantially horizontal direction, of a feature. Examples of such characteristic dimensions include a width of a rib or a ribbon and a diameter of a circular pillar. For irregular or complex geometries, the width may be defined by the square root of the horizontal cross-sectional surface area of such geometries. It will be understood that a fair amount of process variation occurs in the width of the features described herein. Thus, a rib may have a width that deviates within a certain process variation. Thus, in such instances, the width of such features is an average width or characteristic width, taking into account this process variation.

As used herein, the term "height" refers to a characteristic dimension, generally along a substantially vertical direction, of a feature. Examples of such characteristic dimensions include the height of an element, which may be defined by the vertical distance between the top surface of the element and the bottom surface of the corresponding trench. It will be understood that a fair amount of process variation occurs in the height of the features described herein. Thus, an element may have a height that deviates within a certain process variation. Thus, in such instances, the height of such features is an average height or characteristic height, taking into account this process variation.

As used herein, the term "average" refers to the arithmetic mean value, or some other measure of central tendency, of a characteristic dimension. In some embodiments, the top surface of an element or the bottom surface of a trench has a slope or an arcuate property. For instance, in a case of a circular pillar-like element having an arcuate top surface, the average width is the circumferential mean diameter of the circular pillar-like element and the average height is the circumferential mean height of the circular pillar-like element.

As used herein, the terms "dielectric" and "dielectric materials" refers to a materials that are poor conductors of electricity. As such, in various embodiments in accordance with the present disclosure, a dielectric material is a material that has a dielectric constant of 50 or less, 40 or less, 30 or less, 20 or less, or 10 or less.

As used herein, the term "thin film" refers to a thin layer having a thickness that can range from a nanometer to several micrometers, or to several tens of micrometers. Final thin films produced by some processes disclosed in this application have a thickness in nanometers, and preferably less than fifty nanometers.

As used herein, the term "level" refers to one or more layers for a given feature. Thus, in some embodiments, an initial element which comprises a first level and a second level refers to an initial element which comprises at least two layers. In some embodiments, the term "level" refers to the elevation of a top surface of a feature. For example, in some embodiments, two processed elements at different levels refer to the top surface of one processed element is not on the same elevation as that of the other process element.

As used herein, the term "foundation material" refers to any material that is suitable for growing graphene or promotes graphene growth. In some embodiments, foundation materials are catalytic metals, e.g., Pt, Au, Fe, Rh, Ti, Ir, Ru, Ni, or Cu. In some other embodiments, foundation materials are non-metal materials, such as Si, SiC, non-stoichiometric SiC (e.g., boron doped or otherwise), and other carbon enhanced materials. As used herein, the phrase "carbon enhanced" materials refers to any materials into which carbon has been added.

As used herein, the term "backfilling" or "backfilled" refers to forming or depositing a material into given trenches, or into gaps between given elements. In some embodiments, all given trenches or all gaps in between given elements are fully filled, without leaving any void spaces. In some embodiments, one or more trenches in the given trenches or one or more gaps in between given elements are not fully filled, meaning a void space or void spaces exist in such un-fully filled trenches or gaps. In some embodiments, one or more trenches in the given trenches or one or more gaps in between given elements are not filled at all.

5.2 Methods and Devices

Figure 1B:
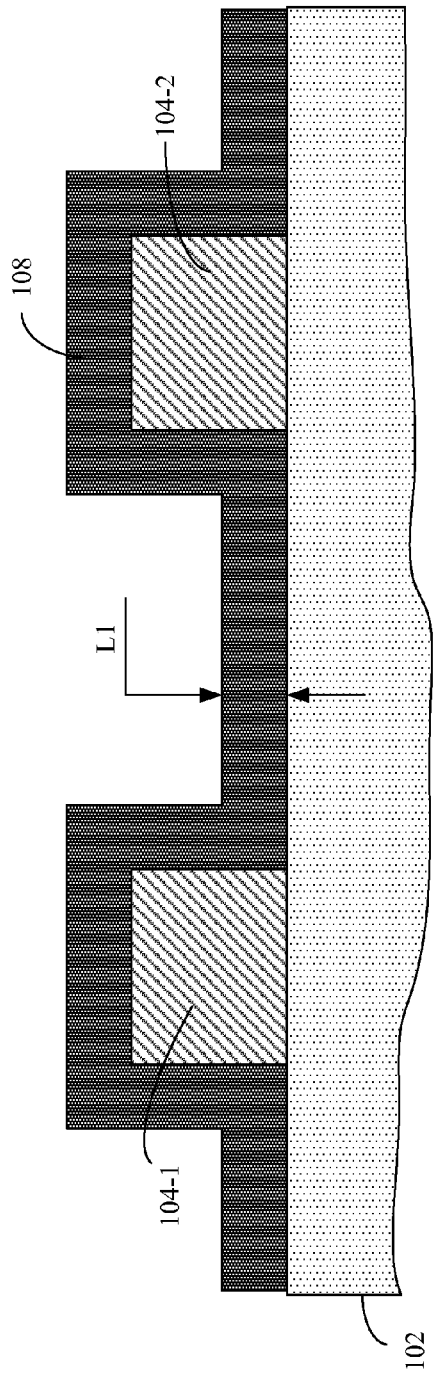

FIGS. 1A-1F provide a detailed graphical representation of an exemplary method 100 and FIG. 2 provides a flow chart of the method 100 for fabricating graphene devices with a reduced critical dimension on a substrate, in accordance with some embodiments of the present disclosure. As illustrated in FIG. 1B and step S210 in FIG. 2, the method 100 starts with depositing a first thin film 108 on a patterned substrate 102. In some embodiments, the patterned substrate 102 comprises a plurality of initial features, such as a plurality of initial elements (e.g., 104-1, 104-2) and a plurality of initial trenches (e.g., 106-1, 106-2). The deposition is conducted such that the thickness of the first thin film 108 L1 does not exceed Wi–min or Wj–min. Throughout the present disclosure, Wi–min denotes the minimum characteristic dimension, e.g., width, of the plurality of initial elements whether the plurality of initial elements comprises the same or different initial elements. Likewise, throughout the present disclosure, Wj–min denotes the minimum characteristic dimension, e.g., width, of the plurality of initial trenches whether the plurality of initial trenches comprises the same or different initial trenches. Each initial element (e.g., 104-1) is separated from an adjacent initial element (e.g., 104-2) by a corresponding trench (e.g., 106-1).

Figure 1C:
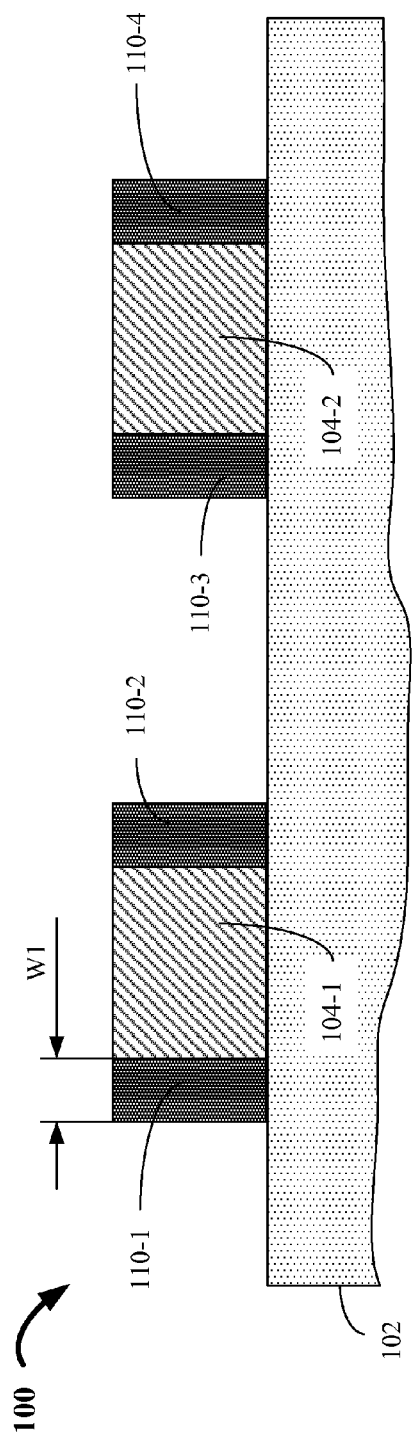

After the deposition, the method 100 proceeds to step S220, in which an undesired portion or portions of the first thin film are removed, as graphically illustrated in FIG. 1C. In the illustrated embodiment, the first thin film 108 deposited on the top of the initial elements 104-1, 104-2 and at the bottom of the initial trenches 106-1, 106-2 are removed, whereas the first thin film 108 deposited on side walls of the initial elements are retained. The retained portions of the first thin film define a plurality of processed elements, such as retained portions of the first thin film on first and second (e.g., left and right) side walls of the initial elements 104-1, 104-2 define processed elements 110-1, 110-2, 110-3 and 110-4, respectively. Such processed elements have a reduced characteristic dimension, e.g., width W1, that substantially equals to the thickness L1 of the first thin film 108 and thus does not exceed Wi–min or Wj–min.

Deposition of the first thin film and the removal of one or more undesired portions of the first thin film can be conducted using any suitable lithographic technique, or more generally, any suitable patterning technique. For example, atomic layer deposition (ALD) can be used to deposit a thin film overlaying a patterned substrate, and anisotropic etching can be used to remove undesired portions of the deposited thin film. Various other methods can be used, including but not limited to, wet etching, plasma etching, ion beam etching, reactive ion etching, sputtering and evaporation, atomic layer deposition, catalytic deposition. More details regarding deposition techniques are disclosed in more detail in Section 7 below and etching methods in Section 8 below. Details and purposes of these processes are also described, for example, in Van Zant, Microchip Fabrication, Fourth Edition, McGraw-Hill, New York, 2000, the entire content of which is hereby incorporated by reference herein.

Figure 1D:
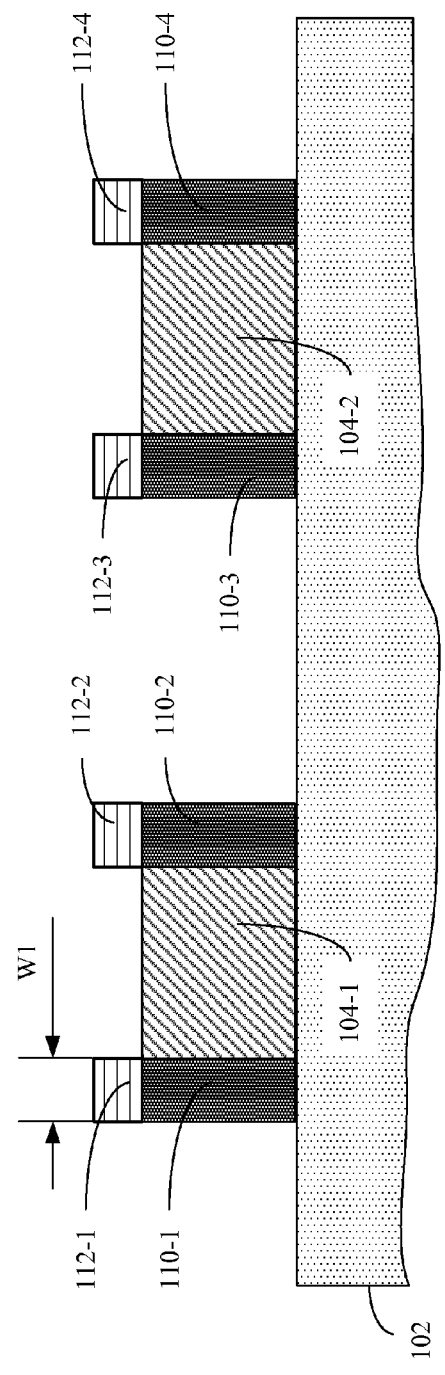
Figure 1E:
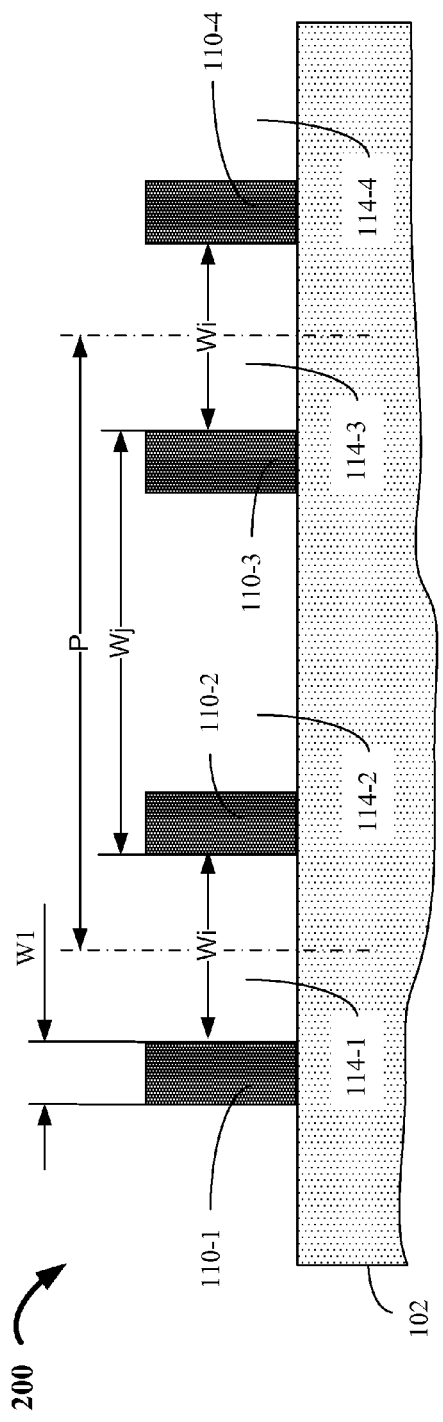

In some embodiments, once the processed elements 110 are acquired, the method 100 proceeds to step S230, in which graphene layers are generated on selected processed elements. The graphical illustration of step S230 is shown in FIG. 1D, where graphene layers 112-1, 112-2, 112-3, and 112-4 are generated, each on a top of a corresponding processed element 110-1, 110-2, 110-3 or 110-4, respectively. As shown, the characteristic dimension of the generated graphene layers corresponds to the width of the processed elements W1, and thus does not exceed Wi–min or Wj–min. In some embodiments, generation of such graphene layers is conducted concurrently.

The method 100, and all of other methods disclosed in the present application, can be used to fabricate graphene devices or structures with a reduced characteristic dimension in a range from a nanometer to several micrometers or to several tens of micrometers. In particular, the disclosed methods of the present application are advantageous in the fabrication of graphene devices or structures having a reduced characteristic dimension in nanometers, e.g., graphene quantum dots, graphene nanoribbons (GNRs), graphene nanonetworks, graphene plasmonics and graphene super-lattices.

Graphene devices or structures with such reduced characteristic dimensions are suitable for use in electronic devices, composite materials, and energy generation and storage because they exhibit suitable chemical, mechanical, electronic and optical properties. For example, in order to obtain adequate band gaps for operation at room temperature, GNRs typicaly have a width within a few nanometers due to the inverse relationship between the band gap and the width of the GNRs.

In some embodiments, the deposition of the first thin film 108 is conformal, for example, using atomic layer deposition (ALD). In some embodiments, ALD is repeated to achieve desired thickness.

Generally speaking, graphene generation can be formed by any of three general mechanisms (i) catalytic or precipitation from a metal, (ii) reverse epitaxial sublimation of silicon leaving carbon, and (iii) nucleation growth, typically on a non-metallic material. As an example, in some embodiments, the substrate comprises silicon carbide and graphene is formed by epitaxial growth on the silicon carbide. That is, the graphene is actually grown by heating the silicon and leaving graphene. See Sutter, 2009, Nature Materials 8, 171-172, which is hereby incorporated by reference in its entirety. In such embodiments, the graphene is grown on either the silicon-face or the carbon-face of the silicon-carbon substrate after an optional hydrogen etching. See Van Mil et al., Materials Science Forum 615, Trans Tech Publ 2009, pp. 211-214, which is hereby incorporated by reference in its entirety. In some embodiments, the graphene is grown epitaxially using a silicon carbide substrate and using near-atmospheric pressure with argon gas suppression. See Sutter, 2009, Nature Materials 8, 171-172, which is hereby incorporated by reference in its entirety.

In some embodiments, the first thin film 108 comprises a foundation material that is suitable for growing graphene or promotes graphene growth. In some embodiments, the first thin film 108 comprises a transition metal. Examples of transition metals include, but are not limited to iridium (Ir), ruthenium (Ru), platinum (Pt), cobalt (Co), nickel (Ni), and palladium (Pd). In some embodiments the transition metal is crystalline. For instance, in some embodiments the first thin film 108 comprises Ir(111), Ru(0001), Pt(111), Co(0001), Ni(111), or Pd(111). See for example, Coraux et al., 2008, Nano Lett 8, 565-570, which is hereby incorporated by reference in its entirety. In some embodiments where the first thin film 108 comprises a transition metal, graphene is grown by heating the transition metal in the presence of carbon. Thus, in such embodiments, the carbon is considered the foundation material. In some embodiments, the transition metal substrate is overlayed on another substrate material, such as silicon, quartz, sapphire, or silica. In some embodiments, the transition metal substrate is overlayed on porous material, such as porous silicon, which is in turn overlayed on another layer, such as crystalline silicon. In such embodiments, the porous material acts as a barrier to prevent diffusion of the transition metal into the crystalline substrate.

In some embodiments, a foundation material is not used but rather molecular beam epitaxy is used to grow graphene directly onto the processed elements. For instance, in some embodiments, the first thin film 108 comprises 6H—SiC, Si(111), or a transition metal (e.g., nickel) and a solid carbon block or glassy carbon filament is used to perform molecular beam epitaxy onto the processed elements. See Moreau et al., 2010, Physica Status Solidi (a) 207, 300-303; and Hacley et al., 2009, Applied Physics Letters 94, 133114, Garcia, 2010, Solid State Communications 150, 809-811, each of which is hereby incorporated by reference herein.

In some embodiments, chemical vapor deposition (CVD) is used to form graphene on the processed elements. In some embodiments one or more gases, at least one of which is organic, are used to provide the carbon to the CVD process. Examples of gases, or combinations thereof, that can be used for such purposes include, but are not limited to, (i) a mixture of hydrogen and methane gas, (ii) diluted hydrocarbon gas, (iii) a combination of methane, hydrogen and argon, (iv) methane in an argon vault, (v) ethanol-saturated hydrogen gas, and (vi) ethene gas. Examples of materials that can be used to form graphene using CVD include, but are not limited to copper, nickel, cobalt, stainless steel, cobalt/magnesium oxide, and iridium. In some embodiments, an organic liquid, such as hexane, is used to provide the carbon to the CVD process. In some embodiments, plasma enhanced CVD is used to form graphene on the processed elements.

Referring still to FIGS. 1A-1F and FIG. 2, in some embodiments, prior to graphene generation, the method 100 comprises some additional or optional steps to form graphene devices with desired functionalities. For example, in some embodiments, the method 100 comprises additional steps to form graphene devices on a substrate with increased packing density or multiple pitches. Different pitch and duty cycle combinations in graphene devices are utilized to improve efficiency or provide multiple functionalities. In general, the smaller the pitch, the higher packing density.

As shown in FIG. 2, in some embodiments, the method 100 proceeds to step 240 prior to generating graphene layers in step S230. In step S240, the initial elements are removed, for example, by anisotropically or selectively etching the substrate. The void spaces left by the removal of the initial elements and any unfilled spaces of the initial trenches collectively define a plurality of processed trenches, such as those indicated by reference numerals 114-1, 114-2 and 114-3 in FIG. 1E. As shown, each respective processed element is separated by a corresponding processed trench, e.g., processed trench 114-1 separating processed element 110-1 from adjacent processed element 110-2 and processed trench 114-2 separating processed element 110-2 from adjacent processed element 110-3.

In some embodiments, the method 100 then repeats the first two steps on the substrate comprising the processed elements 110 and processed trenches 114, e.g., depositing a second thin film in step S210 and removing undesired portions of the second thin film in step S220. In repeating these two steps, the processed elements 110 and processed trenches 114 act as the initial elements 104 and the initial trenches 106 as discussed above. By repeating the first two steps, the method 100 creates a new set of processed elements 116 with a reduced characteristic dimension, i.e., width W2, that does not exceed the characteristic dimension of the processed elements 110, i.e., width W1. This process is also graphically illustrated in FIG. 1F. If desired, the processed elements 110 can be removed and the first two steps can be repeated one or more times. In the case that graphene generation on the processed elements 110 is not desired or the processed elements 110 will be eventually removed, the thin film 108 does not necessarily need to comprise a foundation material.

When a desired critical dimension or other configuration parameters are required, the method 100 continues by generating graphene layers on the newly created processed elements such as processed elements 116, producing graphene layers with the reduced characteristic dimension W2. In some embodiments, the processed elements 116 are made of a foundation material. The process for generating graphene layers on the processed elements 116 is the same as or similar to generating graphene layers on the processes elements 110 as disclosed above.

Figure 1F:
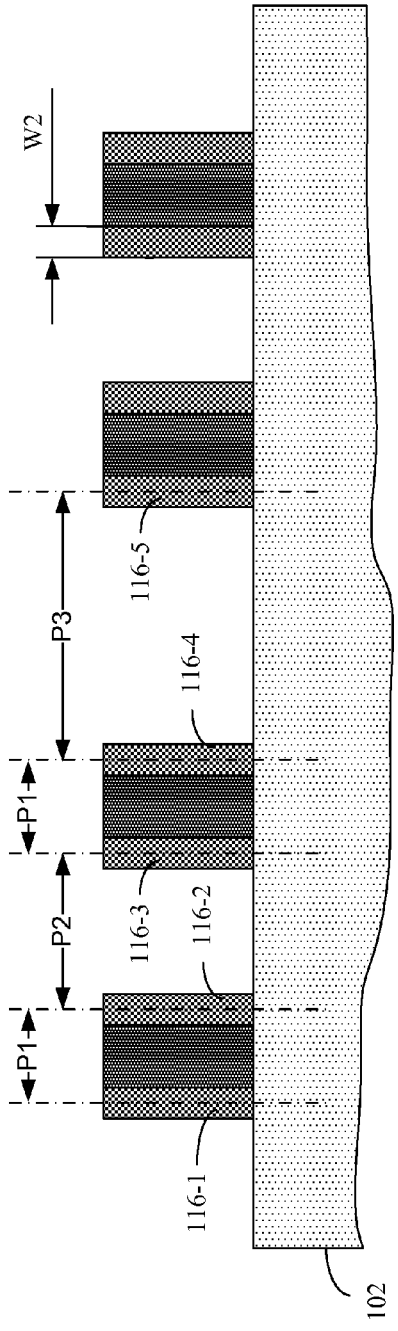

In addition to forming graphene devices with a reduced characteristic dimension, repetition of steps S210, S220 can be used for the multiplication of processed elements or reduction and variation of the pitches, producing graphene devices with high packing density, improved efficiency or multiple functionalities. As an example, FIG. 1F illustrates an embodiment created by repeating only once the first two steps on a substrate with initial elements 104-1, 104-2. As shown in FIG. 1A, the initial element 104-1 has a characteristic dimension, e.g., width Wi–1 and the initial element 104-2 has a characteristic dimension, e.g., width Wi–2. The initial elements 104-1, 104-2 are separated from each other by the initial trench 106-1, which has a characteristic dimension, e.g., width Wj–1. P denotes the pitch and represents a distance between two initial features, e.g., the centerlines of these two initial elements 104-1, 104-2. In some embodiments, which comprise nonsymmetrical or irregular features, P represents a distance between geometric centers of such features, or an average distance. P can be written as:

$$P = \tfrac{1}{2}(W_{i-1} + W_{i-2}) + W_{j-1} \geq W_{i-min} + W_{j-min} \quad (1)$$

As shown in FIG. 1F, compared to the number of initial elements 104 and pitch P, the number of the processed elements 116 are multiplied and pitches, e.g., P1, P2, P3, are reduced. These pitches can be correlated to the Wi–1, Wj and P as follows:

$$P1 = W_1 + W_2 \quad (2)$$

$$P2 = W_{i-1} - W_2 \quad (3)$$

$$P3 = W_{j-1} - 2 \times W_1 - W_2 \quad (4)$$

Because both W1 and W2 do not exceed Wi–min or Wj–min, all three processed pitches, i.e., P1, P2, P3, are smaller than the initial pitch P. Further, by controlling the deposited thin film thicknesses, i.e., W1, W2, processed pitches P1, P2 and P3 can be tuned to specific values to achieve desired multiple functionality.

For example, with the same initial patterned substrate having Wi–1=Wi–2=90 nm, Wj–1=210 nm, and P=300 nm, the first and second thin films deposited at W1=50 nm and W2=20 produce P1=P2=70 nm and P3=90 nm, whereas the first and second thin films deposited at W1=40 nm and W2=10 produce P1=50 nm, P2=80 nm, and P3=120 nm.

Figure 3A:
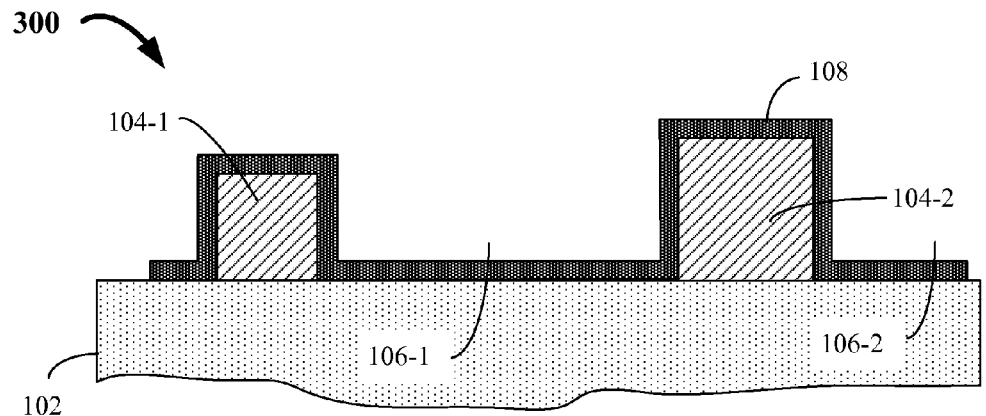
Figure 3B:
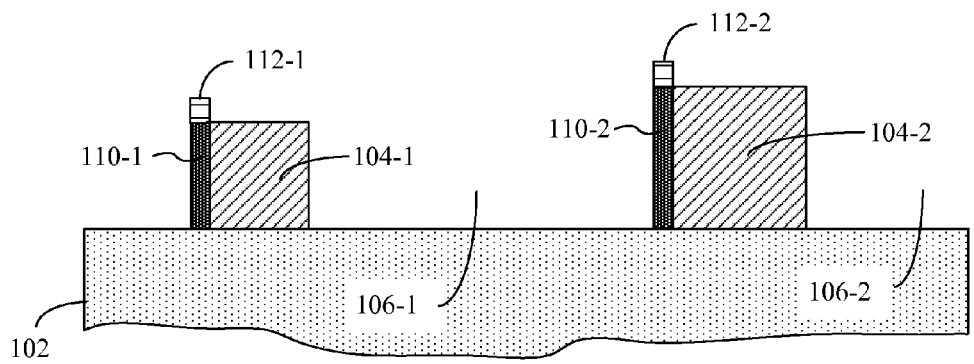
Figure 3C:
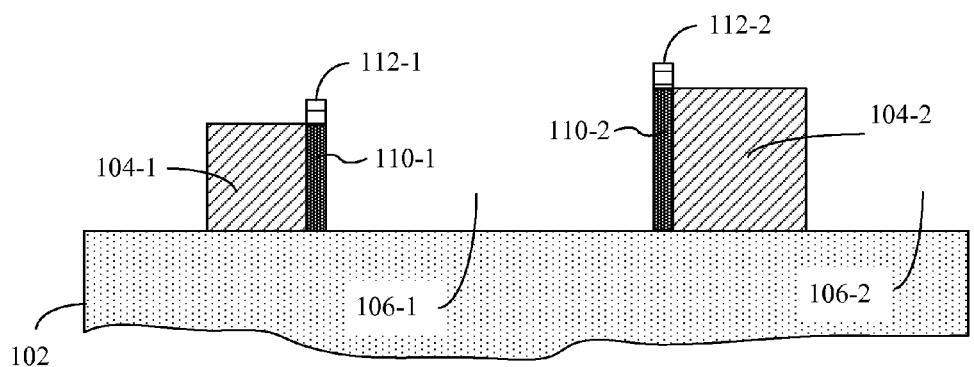
Figure 3D:
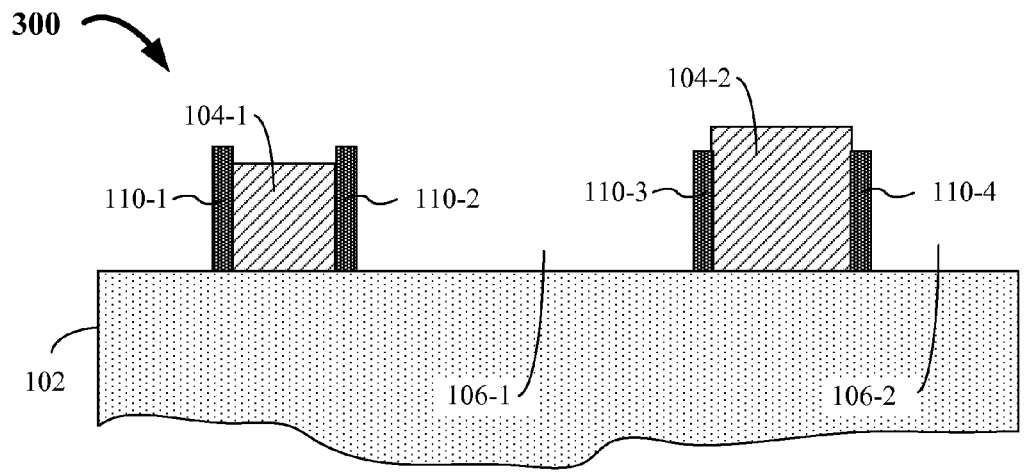
Figure 3E:
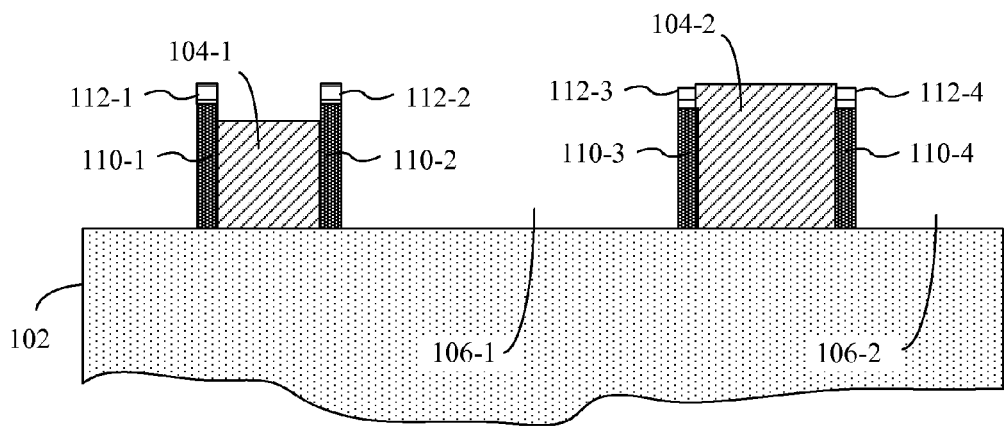
Figure 3F:
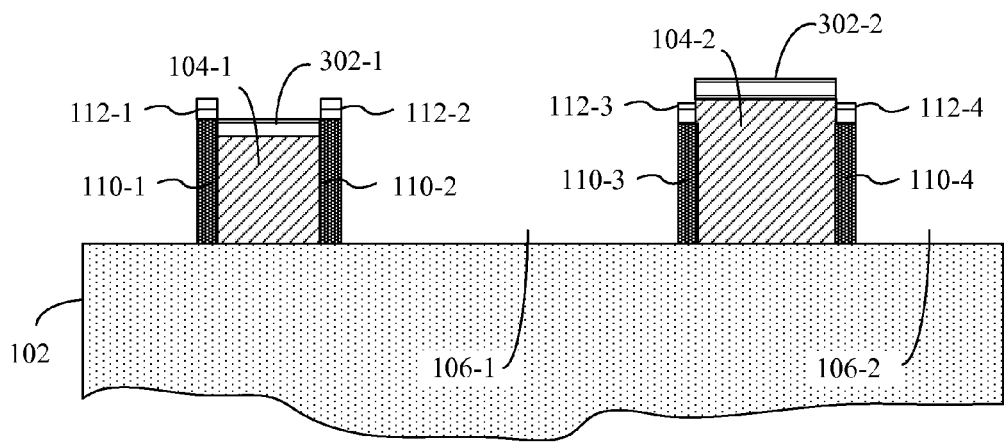
Figure 3G:
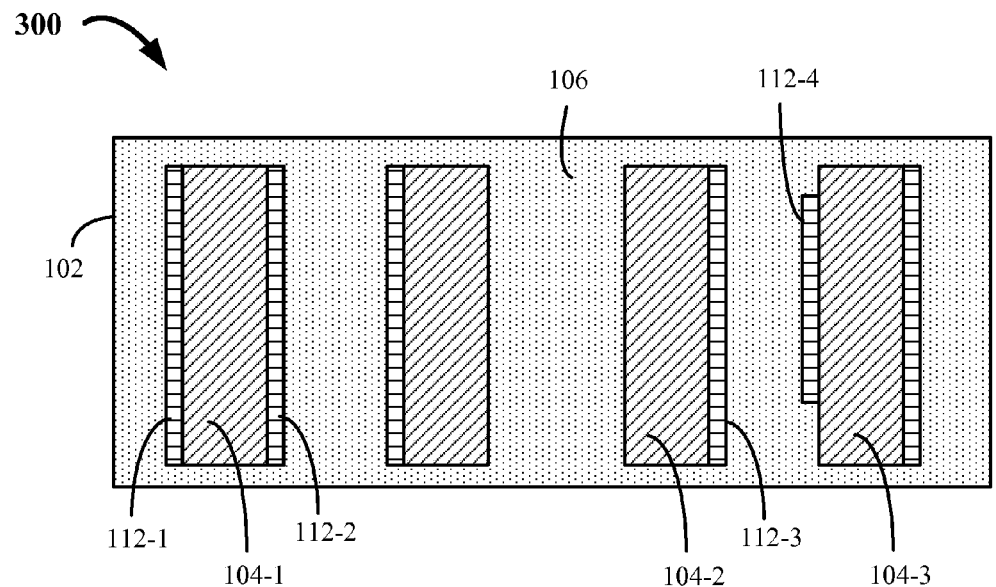
Figure 3H:
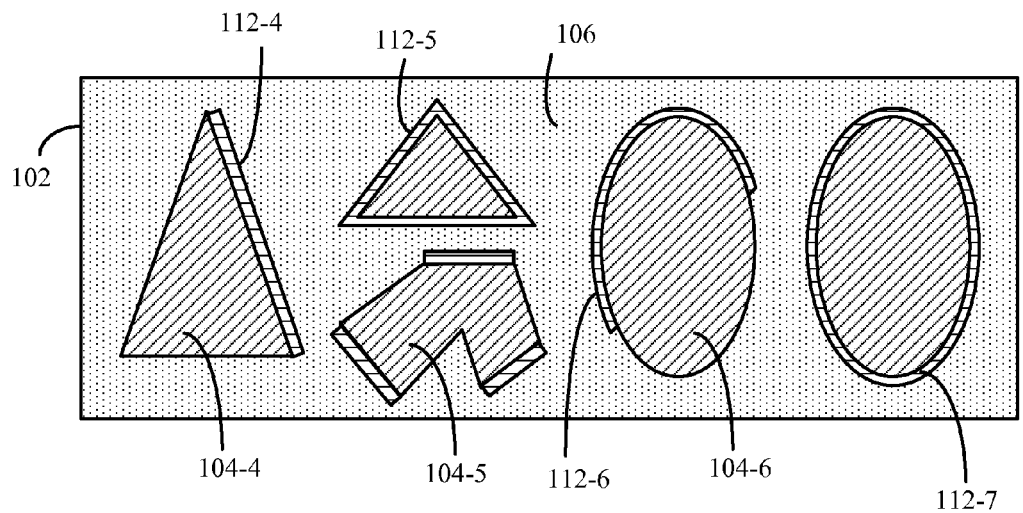

For illustration purposes, FIGS. 1A-1F show two similar initial elements and processes elements formed on both side walls of the initial elements. One of skill in the art will appreciate that physical parameters or processes can be readily varied to produce numerous variations, examples of which are illustrated in FIGS. 3A-3H. For example, the number of initial elements can vary. In some embodiments, a substrate can have a plurality of initial elements, each separated from adjacent initial element by a trench as shown in FIG. 3G. In some embodiments, a substrate can have only one initial element. In some embodiments, the initial elements are similar or identical as shown in FIG. 3G; in some other embodiments, the initial elements can have different physical dimensions or different shapes, examples of which are shown in FIGS. 3A and 3H.

Processed elements can be formed on any selected side wall of an initial element and the selected side wall can be straight, slanted, or curved (e.g., have an arcuate edge). In some embodiments, processed elements are formed on one side wall of an initial element indicated by reference numerals 112-3 in FIG. 3G and 112-4 in FIG. 3H, formed on two side walls of an initial element as indicated by reference numerals 112-1 and 112-2 in FIG. 3G, or all side walls as indicated by reference numerals 112-5 and 112-7 in FIG. 3H. In some embodiments, processed elements are formed on a portion of a side as indicated by reference numerals 112-4 in FIG. 3G and 112-6 in FIG. 3H. In addition, in some embodiments, processed elements can be configured to have a different height than the initial elements, either taller or shorter as shown in FIGS. 3D-3F. In some embodiments, the initial element is a pillar or some other structure having only one side wall (e.g. a side wall that is closed in on itself, such as a circle) and the initial element is formed on the selected side wall.

In some embodiments, the initial elements are removed from the final graphene devices. In many embodiments, the initial elements remain in the final graphene devices, providing structural support for the processed elements with a reduced characteristic dimension. This is advantageous particularly when the final processed elements are tall and narrow, having a reduced characteristic dimension in nanometers.

In some embodiments, a set of graphene layers are also generated on the initial elements, such as graphene layers 302-1, 302-2 illustrated in FIG. 3F. Generation of such graphene layers can be conducted concurrently or sequentially with the generation of graphene layers on the processed elements. Such graphene layers have characteristic dimensions substantially equal to the characteristic dimension of the initial elements and different than the characteristic dimension of the graphene layers generated on the processed elements. In addition, depending on the materials used for the initial elements and the processed elements and depending on the processes employed to generate graphene layers, a graphene layer generated on an initial element can comprise the same number of graphene sheets as or different number of graphene sheets than a graphene layer generated on a processed element. This advantageously provides for the ability to generate graphene devices in which one set of graphene layers performs one function and another set of graphene layers performs another function.

In some implementations, the substrate used in the present disclosure is glass, silicon, SiC, SiO$_2$, or SiC/Si. In some embodiments, the substrate is a solid substance in a form of a thin slice. In some embodiments, the substrate is planar. In some embodiments the substrate is flexible. In some embodiments the substrate is rigid. In various embodiments, the substrate is made of a dielectric material, a semiconducting material, a metallic material, or a combination of such materials. Exemplary dielectric materials include, but are not limited to, glass, silicon dioxide, neoceram, and sapphire. Exemplary semiconducting materials include silicon (Si), silicon carbide (SiC), germanium (Ge), boron nitride (BN), and molybdenum sulfide (MoS). Exemplary metallic materials comprise copper (Cu), nickel (Ni), platinum (Pt), gold (Au), cobalt (Co), ruthenium (Ru), palladium (Pd), titanium (Ti), silver (Ag), aluminum (Al), cadmium (Cd), iridium (Ir), combinations thereof, and alloys thereof. In some embodiments the substrate comprises Si, SiO$_2$, SiC, Cu, Ni, or other materials. In some embodiments, the substrate substantially comprises neoceram, borosilicate glass, germanium arsenide, a IV-V semiconductor material, a substantially metallic material, a high temperature glass, or a combination thereof. In some embodiments the substrate comprises a metal foil or a metal slug.

In some embodiments, the substrate substantially comprises SiO$_2$ glass, soda lime glass, lead glass, doped SiO$_2$, aluminosilicate glass, borosilicate glass, dichroic glass, germanium/semiconductor glass, glass ceramic, silicate/fused silica, soda lime glass, quartz or chalcogenide/sulphide glass, fluoride glass, a glass-based phenolic, flint glass, or cereated glass.

In some embodiments, the substrate is made of poly methyl methacrylate (PMMA), polyethylene terephthalate (PET), polyvinyl alcohol (PVA), or cellulose acetate (CA). In some embodiments, the substrate is made of a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene.

In some embodiments, the substrate includes one layer. In alternative embodiments, the substrate includes a plurality of layers. In some embodiments, a substrate comprises a plurality of layers, each with a different material. In some embodiments, a layer of another substance is applied onto the substrate. In some embodiments, the substrate has crystallographic symmetry.

In some embodiments, the plurality of processed elements has a reduced characteristic dimension or reduced width that is between 2 nm and 100 nm, resulting in the graphene layers generated on such processed elements with a reduced characteristic dimension or reduced width in the range of between 2 nm and 100 nm. In some embodiments, each graphene layer in the plurality of graphene layers generated on the processed elements comprises 1 to 500 graphene sheets. In some embodiments, a processed element or each respective processed element in the plurality of processed elements has a substantially same height as a corresponding initial element in the plurality of initial elements; in some other embodiments, a processed element or each respective processed element in the plurality of processed elements has a different height than a corresponding initial element in the plurality of initial elements. In some embodiments, a processed element or each processed element in the plurality of processed elements is taller than a corresponding initial element in the plurality of initial elements, and a difference in height is between 2 nm and 300 nm, or between 100 nm and 300 nm. In some embodiments, a processed element or each processed element in the plurality of processed elements has a height that is between 25 nm and 1000 nm, between 1 µm and 5 µm, or between 5 µm and 10 µm.

Figure 4A:
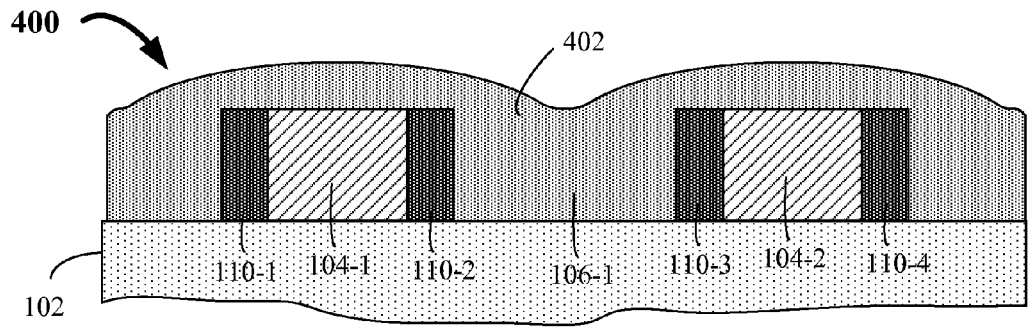

Referring now to FIGS. 4A-4F and FIG. 5, there is provided a detailed graphical representation of another exemplary method 400 and a flow chart of the method 400 for fabricating graphene devices with reduced critical dimension on a substrate, in accordance with some embodiments of the present disclosure. Like the method 100 disclosed above, the method 400 also starts from depositing a thin film on a patterned substrate 102 in step S510 and removing an undesired portion or portions of the deposited thin film in step S520 to form a plurality of processed elements with a reduced characteristic dimension. By way of illustration, FIG. 4A depicts an embodiment with a plurality of initial elements, such as initial elements 104-1, 104-2 and a plurality of processed elements, such as processed elements 110-1 and 110-2 formed on both side walls of the initial element 104-1. If desired, steps S510 and S520 can be repeated after removing the initial elements in step S530. These steps can be conducted using the same or similar processes discussed above in the context of the method 100.

Figure 4B:
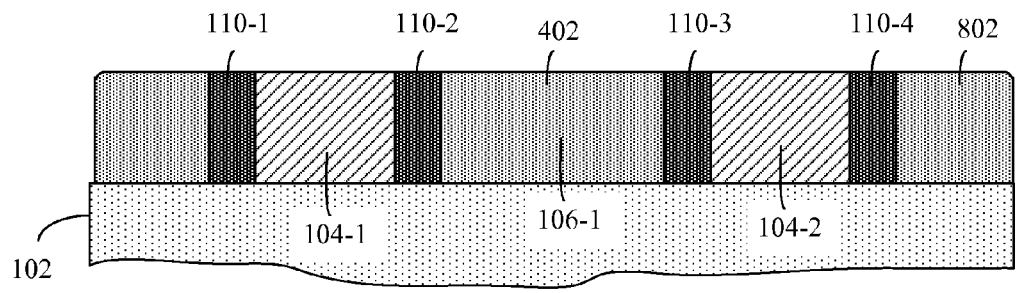
Figure 4C:
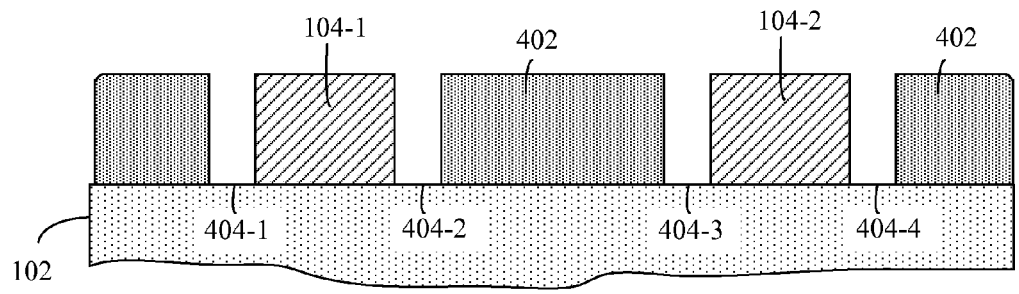

Once the desired characteristic dimension or other parameters are acquired, the method 400 proceeds to step S540, in which the substrate is backfilled with a backfill material. This process is also graphically illustrated in FIG. 4A, and indicated by reference numeral 402. In some embodiments, as shown in FIG. 4B, backfilling is accompanied by an optional planarization process to expose the tops of the processed elements for subsequent processes.

After the backfilling and optional planarization, the method 400 proceeds to step S550, in which the plurality of processed elements, such as processed elements 110-1 and 110-2, are removed, thus exposing portions of the substrate underneath as indicated by reference numerals 404-1, 404-2. Each exposed portion of the substrate that was underneath a corresponding processed element in the plurality of processed elements has a substantially the same reduced characteristic dimension as the removed corresponding processed element. The removal of the processed elements can be performed by any suitable methods, for example, by anisotropically or selectively etching the substrate.

Figure 4D:
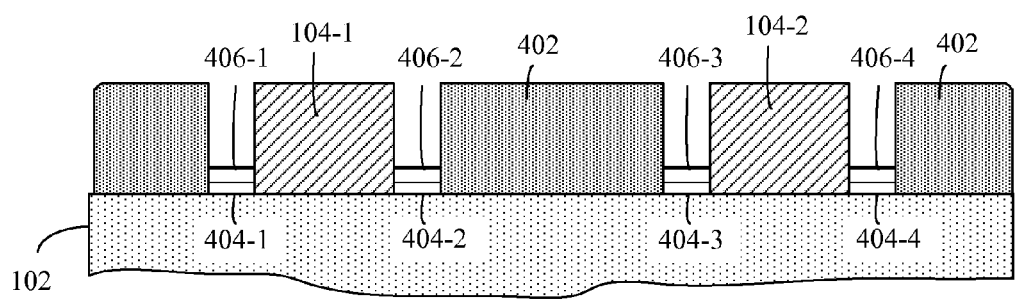
Figure 4E:
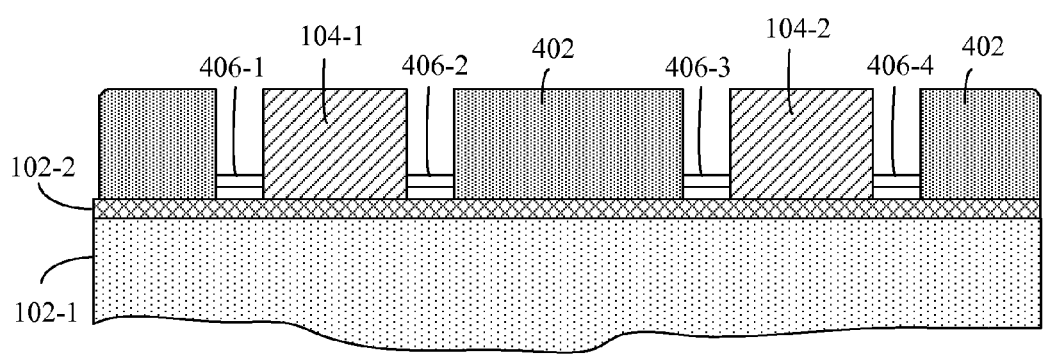
Figure 4F:
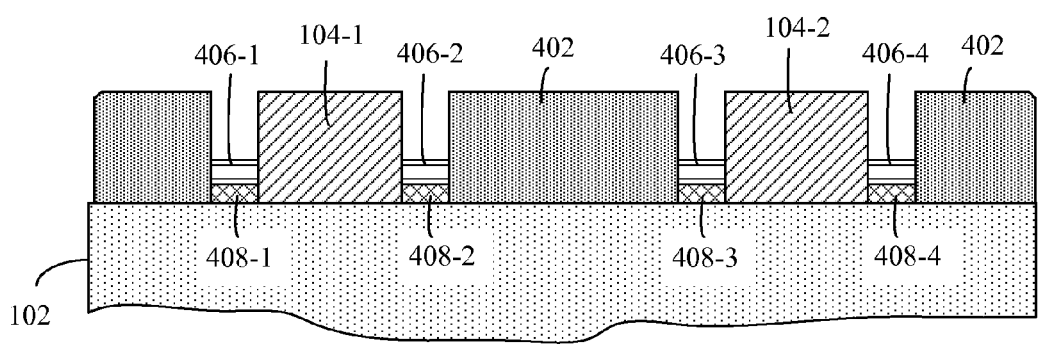

In some embodiments, in which the substrate itself or a layer of a substrate stack comprises a graphene foundation material, the method 400 proceeds to step S560 after portions of the substrate are exposed. Examples of such embodiments are illustrated in FIGS. 4D and 4E, where reference numeral 102-2 represents a layer of a substrate stack that comprises a foundation material. In step S560, a plurality of graphene layers, e.g., graphene layers 406-1, 406-2, are generated, each on a corresponding exposed portion of the substrate. In some embodiments, prior to step S560, the method 400 performs some additional or optional processes, such as a step S570, in which a foundation material is deposited onto the exposed portions of the substrate to form a foundation layer, as indicated by reference numerals 408-1, 408-2 in FIG. 4F. The graphene layers then are generated on the deposited foundation layer. In some embodiments, the graphene layers generated on the exposed portions of the substrate or the deposited foundation layer have a reduced characteristic dimension or reduced width in the range of between 2 nm and 100 nm, and each graphene layer comprises 1 to 500 graphene sheets.

FIGS. 6A-6D provide a detailed graphical representation of another exemplary method 600 for forming graphene devices with a reduced characteristic dimension, in accordance with some embodiments of the present disclosure. The method 600 utilizes one or more protective masks in the fabrication of processed elements with a reduced characteristic dimension. Such method is advantageous particularly in the fabrication of graphene devices with an interdigital pattern and multiple functionalities. However, one would appreciate that the method 600 can be used for the fabrication of a wide variety of graphene devices, with or without an interdigital pattern.

As illustrated in FIG. 6A, before depositing a first material onto a patterned substrate 102, the method 600 protects the patterned substrate with a first protective mask 602. Like the method 100 or 400, the patterned substrate comprises a plurality of initial elements and a plurality of initial trenches; each respective initial element is separated from an adjacent initial element by a corresponding initial trench. The first protective mask 602 is configured to have a plurality of isolated openings with a characteristic dimension, e.g., the opening width that does not exceed Wi−min or Wj−min. Such protective mask can be made by any standard lithographic methods, some of which are described in Section 7 and 8.

Next, the method 600 deposits a first material on the patterned substrate through the first protective mask, specifically, through the first plurality of isolated openings configured in the first protective mask. In this way, the deposition of the first material produces a first plurality of processed elements, such as processed elements 604-1, 604-2 in FIG. 6A, on the patterned substrate. The first plurality of processed elements has a first reduced characteristic dimension, e.g., width that corresponds to the first opening width of the first protective mask and thus does not exceed Wi−min or Wj−min.

After the first plurality of processed elements is formed, the first mask 602 is removed and a second protective mask 606 is placed over the substrate 102. The second mask protects the first plurality of processed elements on the patterned substrate. In addition, the second mask is configured to have a second plurality of isolated openings with a characteristic dimension, e.g., the opening width that does not exceed Wi−min or Wj−min. Like the first mask 602, the second mask 606 can also made by any standard lithographic method.

With the first plurality of processed elements protected by the second mask, the method 600 deposits a second material through the second plurality of isolated openings configured in the second protective mask, producing a second plurality of processed elements on the patterned substrate as shown in FIG. 6B. The second plurality of processed elements, such as processed elements 608-1, 608-2, has a second reduced characteristic dimension or reduced width that corresponds to the second opening width of the second protective mask and thus does not exceed Wi−min or Wj−min.

After the second plurality of processed elements is formed, in some embodiments, the method 600 proceeds to generating, concurrently or sequentially, first and second pluralities of graphene layers on the first and second pluralities of processed elements. As an example, FIG. 6C shows that the first plurality of graphene layers, e.g., 610-1, 610-2, is generated on top of the first plurality of processed elements, e.g., 604-1, 604-2, and the second plurality of graphene layers, e.g., 612-1, 612-2, is generated on top of the second plurality of processed elements, e.g., 608-1, 608-2. Thus, the first and second pluralities of graphene layers have substantially the same first and second reduced characteristic dimensions as the first and second pluralities of processed elements, respectively.

By way of illustration, FIGS. 6A-6D illustrates each initial element has a processed element in the first plurality of processed elements formed on a first side wall (e.g., left side wall) and a processed element in the second plurality of processed elements formed on a second side wall (e.g, right side wall). This is not an absolute requirement. In some embodiments, the initial elements can have other shapes and the processed elements can be formed on one or more sides, or on a portion of a side wall, as disclosed above in the context of the methods 100 and 400.

Figure 7C:
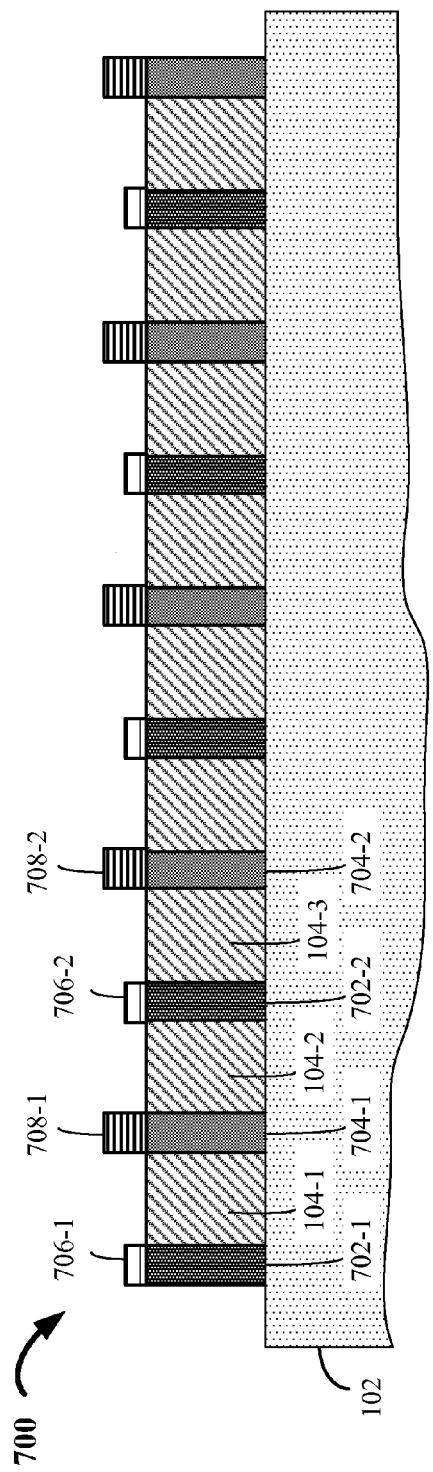

In some embodiments, the first and second protective masks can be configured or aligned with the substrate differently to produce graphene devices with different interdigital patterns or without an interdigital pattern at all. Examples are shown in FIGS. 7A-7D. For example, FIG. 7A illustrates an exemplary embodiment, in which the first plurality of processed elements, e.g., 702-1, 702-2, are formed on a first subset of initial elements, e.g., 104-1, 104-2, whereas the second plurality of processed elements, e.g., 704-1, 704-2, are formed on a second subset of initial elements, e.g., 104-4, 104-5. The first and second subsets of the initial elements do not overlap, meaning an initial element is present only in one subset. As shown, the first plurality of processed elements is present on one side of the substrate and the second of processed elements is present on another side of the substrate. Accordingly, the first and second pluralities of processed elements, as well as the first and second pluralities of graphene layers generated on the first and second pluralities of processed elements, do not form an interdigital pattern.

Figure 7D:
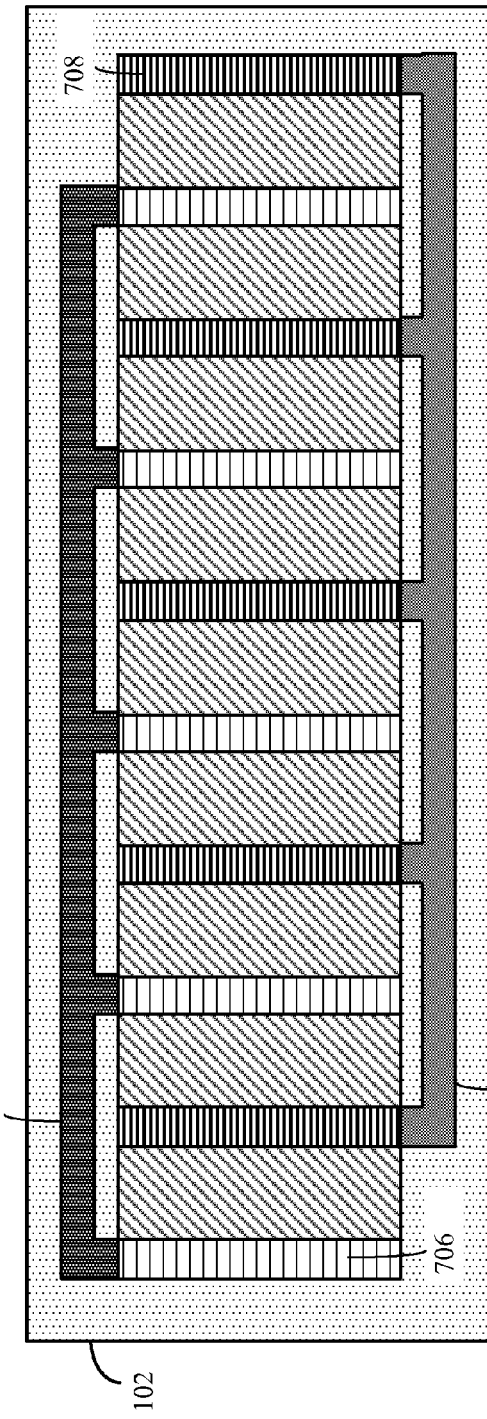

In some embodiments, by configuring or aligning the first and second protective masks differently, the method 600 can produce graphene devices with various different interdigital patterns. An example is shown in FIG. 7B, in which initial elements in the first subset are alternating with initial elements in the second subset, resulting in an interdigital pattern formed by the first plurality of processed elements, e.g., 702-1, 702-2, and the second plurality of processed elements, e.g., 704-1, 704-2. Accordingly, in this example, the first and second pluralities of graphene layers generated on the first and second pluralities of processed elements form an interdigital pattern. In some embodiments, the first and second pluralities of processed elements have a width substantially the same as the initial trenches and thus fill the trenches between the initial elements as illustrated in FIGS. 7C-7D.

In some embodiments, the first protective mask is configured such that a common bus, e.g., 710, is formed while depositing the first material on the substrate through the first protective mask. Such common bus electrically connects the first plurality of graphene layers, e.g., 706-1, 706-2, and can be used to form electrical communication with other internal or external circuits. Likewise, in some embodiments, the second protective mask is configured such that a second common bus, e.g., 712, is formed while depositing the second material on the substrate through the second protective mask. The second common bus electrically connects the second plurality of graphene layers, e.g., 708-1, 708-2, and can be used to form electrical communication with other internal or external circuits.

In some embodiments, the method 600 comprises additional or optional processes, such as a planarization process before generating graphene layers on the processed elements. In some embodiments where other functionalities are desired, additional materials or additional protective masks can be used to form graphene device with more than two sets of graphene layers. In some embodiments, a plurality of graphene layers is generated, concurrently or subsequently, on the initial elements as disclosed above in the context of the method 100 or 400.

The first reduced characteristic dimension or reduced width can be either the same as or different than the second reduced characteristic dimension or reduced width. Both of them can be in the range of between 2 nm and 100 nm. With different first and second reduced characteristic dimensions, graphene devices fabricated by the disclosed methods can have multiple band gaps and thus can achieve different electronic or photonic functionalities, e.g., absorbing or emitting photons in different wavelength ranges. In some embodiments, the first material or the second material comprises a foundation material, and graphene layers generated on such foundation materials can comprise 1 to 50 graphene sheets, 50 to 100 graphene sheets, or 100 to 500 graphene sheets. In some embodiments, the first and second materials can comprise the same foundation material or two different foundation materials. Generally, graphene layers generated on different materials comprise different number of graphene sheets. For example, the first material can comprise nickel (Ni) and the second material can comprise copper (Cu). In such embodiments, the first plurality of graphene layers generated on nickel can comprise approximately 5-20 graphene sheets, and the second plurality of graphene layers generated on copper can comprise approximately 1-5 graphene sheets. This diversity gives rise to the ability to design a wide variety of composite devices.

Turning now to FIG. 8, there is depicted a flow chart of another exemplary method 800 for forming multi-functional graphene devices, such as multiple band gaps on a substrate, in accordance with some embodiments of the present disclosure. The method 800 begins by depositing a plurality of thin films on a patterned substrate 102 in step S810. The deposition of such thin films is conducted sequentially, overlaying the first thin film on the patterned substrate and then one thin film on top of another thin film. The deposition can be performed, for example, using atomic layer deposition (ALD), and is controlled such that the thickness of each individual thin film does not exceed Wi−min and the combined thickness of all deposited thin films does not exceed Wj−min. In addition, each thin film in the plurality of thin films comprises a material that is different than an adjacent thin film in the plurality of thin films.

Figure 9A:
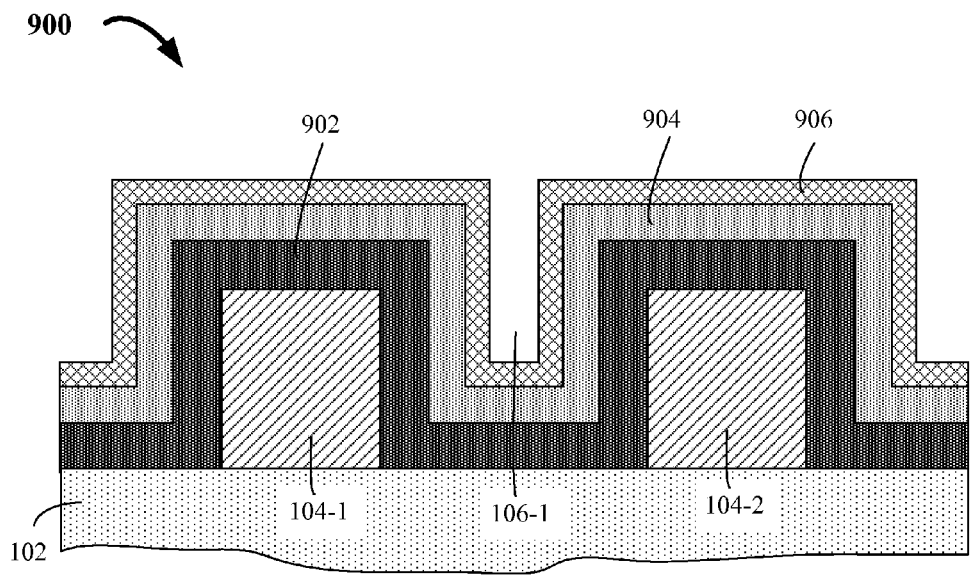
Figure 9B:
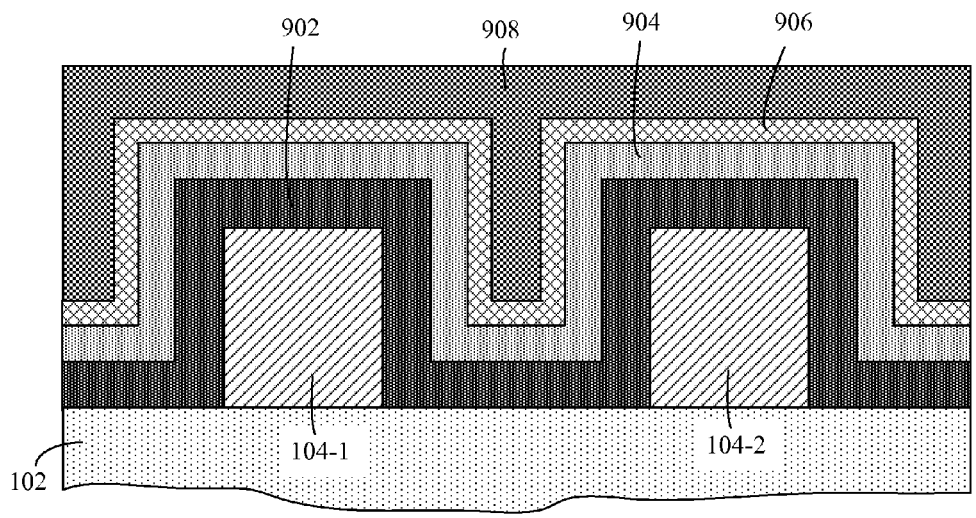
Figure 9C:
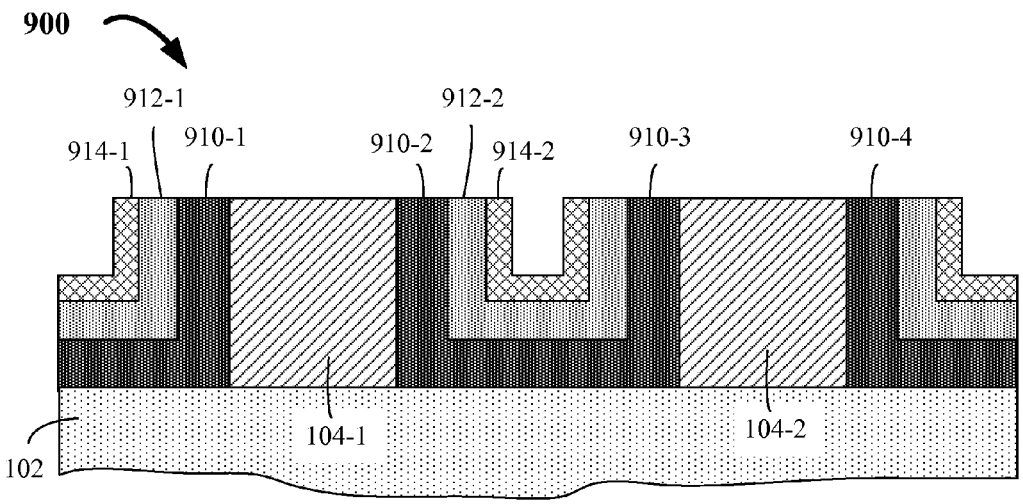
Figure 10A:
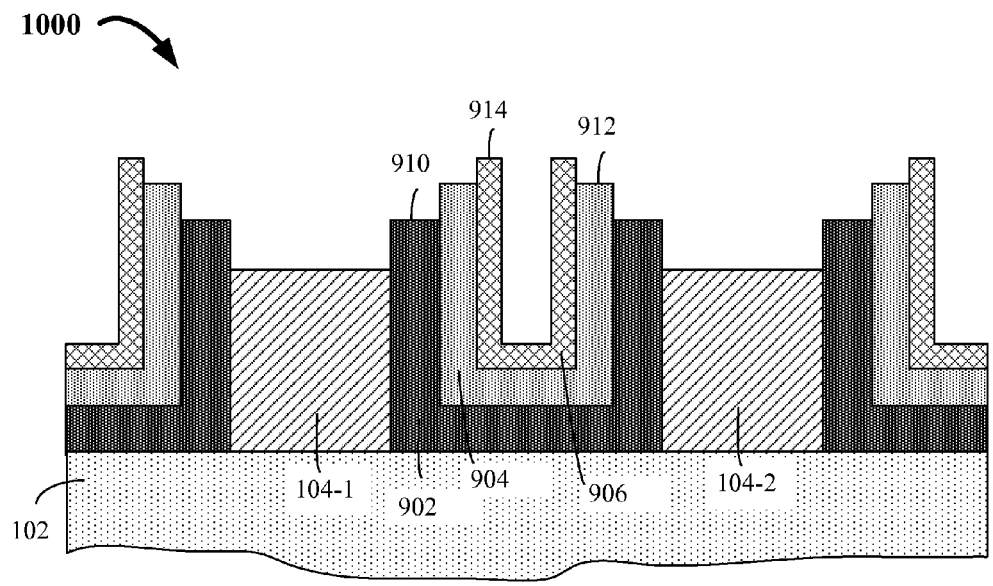
Figure 10B:
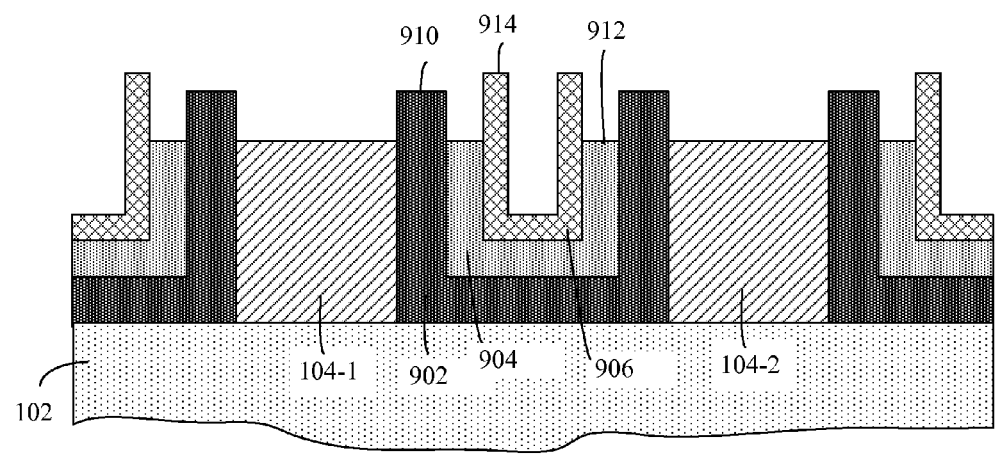

For example, FIG. 9A illustrates deposition of three thin films, i.e., a first thin film 902, a second thin film 904 and a third thin film 906. These three thin films are sequentially deposited on a patterned substrate 102 comprising initial elements and trenches (e.g., 104-1, 104-2 and 106-1), with the first thin film overlaying the substrate. In some embodiments, initial trenches are not completely filled by the deposited thin films as illustrated in FIG. 9A. In some other embodiments, the last deposited thin film fills all gaps or void spaces between adjacent initial elements, as indicated in FIG. 10A by the fourth thin film 908 deposited on top of the third thin film 906.

Figure 9D:
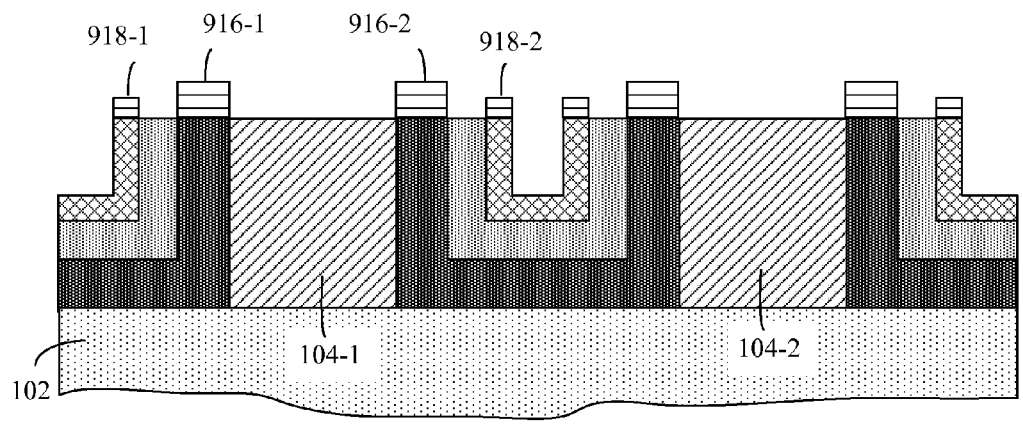

After the deposition of a plurality of thin films, anisotropic etching is performed on the substrate in step S820 to form a plurality of processed element sets. In some embodiments, portions of the plurality of thin films overlaid on the tops of initial elements in the plurality of initial elements are removed, for example by anisotropic etching, while portions of the plurality of thin films overlaid on side walls of the plurality of initial elements are retained. The retained portions of each thin film define one processed element set. For example, in FIG. 9C, retained positions of the first thin film 902 define the first processed element set, e.g., 910-1, 910-2, retained positions of the second thin film 904 define the second processed element set, e.g., 912-1, 912-2, and retained positions of the third thin film 906 define the third processed element set, e.g., 914-1, 914-2. Characteristic dimension of such processed elements in each set substantially equals to the thickness of the corresponding thin film, and thus does not exceed Wi-min or Wj-min Next, the method 800 proceeds to step S830, in which graphene layers are generated on one or more selected processed element sets. In some embodiments, each graphene layer is generated on a top surface of a processed element in a selected processed element set. In this way, the generated graphene layer has a characteristic dimension, e.g., width substantially equals to the thickness of the corresponding thin film, and thus does not exceed Wi-min or Wj-min. For example, FIG. 9D illustrates a first plurality of graphene layers, e.g., 916-1, 916-2, is generated on top of the first processed element set and a second plurality of graphene layers, e.g., 918-1, 918-2, is generated on top of the second processed element set. The first plurality of graphene layers has a characteristic dimension corresponding to the thickness of the first thin film 902 and the second plurality of graphene layers has a characteristic dimension corresponding to the thickness of the third thin film 906.

The thin films can comprise any suitable materials, including dielectric, semiconducting and metallic materials. Generally speaking, at least one thin film would comprise a graphene foundation material, such as silicon (Si), silicon carbide (SiC), germanium (Ge), titanium (Ti), nickel (Ni), copper (Cu) or palladium (Pd), for the fabrication of processed elements and the subsequent generation of graphene layers with a reduced characteristic dimension. In some embodiments, two or more thin films comprise either the same or different graphene generation materials. In some embodiments, thin films composed of a foundation material alternate with thin films that do not comprise a foundation material or do not promote graphene growth. Materials that do not promote graphene growth include glass, silicon dioxide, neoceram, or sapphire.

FIG. 9D illustrates an example, in which the first thin film 902 and the third thin film 906 comprise graphene foundation materials for the generation of the first and second pluralities of graphene layers. In some embodiments, the first and second thin films comprise the same graphene foundation material. In some other embodiments, the first and second thin films comprise different graphene foundation materials, producing graphene layers having different number of graphene sheets. For example, in some embodiments, the first thin film comprises nickel (Ni) and the second thin film comprises copper (Cu), resulting in the first plurality of graphene layers with approximately 5-20 graphene sheets and the second plurality of graphene layers with approximately 1-5 graphene sheets.

Figure 9E:
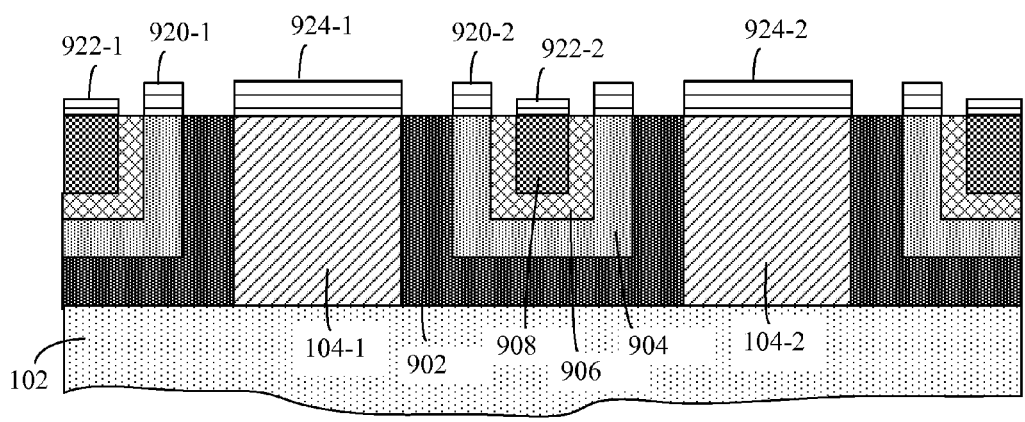

FIG. 9E illustrates another example, in which the second thin film 904 and the fourth thin film 908 comprise graphene foundation materials. Accordingly, the first plurality of graphene layers, e.g., 920-1, 920-2, and the second plurality of graphene layers, e.g., 922-1, 922-2, are generated on the second thin film 904 and the fourth thin film 908, respectively. In such embodiments, the first plurality of graphene layers and the second plurality of graphene layers have characteristic dimensions corresponding to the thicknesses of the second and fourth thin films, respectively. Similarly, the second and fourth thin films can comprise either the same or different foundation materials. In addition, in some embodiments, a plurality of graphene layers, e.g., 924-1, 924-2, is also generated on the initial elements. In such embodiments, the substrate or the initial elements also comprise a graphene foundation material.

As disclosed above, the characteristic dimensions of the generated graphene layers substantially equal to the thicknesses of the thin films or initial elements. The number of graphene sheets varies in according to the materials made of the thin films or initial elements, and in some cases varies in according to the processes or process parameters employed to generate the graphene layers. Thus, by the control of the thicknesses of the thin films, the selection of the materials for the thin films or variation of other physical or process parameters, the disclosed method 800 and other methods in the present application provide the capability to fabrication a wide variety of graphene devices with multiple functionalities, such as multiple band gaps for the absorption and emission of photons in different wavelength ranges.

In some embodiments, the generated graphene layers have a reduced characteristic dimension or reduced width that is between 2 nm and 100 nm. In some embodiments, the first thin film comprises nickel (Ni), the second thin film comprises silicon dioxide ($SiO_2$) and the third thin film comprises copper (Cu). In some embodiments, the substrate or the initial elements comprises silicon carbide (SiC), the first and third thin films comprise silicon dioxide ($SiO_2$), the second thin film comprises nickel (Ni), and the fourth thin film comprises copper (Cu).

Figure 10C:
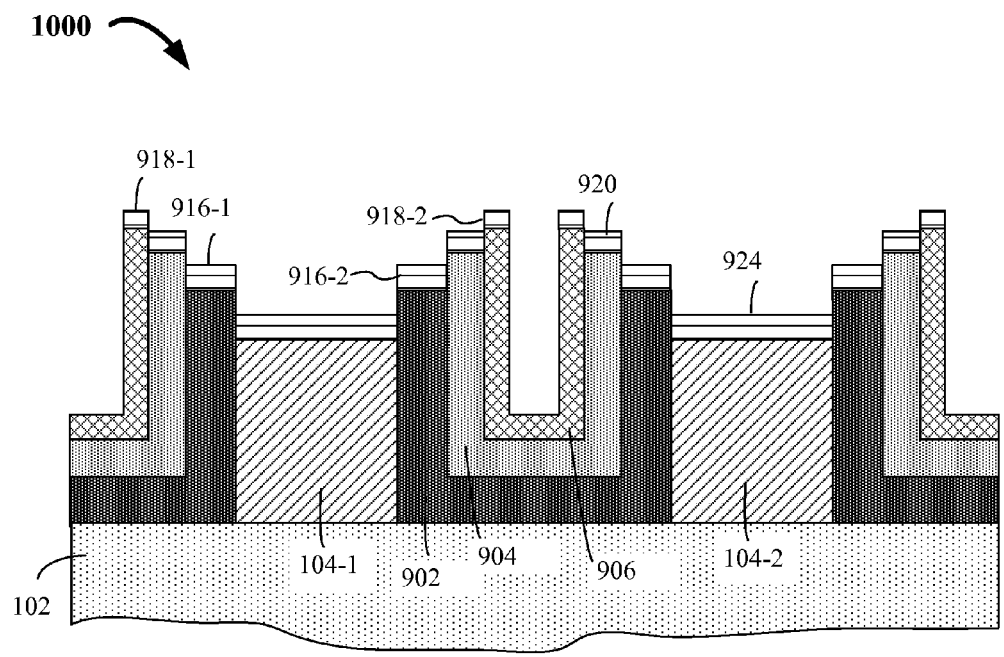
Figure 10D:
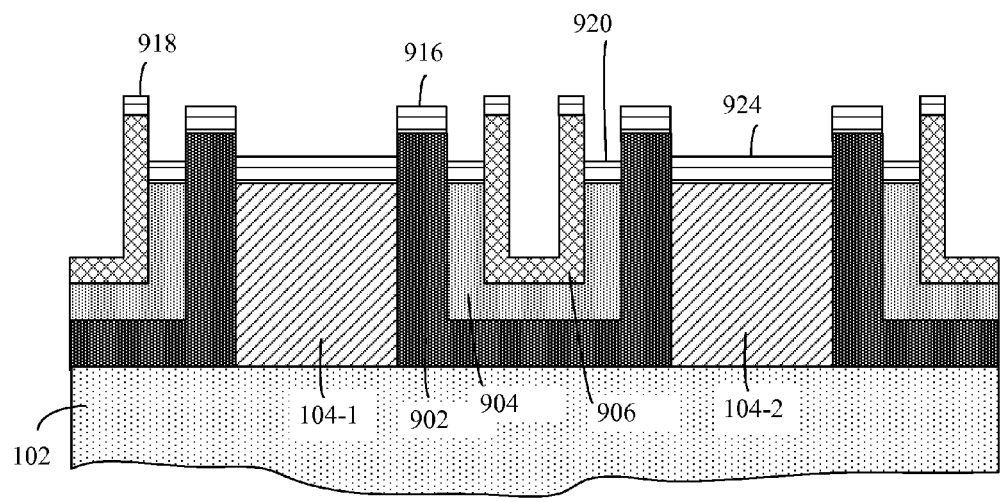
Figure 10E:
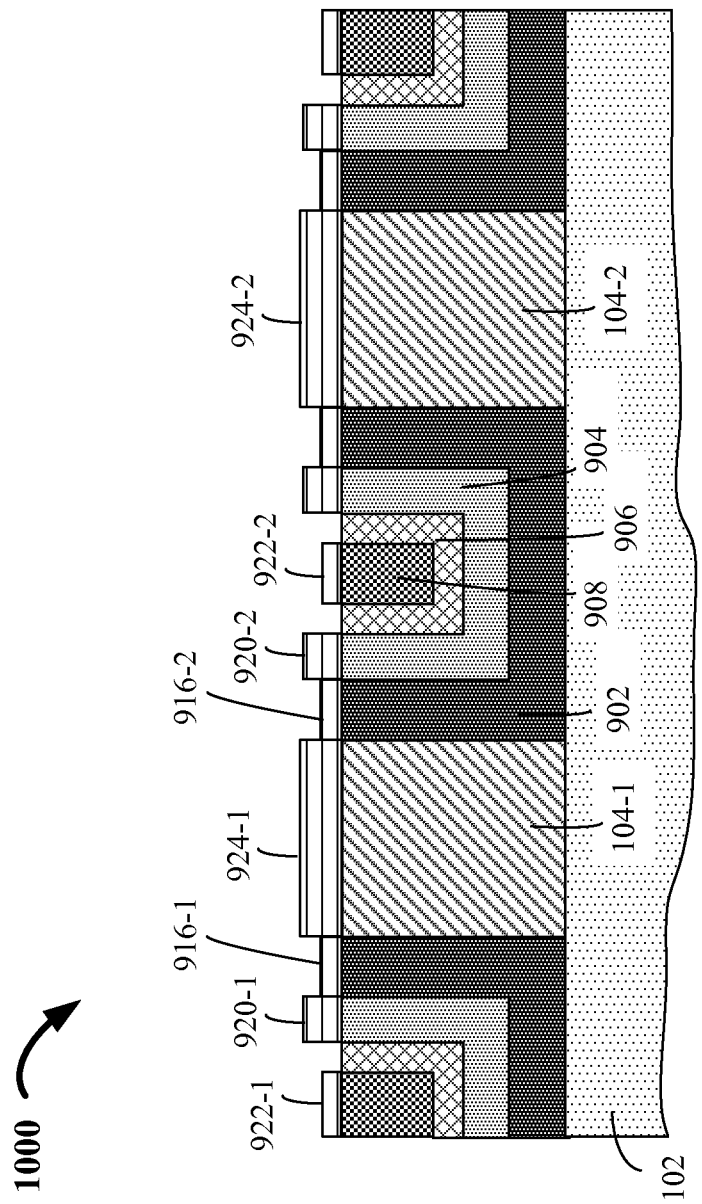

FIGS. 10A-10E provide graphical representations of exemplary multi-functional graphene devices (e.g., multiple band gaps) with variable configurations on a substrate, in accordance with some embodiments of the present disclosure. For example, in some embodiments, anisotropic etching in step S820 is performed to produce a plurality of proceeded element sets with multi-level configurations. In such configurations, one processed element set has a different height than another process element set or the initial elements, i.e., the top surfaces of one processed element set is not on the same elevation as another process element set or the initial elements. One example of such configurations is shown in FIG. 10A and the other in FIG. 10B. Such configurations provide several advantages. For instance, graphene layers can be generated on all elements, including initial and processed elements as shown in FIGS. 10C-10D, and still be isolated from each other. This enables the fabrication of graphene devices with high packing density, enhanced efficiency and various functionalities. One would be appreciate, however, such configurations are not absolute requirements. In some embodiments, graphene layers are generated on adjacent elements. These graphene layers may physically contact to each other but are functionally separated from each other by boundary conditions. For example, in the embodiment illustrated in FIG. 10E, the processed element sets are on the same level, and graphene layers generated on the first thin film, e.g. 916-1, are functionally separated from graphene layers generated on the initial elements, e.g. 924-1 or from graphene layers generated on the second thin film, e.g. 920-1, by boundary conditions.

FIG. 11A-11F provide a detailed graphical representation of an exemplary method 1100 for forming multi-level graphene devices on a substrate, in accordance with some embodiments of the present disclosure. The method 1100 starts from patterning a substrate 102 to form a plurality of initial elements and a plurality of initial trenches. Each initial element is separated from an adjacent initial element by a corresponding initial trench, and comprises at least a first level (e.g., 1102-1, 1104-1) and a wider second level (e.g., 1102-2, 1104-2). Accordingly, each initial trench comprises at least a first level (e.g., 1106-1) and a second level (e.g., 1106-2) that correspond to the first and second levels of two adjacent initial elements. The first and second levels of each initial element forms a protrusion with a width indicated by Wk in FIG. 11A. In the present disclosure, the minimum protrusion width is denoted as Wk–min.

Figure 11A:
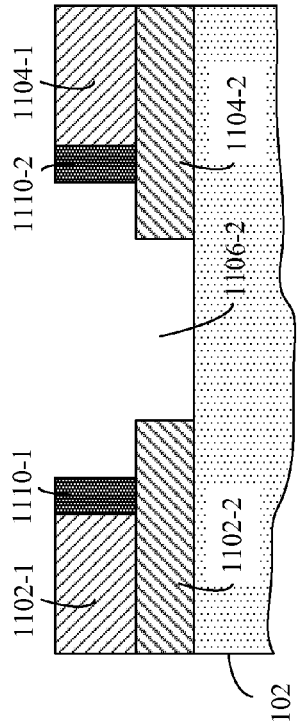
Figure 11B:
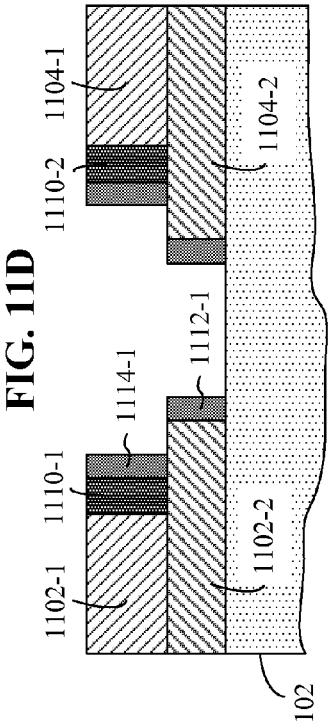
Figure 11C:
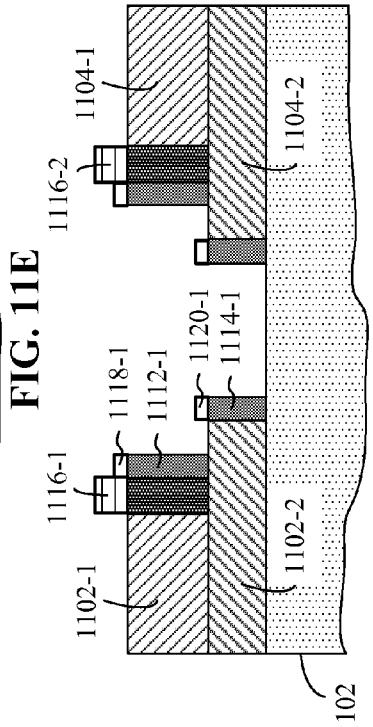
Figure 11D:
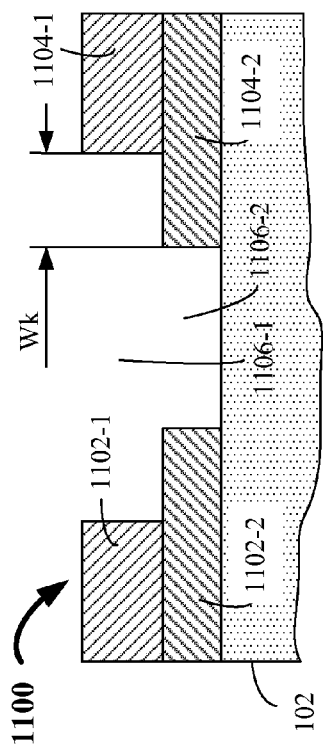

Next, the method 1100 backfills the second level of each trench (e.g., 1106-2) with a backfill material, as indicated by the reference numeral 1108 in FIG. 11B. In some embodiments, additional or optional processes such as planarization may be used to remove the backfill material from the protrusions or other surfaces. With the second level of each trench filled with the backfill material, the method 1100 deposits a first thin film on the substrate and then performs anisotropic etching of the substrate to produce a first plurality of processed elements. In some embodiments, deposition of the first thin film is conducted using ALD and anisotropic etching is performed such that only portions of the first thin film overlaid on side walls of the first levels of the initial elements are retained and other portions of the first thin film are removed. As illustrated in FIG. 11C, each of these retained portions of the first thin film defines a processed element, e.g., 1110-1, 1110-2. The deposition is conducted such that the thickness of the first thin film does not exceed Wi–min, Wj–min or Wk–min. As a result, the characteristic dimension of the first plurality of processed elements does not exceed Wi–min, Wj–min or Wk–min.

Figure 11E:
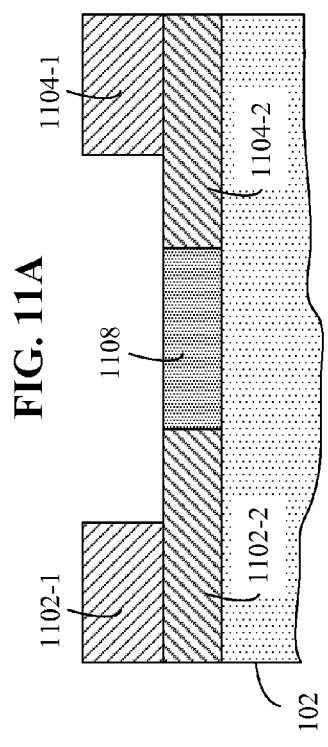

After the formation of the first plurality of processed elements, the method 1100 removes the backfill material 1108, for example, by anisotropically or selectively etching the substrate. The removal of the backfill material 1108 exposes the second level of each initial trench (e.g., 1106-2). Once the backfill material is removed, the method 1100 deposits a second thin film on the substrate and anisotropically etching the substrate to produce second and third pluralities of processed elements. In some embodiments, deposition of the second thin film is also conducted using ALD. Anisotropic etching is performed to remove portions of the second thin film other than those overlaid on side walls of the second levels of the initial elements and those overlaid on side walls of the first plurality of processed elements. As illustrated in FIG. 11E, the second plurality of processed elements (e.g., 112-1) is defined by the retained portions of the second thin film on side walls of the first plurality of processed elements (e.g., 1110-1). The third plurality of processed elements (e.g., 1114-1) is defined by the retained portions of the second thin film on side walls of the second levels of initial elements.

As the deposition of the first thin film, the deposition of the second thin film is conducted such that the thickness of the second thin film does not exceed Wi–min, Wj–min or Wk–min. As a result, the characteristic dimension of the second plurality of processed elements does not exceed Wi–min, Wj–min or Wk–min. In some embodiments, the initial elements have more than two levels or the method 1100 deposit more than two thin films on the substrate for form more than three pluralities of processed elements.

Figure 11F:
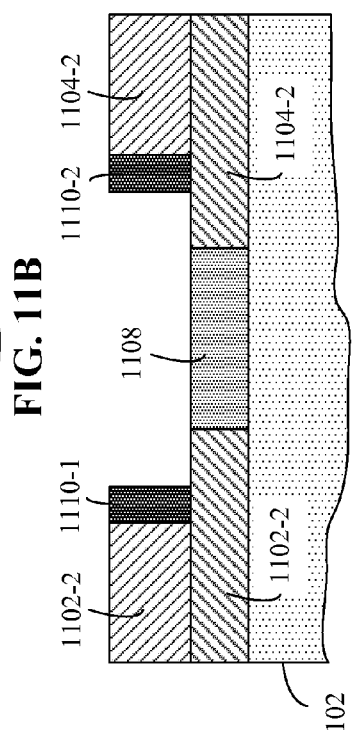

Once the desired processed elements are formed, the method 1100 generate graphene layers on selected or all of the processed elements. For example, FIG. 11F illustrates the generation of first, second and third pluralities of graphene layers (e.g., 1116-1, 1118-1, 1120-1) on top of the first, second, and third pluralities of processed elements, respectively. The first plurality of graphene layers has a first reduced characteristic dimension corresponding to the thickness of the first thin film. The second and third pluralities of graphene layers have a second reduced characteristic dimension corresponding to the thickness of the second thin film. Accordingly, both reduced characteristic dimensions do not exceed Wi–min, Wj–min or Wk–min.

FIG. 12A-12E provide a detailed graphical representation of an alternative exemplary method 1200 for forming multi-level graphene devices on a substrate, in accordance with some embodiments of the present disclosure. Like the method 1100, the method 1200 starts from patterning a substrate 102 to form a plurality of initial elements and a plurality of initial trenches. Each initial element is separated from an adjacent initial element by a corresponding initial trench. However, unlike the method 1100 that forms the initial elements with multiple levels at very beginning, the method 1200 forms the initial elements with one level in the first step, such as 1202-1, 1204-1 in FIG. 12A.

Because the initial elements have only one level, the backfilling step is unnecessary for the method 1200. Therefore, after the substrate is patterned, the method 1200 deposits a first thin film on the substrate and performs anisotropic etching of the substrate to produce a first plurality of processed elements (e.g., 1210-1, 1210-2), in a similar or the same way as discussed above in the context of the method 1100.

Next, the substrate is patterned to form another level for each initial element, using etching, deposition or any other suitable lithographical techniques. In some embodiments, this later patterned level is formed below the initial level, for example by etching the substrate, such as 1202-2, 1204-2 shown in FIG. 12 C. In some embodiments, the later patterned level is formed above the initial level, for example by deposition, such as 1302-2, 1304-2 shown in FIG. 13C.

Then the method 1200 deposits a second thin film on the substrate and continues with the same or similar steps as of the method 1100, to form second and third pluralities of processed elements (e.g., 1212-1, 1214-2 in FIG. 12D, and 1312-1, 1314-2 in FIG. 13D,) and generate graphene layers on selected or all of the processed elements (e.g., 1216-1, 1218-1, 1220-1 in FIG. 12E and 1316-1, 1318-1, 1320-1 in FIG. 13E).

Like the thin films disclosed in the context of the method 1100, the first and second thin films can comprise a graphene foundation material. Preferable, in some embodiments, the first and the second thin film comprise different graphene foundation materials, such that a graphene layer in the first plurality of graphene layers (e.g., 1216-1, 1316-1) is functionally separated from a graphene layer in the second plurality of graphene layers (e.g., 1218-1, 1318-1) by boundary conditions. In addition, the deposition of the thin films are conducted such that the thickness of a thin film does not exceed Wi–min, Wk–min or half of Wj–min. Accordingly, the generated graphene layers have a reduced characteristic dimension, generally in the range of between 2 nm and 100 nm. In some embodiments, the first plurality of graphene layers has a reduced characteristic dimension or width that is between 25 nm and 35 nm for absorbing or emitting a blue frequency or a blue frequency range, and the plurality of graphene layers has a reduced characteristic dimension or width that is between 65 nm and 75 nm for absorbing or emitting a green frequency or a green frequency range.

6. ADVANTAGES

The present disclosure provides the ability to fabricate a wide variety of graphene devices. One advantage of the present disclosure lies in the elimination of the post graphene process, which is difficult particularly in the nanoscale dimensions, once the graphene has been formed. Instead of patterning the graphene, the present disclosure patterns other materials, for example, dielectric, semiconducting or metallic materials, to form a desired topography with a reduced characteristic dimension before the graphene generation. Accordingly, the present disclosure can fabricate nanoscale graphene structures or devices with ease, precision and consistency.

Another advantage of the present disclosure is the ability to fabricate a graphene device with multiple functions in the same device. For example, in some embodiments, one set of graphene layers performs one function while another set of graphene layers performs a different function. Numerous physical properties that may be shared or may be varied between different sets include, but not limited to, characteristic dimensions, number of graphene sheets, pitches or patterns (e.g., non-interdigital, interdigital, multi-level). This diversity gives rise to the ability to fabricate a wide variety of composite devices with desired functionalities as disclosed herein.

Still another advantage of the present disclosure is the ability to produce graphene structures and devices with high packing densities and enhanced efficiency. By the elimination of the post graphene process, the present disclosure reduces the loss of the workable surface areas. In some embodiments, the present disclosure has the multiplicity capability to provide additional workable surfaces areas for enhancing electronic or photonic functions. In some embodiments, the present disclosure can produce multi-level structures, providing additional workable surfaces areas for enhancing functionalities of devices such as efficiency of solar cells or photo detectors.

7. DEPOSITION METHODS

The following subsections describe individual fabrication techniques that can be used to deposit layers of material, e.g. thin film 108, foundation layer 408, hereinafter referred to collectively as "deposit materials," in accordance with embodiments of the present disclosure.

7.1 Chemical Vapor Deposition

In some embodiments, one or more layers of the deposit materials are deposited by chemical vapor deposition. In chemical vapor deposition (CVD), the constituents of a vapor phase, often diluted with an inert carrier gas, react at a hot surface (typically higher than 190° C.) to deposit a solid film. Generally, chemical vapor deposition reactions require the addition of energy to the system, such as heating the chamber or the wafer. For more information on chemical vapor deposition, exemplary devices used to perform chemical vapor deposition, and process conditions are used to perform chemical vapor deposition of silicon nitride, see Van Zant, Microchip Fabrication, Fourth Edition, McGraw-Hill, New York, 2000, pp. 363-393; and Madou, Fundamentals of Microfabrication, Second Edition, 2002, pp. 144-154, CRC Press, each of which are hereby incorporated by reference herein in their entireties.

7.2 Reduced Pressure Chemical Vapor Deposition

In some embodiments, one or more layers of the deposit materials are deposited by reduced pressure chemical vapor deposition (RPCVD). RPCVD is typically performed at below 10 Pa and at temperatures in the range of (550° C.-600° C.). The low pressure used in RPCVD results in a large diffusion coefficient, which leads to growth of a layer that is limited by the rate of surface reactions rather than the rate of mass transfer to the substrate. In RPCVD, reactants can typically be used without dilution. RPCVD is performed, for example, in some embodiments, in a horizontal tube hot wall reactor.

7.3 Low Pressure Chemical Vapor Deposition

In some embodiments, one or more layers of the deposit materials are deposited by low pressure chemical vapor deposition (LPCVD) or very low pressure CVD. LPCVD is typically performed at below 1 Pa.

7.4 Atmospheric Chemical Vapor Deposition

In some embodiments, one or more layers of the deposit materials are deposited by atmospheric to slightly reduced pressure chemical vapor deposition. Atmospheric pressure to slightly reduced pressure CVD (APCVD) is used, for example, to grow APCVD is a relatively simplistic process that has the advantage of producing layers at high deposition rates and low temperatures (350° C.-400° C.).

7.5 Plasma Enhanced Chemical Vapor Deposition

In some embodiments, one or more layers of the deposit materials are deposited by plasma enhanced (plasma assisted) chemical vapor deposition (PECVD). PECVD systems feature a parallel plate chamber operated at a low pressure (e.g., 2-5 Torr) and low temperature (300° C.-400° C.). A radio-frequency-induced glow discharge, or other plasma source is used to induce a plasma field in the deposition gas. PECVD systems that are used include, but are not limited to, horizontal vertical flow PECVD, barrel radiant-heated PECVD, and horizontal-tube PECVD. In some embodiments, remote plasma CVD (RPCVD) is used. Remote plasma CVD is described, for example, in U.S. Pat. No. 6,458,715 to Sano et al., which is hereby incorporated by reference in its entirety.

7.6 Anodization

In some embodiments, one or more layers of the deposit materials are deposited by anodization. Anodization is an oxidation process performed in an electrolytic cell. The material to be anodized becomes the anode (+) while a noble metal is the cathode (−). Depending on the solubility of the anodic reaction products, an insoluble layer (e.g., an oxide) results. If the primary oxidizing agent is water, the resulting oxides generally are porous, whereas organic electrolytes lead to very dense oxides providing excellent passivation. See, e.g., Madou et al., 1982, J. Electrochem. Soc. 129, pp. 2749-2752, which is hereby incorporated by reference in its entirety.

7.7 Sol-Gel Deposition Techniques

In some embodiments, one or more layers of the deposit materials are deposited by a sol-gel process. In a sol-gel process solid particles, chemical precursors, in a colloidal suspension in a liquid (a sol) forms a gelatinous network (a gel). Upon removal of the solvent by heating a glass or ceramic layer. Both sol and gel formation are low-temperature processes. For sol formation, an appropriate chemical precursor is dissolved in a liquid, for example, tetraethylsiloxane (TEOS) in water. The sol is then brought to its gel-point, that is, the point in the phase diagram where the sol abruptly changes from a viscous liquid to a gelatinous, polymerized network. In the gel state the material is shaped (e.g., a fiber or a lens) or applied onto a substrate by spinning, dipping, or spraying. In the case of TEOS, a silica gel is formed by hydrolysis and condensation using hydrochloric acid as the catalyst. Drying and sintering at temperatures between 200° C. to 600° C. transforms the gel into a glass and ultimately into silicon dioxide.

In the semiconductor industry the sol-gel method described is often used to deposit silicon dioxide. The method is known as the Spin-On Glass method (SOG). Spin-On Glass materials have been widely used as a diffusion source or a planarizing dielectric or multilevel metalization schemes in the fabrication of nowadays integrated circuits. SOGs are in general Si—O network polymers in organic solvents, and prepared through the hydrolysis-condensation reaction that implied the sol-gel technology. SOG materials can be divided into three groups: 1) silicate based compounds, 2) organosilicon compounds and 3) dopant-organic compounds. More information on SOG can be found, for example, in Nguyen Nhu Toan, *Spin-On Glass Materials and Applications in Advanced IC Technologies*, 1999, which is hereby incorporated herein by reference in its entirety.

7.8 Plasma Spraying Techniques

In some embodiments, one or more layers of the deposit materials are deposited by a plasma spraying process. With plasma spraying, almost any material can be coated on many types of substrates. Plasma spraying is a particle deposition method. Particles, a few microns to 100 microns in diameter, are transported from source to substrate. In plasma spraying, a high-intensity plasma arc is operated between a sticktype cathode and a nozzle-shaped water-cooled anode. Plasma gas, pneumatically fed along the cathode, is heated by the arc to plasma temperatures, leaving the anode nozzle as a plasma jet or plasma flame. Argon and mixtures of argon with other noble (He) or molecular gases ($H_2$, $N_2$, $O_2$, etc.) are frequently used for plasma spraying. Fine powder suspended in a carrier gas is injected into the plasma jet where the particles are accelerated and heated. The plasma jet reaches temperatures of 20,000 K and velocities up to 1000 $ms^{-1}$ in some embodiments. The temperature of the particle surface is lower than the plasma temperature, and the dwelling time in the plasma gas is very short. The lower surface temperature and short duration prevent the spray particles from being vaporized in the gas plasma. The particles in the plasma assume a negative charge, owing to the different thermal velocities of electrons and ions. As the molten particles splatter with high velocities onto a substrate, they spread, freeze, and form a more or less dense coating, typically forming a good bond with the substrate. Plasma spraying equipment is available from Sulzer Metco (Winterthur Switzerland). For more information on plasma spraying, see, for example, Madou, *Fundamentals of Microfabrication*, Second Edition, 2002, pp. 157-159, CRC Press, which is hereby incorporated by reference in its entirety.

7.9 Ink Jet Printing

In some embodiments, one or more layers of the deposit materials are deposited by ink-jet printing Ink-jet printing is based on the same principles of commercial ink jet printing. The ink-jet nozzle is connected to a reservoir filled with the chemical solution and placed above a computer-controlled x-y stage. The target object is placed on the x-y stage and, under computer control, liquid drops (e.g., 50 microns in diameter) are expelled through the nozzle onto a well-defined place on the object. Different nozzles print different spots in parallel. In one embodiment of the present disclosure, a bubble jet, with drops as small as a few picoliters, is used to form a layer of a deposit material. In another embodiment, a thermal ink jet (Hewlett Packard, Palo Alto, Calif.) is used to form a layer of a deposit material. In a thermal ink jet, resistors are used to rapidly heat a thin layer of liquid ink. A superheated vapor explosion vaporizes a tiny fraction of the ink to form an expanding bubble that ejects a drop of ink from the ink cartridge onto the substrate. In still another embodiment of the present disclosure, a piezoelectric ink jet head is used for ink jet printing. A piezoelectric ink-jet head includes a reservoir with an inlet port and a nozzle at the other end. One wall of the reservoir consists of a thin diaphragm with an attached piezoelectric crystal. When voltage is applied to the crystal, it contracts laterally, thus deflecting the diaphragm and ejecting a small drop of fluid from the nozzle. The reservoir then refills via capillary action through the inlet. One, and only one, drop is ejected for each voltage pulse applied to the crystal, thus allowing complete control over the when a drop is ejected. In yet another embodiment of the present disclosure, an epoxy delivery system is used to deposit a layer of a device. An example of an epoxy delivery system is the Ivek Digispense 2000 (Ivek Corporation, North Springfield, Vt.). For more information on jet spraying, see, for example, Madou, *Fundamentals of Microfabrication*, Second Edition, 2002, pp. 164-167, CRC Press, which is hereby incorporated by reference herein in its entirety.

7.10 Vacuum Evaporation

In one embodiment of the present disclosure, one or more layers of the deposit materials are deposited by vacuum evaporation. Vacuum evaporation takes place inside an evacuated chamber. The chamber can be, for example, a quartz bell jar or a stainless steel enclosure. Inside the chamber is a mechanism that evaporates the metal source, a wafer holder, a shutter, thickness and rate monitors, and heaters. The chamber is connected to a vacuum pump. There are any number of different ways in which the metal is evaporated within the chamber, including filament evaporation, E-beam gun evaporation, and hot plate evaporation. See, for example, Van Zant, *Microchip Fabrication*, Fourth Edition, McGraw-Hill, New York, 2000, pp. 407-411, which is hereby incorporated by reference herein in its entirety.

7.11 Sputter Deposition/Physical Vapor Deposition

In another embodiment of the present disclosure, one or more layers of the deposit materials are deposited by sputtering. Sputtering, like evaporation, takes place in a vacuum. However, it is a physical not a chemical process (evaporation is a chemical process), and is referred to as physical vapor deposition. Inside the vacuum chamber is a slab, called a target, of the desired film material. The target is electrically grounded. An inert gas such as argon is introduced into the chamber and is ionized to a positive charge. The positively charged argon atoms are attracted to the grounded target and accelerate toward it.

During the acceleration they gain momentum, and strike the target, causing target atoms to scatter. That is, the argon atoms "knock off" atoms and molecules from the target into the chamber. The sputtered atoms or molecules scatter in the chamber with some coming to rest on the wafer. A principal feature of a sputtering process is that the target material is deposited on the wafer with chemical or compositional change. In some embodiments of the present disclosure, direct current (DC) diode sputtering, radio frequency (RF) diode sputtering, triode sputtering, DC magnetron sputtering or RF magnetron sputtering is used. See, for example, Van Zant, *Microchip Fabrication*, Fourth Edition, McGraw-Hill, New York, 2000, pp. 411-415; U.S. Pat. No. 5,203,977; U.S. Pat. No. 5,486,277; and U.S. Pat. No. 5,742,471, each of which is hereby incorporated by reference herein in its entirety.

RF diode sputtering is a vacuum coating process where an electrically isolated cathode is mounted in a chamber that can be evacuated and partially filled with an inert gas. If the cathode material is an electrical conductor, a direct-current high-voltage power supply is used to apply the high voltage potential. If the cathode is an electrical insulator, the polarity of the electrodes is reversed at very high frequencies to prevent the formation of a positive charge on the cathode that would stop the ion bombardment process. Since the electrode polarity is reversed at a radio frequency, this process is referred to as 133 sputtering. Magnetron sputtering is different form of sputtering. Magnetron sputtering uses a magnetic field to trap electrons in a region near the target surface thus creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

7.12 Collimated Sputtering

In another embodiment of the present disclosure, one or more layers of the deposit materials are deposited by collimated sputtering. Collimated sputtering is a sputtering process where the arrival of metal occurs at an angel normal to the wafer surface. The metal is collimated by a thick honeycomb grid that effectively blocks off angle metal atoms in some embodiments. Alternatively, ionizing the metal atoms and attracting them towards the wafer collimates the metal. Collimated sputtering improves filling of high aspect ratio contacts.

7.13 Laser Ablated Deposition

In another embodiment of the present disclosure, one or more layers of the deposit materials are deposited by laser ablated deposition. In one form of laser ablated deposition, a rotating cylindrical target surface is provided for the laser ablation process. The target is mounted in a vacuum chamber so that it is rotated about the longitudinal axis of the cylindrical surface target and simultaneously translated along the longitudinal axis. A laser beam is focused by a cylindrical lens onto the target surface along a line that is at an angle with respect to the longitudinal axis to spread a plume of ablated material over a radial arc. The plume is spread in the longitudinal direction by providing a concave or convex lateral target surface. The angle of incidence of the focused laser beam is other than normal to the target surface to provide a glancing geometry in some embodiments. Simultaneous rotation about and translation along the longitudinal axis produce a smooth and even ablation of the entire cylindrical target surface and a steady evaporation plume. Maintaining a smooth target surface is useful in reducing undesirable splashing of particulates during the laser ablation process and thereby depositing high quality thin films. See, for example, U.S. Pat. No. 5,049,405, which is hereby incorporated by reference herein in its entirety.

7.14 Molecular Beam Deposition

In another embodiment of the present disclosure, one or more layers of the deposit materials are deposited by molecular beam deposition. Molecular beam deposition is a method of growing films, under vacuum conditions, by directing one or more molecular beams at a substrate. In some instances, molecular beam deposition involves epitaxial film growth on single crystal substrates by a process that typically involves either the reaction of one or more molecular beams with the substrate or the deposition on the substrate of the beam particles. The term "molecular beam" refers to beams of monoatomic species as well as polyatomic species. The term molecular beam deposition includes both epitaxial growth and nonepitaxial growth processes. Molecular beam deposition is a variation of simple vacuum evaporation. However, molecular beam deposition offers better control over the species incident on the substrate than does vacuum evaporation. Good control over the incident species, coupled with the slow growth rates that are possible, permits the growth of thin layers having compositions (including dopant concentrations) that are precisely defined. Compositional control is aided by the fact that growth is generally at relatively low substrate temperatures, as compared to other growth techniques such as liquid phase epitaxy or chemical vapor deposition, and diffusion processes are very slow.

Essentially arbitrary layer compositions and doping profiles are obtained with precisely controlled layer thickness. In fact, layers as thin as a monolayer are grown by MBE. Furthermore, the relatively low growth temperature permits growth of materials and use of substrate materials that could not be used with higher temperature growth techniques. See for example, U.S. Pat. No. 4,681,773, which is hereby incorporated by reference herein in its entirety.

7.15 Ionized Physical Vapor Deposition

In another embodiment of the present disclosure, one or more layers of the deposit materials are deposited by ionized physical vapor deposition (I-PVD), also known as ionized metal plasma (IMP). In I-PVD, metal atoms are ionized in an intense plasma. Once ionized, the metal is directed by electric fields perpendicular to the wafer surface. Metal atoms are introduced into the plasma by sputtering from the target. A high density plasma is generated in the central volume of the reactor by an inductively coupled plasma (ICP) source. This electron density is sufficient to ionize approximately 80% of the metal atoms incident at the wafer surface. The ions from the plasma are accelerated and collimated at the surface of the wafer by a plasma sheath. The sheath is a region of intense electric field that is directed toward the wafer surface. The field strength is controlled by applying a radio frequency bias.

7.16 Ion Beam Deposition

In another embodiment of the present disclosure, one or more layers of the deposit materials are deposited by ion beam deposition (IBD). IBD uses an energetic, broad beam ion source carefully focused on a grounded metallic or dielectric sputtering target. Material sputtered from the target deposits on a nearby substrate to create a film. Most applications also use a second ion source, termed an ion assist source (IAD), which is directed at the substrate to deliver energetic noble or reactive ions at the surface of the growing film. The ion sources are "gridded" ion sources and are typically neutralized with an independent electron source. IBD processing yields excellent control and repeatability of film thickness and properties. Process pressures in IBD systems are approximately $10^{-4}$ Torr. Hence, there is very little scattering of either ions delivered by the ion sources or material sputtered from the target of the surface. Compared to sputter deposition using magnetron or diode systems, sputter deposition by IBD is highly directional and more energetic. In combination with a substrate fixture that rotates and changes angle, IBD systems deliver a broad range of control over sidewall coatings, trench filling and liftoff profiles.

7.17 Atomic Layer Deposition

In another embodiment of the present disclosure, one or more layers of the deposit materials are deposited by atomic layer deposition. Atomic layer deposition is also known as atomic layer epitaxy, sequential layer deposition, and pulsed-gas chemical vapor deposition. Atomic layer deposition involves use of a precursor based on self-limiting surface reactions. Generally, an object is exposed to a first species that deposits as a monolayer on the object. Then, the monolayer is exposed to a second species to form a fully reacted layer plus gaseous byproducts. The process is typically repeated until a desired thickness is achieved. Atomic layer deposition and various methods to carry out the same are described in U.S. Pat. No. 4,058,430 to Suntola et al., entitled "Method for Producing Compound Thin Films," U.S. Pat. No. 4,413,022 to Suntola et al., entitled "Method for Performing Growth of Compound Thin Films," to Ylilammi, and George et al., 1996, J. Phys. Chem. 100, pp. 13121-13131, each of which is hereby incorporated by reference herein in its entirety. Atomic layer deposition has also been described as a chemical vapor deposition operation performed under controlled conditions that cause the deposition to be self-limiting to yield deposition of, at most, a monolayer. The deposition of a monolayer provides precise control of film thickness and improved compound material layer uniformity. Atomic layer deposition is performed using equipment such as the Endura Integrated Cu Barrier/Seed system (Applied Materials, Santa Clara, Calif.).

7.18 Hot Filament Chemical Vapor Deposition

In another embodiment of the present disclosure, one or more layers of the deposit materials are deposited by hot filament chemical vapor deposition (HFCVD). In HFCVD, reactant gases are flowed over a heated filament to form precursor species that subsequently impinge on the substrate surface, resulting in the deposition of high quality films. HFCVD has been used to grow a wide variety of films, including diamond, boron nitride, aluminum nitride, titanium nitride, boron carbide, as well as amorphous silicon nitride. See, for example, Deshpande et al., 1995, J. Appl. Phys. 77, pp. 6534-6541, which is hereby incorporated by reference herein in its entirety.

7.19 Screen Printing

In another embodiment of the present disclosure, one or more layers of the deposit materials are deposited by a screen printing (also known as silk-screening) process. A paste or ink is pressed onto portions of an underlying structure through openings in the emulsion on a screen. See, for example, Lambrechts and Sansen, *Biosensors: Microelectrochemical Devices*, The Institute of Physics Publishing, Philadelphia, 1992, which is hereby incorporated by reference in its entirety. The paste consists of a mixture of the material of interest, an organic binder, and a solvent. The organic binder determines the flow properties of the paste. The bonding agent provides adhesion of particles to one another and to the substrate. The active particles make the ink a conductor, a resistor, or an insulator. The lithographic pattern in the screen emulsion is transferred onto portions of the underlying structure by forcing the paste through the mask openings with a squeegee. In a first step, paste is put down on the screen. Then the squeegee lowers and pushes the screen onto the substrate, forcing the paste through openings in the screen during its horizontal motion. During the last step, the screen snaps back, the thick film paste that adheres between the screening frame and the substrate shears, and the printed pattern is formed on the substrate. The resolution of the process depends on the openings in the screen and the nature of the paste. With a 325-mesh screen (i.e., 325 wires per inch or 40 µM holes) and a typical paste, a lateral resolution of 100 µM can be obtained.

For difficult-to-print pastes, a shadow mask, such as a thin metal foil with openings, complements the process. However, the resolution of this method is inferior (>500 µM). After printing, the wet films are allowed to settle for a period of time (e.g., fifteen minutes) to flatten the surface while drying. This removes the solvents from the paste. Subsequent firing burns off the organic binder, metallic particles are reduced or oxidized, and glass particles are sintered. Typical temperatures range from 500° C. to 1000° C. After firing, the thickness of the resulting layer ranges from 10 µM to 50 µM. One silk-screening setup is the DEK 4265 (Universal Instrument Corporation, Binghamton, N.Y.). Commercially available inks (pastes) that can be used in the screen printing include conductive (e.g., Au, Pt, Ag/Pd, etc.), resistive (e.g., $RuO_2$, $IrO_2$), overglaze, and dielectric (e.g., $Al_2O_3$, $ZrO_2$). The conductive pastes are based on metal particles, such as Ag, Pd, Au, or Pt, or a mixture of these combined with glass. Resistive pastes are based on $RuO_2$ or $Bi_2Ru_2O_7$ mixed with glass (e.g., 65% PBO, 25% $SiO_2$, 10% $Bi_2O_3$).

The resistivity is determined by the mixing ratio. Overglaze and dielectric pastes are based on glass mixtures. Different melting temperatures can be achieved by adjusting the paste composition. See, for example, Madou, *Fundamentals of Microfabrication*, Second Edition, CRC Press, Boca Raton, Fla., 2002, pp. 154-156, which is hereby incorporated by reference herein in its entirety.

7.20 Electroless Metal Deposition

In another embodiment of the present disclosure, one or more layers of the deposit materials are deposited by electroless metal deposition. In electroless plating a layer is built by chemical means without applying a voltage. Electroless plating baths can be used to form Au, Co—P, Cu, Ni—Co, Ni—P, Pd, or Pt layers. See, for example, Madou, Fundamentals of Microfabrication, Second Edition, CRC Press, Boca Raton, Fla., 2002, pp. 344-345, which is hereby incorporated by reference herein in its entirety

7.21 Electroplating

In another embodiment of the present disclosure, one or more layers of the deposit materials are deposited by electroplating. Electroplating takes place in an electrolytic cell. The reactions that take place in electroplating involve current flow under an imposed bias. In some embodiments, a layer is deposited as part of a damascene process. See, for example, Madou, Fundamentals of Microfabrication, Second Edition, CRC Press, Boca Raton, Fla., 2002, pp. 346-357, which is hereby incorporated herein by reference in its entirety.

8. LITHOGRAPHIC ETCHING METHODS

The following subsections describe lithographic etching techniques that can be used in the fabrication methods described above. One of skill in the art will appreciate that etching or patterning the substrate can be conducted using other methods including, but not limited to, direct write technologies, Block Copolymer techniques and frequency doubling techniques.

8.1 Cleaning and Dehydration Baking

In some embodiments in accordance with the present disclosure, the fabrication methods begin with a cleaning process. Substrate cleaning is an important step in a lithographic process if there is contamination in presence, as the contamination can severally compromise the adhesion of the resist to the substrate. Substrate surfaces have four general types of contamination: particulates, organic residues, inorganic residues, and unwanted oxide layers. Depending on the substrate and the type of contaminants, several cleaning techniques can be used. These methods include dry cleaning, wet cleanings, ultrasonic agitation, polishing with abrasive compounds, supercritical cleaning.

In some embodiments, a wet cleaning is used to remove organic materials from the substrate and prepare for the adhesion of the resist to the substrate. It is carried out by submerging a substrate in a bath or by rinsing the substrate with DI water and/or a solvent rinse. After the wet cleaning, the substrate is dried to remove moistures. Several drying techniques can be used. For example, in some embodiments, the substrate after wet cleaning can be dried using dehydration bake method. In this method, the substrate is baked at a temperature for a period of time such as baked at 80° C. for several minutes. In some embodiments, the substrate may be dried by $N_2$ flow or spinning More detailed information with regard to cleaning and drying of a substrate can be found, for example, in Van Zant, Microchip Fabrication, Forth Edition, McGraw-Hill, New York, 2000, pp. 87-131, which is hereby incorporated by reference herein in its entirety.

8.2 Adhesion Promotion Coating

To further improve the adhesion of the resist to the substrate, an adhesion promoter can be applied to the substrate before the application of the resist. Depending on the substrate and the resist, various adhesion promoters can be used. In some embodiments, Bis(trimethylsilyl)amine (also known as hexamethyldisilazane, or HMDS) or other organic materials are chosen as the adhesion promoter for the fabrication processes described in the present application.

HMDS is an organosilicon compound with the molecular formula $[(CH_3)_3Si]_2NH$. The molecule is a derivative of ammonia with trimethylsilyl groups in place of two hydrogen atoms. This colorless liquid is a reagent and a precursor to bases that are popular in organic synthesis and organometallic chemistry. In photolithography, HMDS is often used as an adhesion promotor for photoresist, and can be applied using any suitable conventional methods. For example, HMDS can be applied by vapor chemical deposition. In general, good adhesions are obtained by applying HMDS from the gas phase on heated substrates.

8.3 Bottom Anti-Reflective Coating

Optionally, a bottom anti-reflective coating (BARC) may be applied to help reduce image distortions associated with light reflections during lithography. In some cases, BARCs are critical and highly desirable. For example, when the substrate or a layer on the substrate is highly reflective, as in metal and polysilicon layers, light reflections can destroy the pattern resolution by three mechanisms: a) off-normal incident light can be reflected back through the resist that is intended to be masked; b) incident light can be reflected off device features and expose "notches" in the resist; and c) thin-film interference effects can lead to linewidth variations when resist thickness changes are caused by substrate or wafer topology or nonflatness.

BARCs can be either organic or inorganic, and can be applied either before or after the photoresist. Conventional methods, such as spinning, sputtering or chemical vapor deposition, can be used to apply the BARCs. By reducing standing waves, thin-film interference, or specular reflections, a BARC helps shrink line widths and improves the pattern resolution. In some cases, a BARC can absorb the radiation and dissipates the energy as heat. Such a BARC is generally suitable to be applied to a substrate before the resist. This BARC lowers reflectance back into the photoresist that has passed through the photoresist.

8.4 Resist Properties

One form of photolithographic processing in accordance with the present disclosure begins with the coating of a resist layer over the layer of material to be patterned. Another form of photolithographic processing in accordance with the present disclosure applys the resist coating after at least one of the steps described in the previous sections, i.e., cleaning and dehydration baking, adhesion promotion coating or BARC. Resists used to form this resist layer are typically comprised of organic polymers applied from a solution. In some embodiments, the thickness of the resist is determined using Bossung Curve analysis. Bossung Curve analysis is one of the most commonly used tools in lithography. It maps a control surface for critical dimensions as a function of the variables of focus and exposure (dose). A detailed discussion of the Bossung Curve analysis can be found in Zavecz, Metrology, Inspection and Process Control edited by C. Archie, Proceeding of SPIE (2006) Vol. 6152-109.

In some embodiments, this resist layer has a thickness in the range of 0.1 µm to 2.0 µm. Furthermore, in some embodiments, the resist layer has a uniformity of plus or minus 0.01 µm. In some embodiments, the resist layer is applied using a spin technique such as a static spin process or a dynamic dispense process. In some embodiments, the resist layer is applied using a manual spinner, a moving-arm resist dispenser, or an automatic spinner. See, for example, Van Zant, Microchip Fabrication, Forth Edition, McGraw-Hill, New York, 2000, pp. 217-222, which is hereby incorporated by reference herein in its entirety.

Negative Resists.

In some embodiments, the resist layer is an optical resist that is designed to react with ultraviolet or laser sources. In some embodiments, the resist layer is a negative resist in which polymers in the resist form a cross-linked material that is etch resistant upon exposure to light. Examples of negative resists that can be used to make the resist layer include, but are not limited to, azidelisoprene negative resists, polymethylmethacrylate (PMMA), polymethylisopropyl ketone (PMIPK), poly-butene-1-sulfone (PBS), poly-(trifluoroethyl chloroacrylate) TFECA, copolymer-(V-cyano ethyl acrylate-V-amido ethyl acrylate) (COP), poly-(2-methyl pentene-1-sulfone) (PMPS) and the like.

Positive Resists.

In other embodiments, the resist layer (e.g., positive resist layer of FIG. 2A) is a positive resist. The positive resist is relatively insoluble. After exposure to the proper light energy, the resist converts to a more soluble state. This reaction is called photosobulization. One positive photoresist in accordance with the present disclosure is the phenol-formaldehyde polymer, also called phenol-formaldehyde novolak resin. See, for example, DeForest, Photoresist: Materials and Processes, McGraw-Hill, New York, 1975, which is hereby incorporated by reference herein in its entirety. In some embodiments, the resist layer is LOR OSA, LOR 5 0.7A, LOR 1A, LOR 3A, or LOR 5A (MICRO-CHEM, Newton, Mass.). LOR lift-off resists use polydimethylglutarimide.

8.5 Soft Baking

After the resist layer has been applied, the density is often insufficient to support later processing. And some solvent may inhibit the exposure curve. Accordingly, in some embodiments of the present disclosure, a bake is used to densify the resist layer and drive off residual solvent or excess carrier solvent from the resist layer. After the bake, the resist becomes less tacky and the thickness of the resist layer is reduced slightly. This bake is referred to as a softbake, prebake, or post-apply bake. Several methods of baking the resist layer are contemplated by the present disclosure including, but not limited to, convection ovens, infrared ovens, microwave ovens, or hot plates. See, e.g, Levinson, Principles of Lithography, SPIE Press, Bellingham, Wash., 2001, pp. 68-70, which is hereby incorporated by reference herein in its entirety.

8.6 Alignment and Exposure of the Mask

After the spacer has been coated with a resist layer, the next step is alignment and exposure of the resist layer. Alignment and exposure is, as the name implies, a two-purpose photomasking step. The first part of the alignment and exposure step is the positioning or alignment of the required image on the material surface. The image is found on a mask. The second part is the encoding of the image in the resist layer from an exposing light or radiation source. In the present disclosure, any conventional alignment system can be used to align the mask with the resist layer, including but not limited to, contact aligners, proximity aligners, scanning projection aligners, steppers, step and scan aligners, x-ray aligners, and electron beam aligners. For a review of aligners that can be used in the present disclosure, see, e.g., Solid State Technology, April 1993, p. 26; and Van Zant, Microchip Fabrication, Fourth Edition, McGraw-Hill, New York, 2000, pp. 232-241, each of which in incorporated herein by reference in its entirety. Masks can be negative or positive.

A positive mask (not shown) used to develop a positive resist would have the opposite pattern of a negative mask. Both negative masks and positive masks used in the methods of the present disclosure are fabricated with techniques similar to those used in wafer processing. A photomask blank, consisting of an opaque film (usually chromium) deposited on glass substrates, is covered with resist. The resist is exposed according to the desired pattern, is then developed, and the exposed opaque material etched. Mask patterning is accomplished primarily by means of beam writers, which are tools that expose mask blanks according to suitably formatted biosensor electrode patterns. In some embodiments, electron or optical beam writers are used to pattern negative masks or positive masks. See, e.g., Levison, Principles of Lithography, SPIE Press, Bellingham, Wash., 200 1, pp. 229-256, which is hereby incorporated by reference herein in its entirety.

Exposing the resist to light breaks or forms chemical bonds in the resist layer. The final image matches the desired pattern from the mask or interference pattern. In various embodiments, attention is focused on providing uniformity of the light intensity and/or controlling the exposure rate.

In one embodiment of the present disclosure, the tool used to project the pattern of a mask onto a device is a wafer stepper. Wafer steppers exist in two configurations, step-and-repeat and step-and-scan. In a step-and-repeat system, the entire area of the mask to be exposed is illuminated when a shutter is opened. In a step- and scan system, only part of the mask, and therefore only part of the exposure field on the device unit, is exposed when a shutter is opened. The entire field is exposed by scanning mask and the device being patterned synchronously. See, e.g., Levison, Principles of Lithography, SP1E Press, Bellingham, Wash., 200 1, pp. 1 33-174, which is hereby incorporated by reference herein in its entirety.

8.7 Post Expose Bake

Before developing the resist, a post exposure bake (PEB) is optionally performed after exposure. In some cases where high resolutions are not required, the PEB is not necessary. However, for certain resists or for high resolutions, a PEB is inevitable for the crosslinking induced by the exposure.

PEB can be applied above the softening point of the resist without destroying the structures to be developed. For example, a PEB can be performed at 110° C., for 1-2 min on a hotplate. A PEB performed near the softening point of the photo resist can reduce mechanical stress formed during softbake and exposure. A PEB can also promote the thermally activated diffusion of carboxylic acid formed during exposure from the photo active compound. This diffusion step smoothes the spatial periodic pattern of carboxylic acid, which in turn will help to improve the image or pattern resolution.

8.8 Development

After exposure through a mask, the pattern is coded as a latent image in resist as regions of exposed and unexposed resist. The pattern is developed in the resist by chemical dissolution of the unpolymerized resist regions. A number of development techniques can be used to develop the resist. Development techniques are designed to leave in the resist layer an exact copy of the pattern that was on the mask or reticle. The successful development of the image coded in resist is dependent on the nature of the resist's exposure mechanisms.

Negative resist, upon exposure to light, goes through a process of polymerization which renders the resist resistant to dissolution in the developer chemical. The dissolving rate between the two regions is high enough so that little of the layer is lost from the polymerized regions. The chemical preferred for many negative-resist-developing situations is xylene or Stoddart solvent. The development step is done with a chemical developer followed by a rinse. For negative resists, the rinse chemical is n-butyl acetate in some embodiments.

Positive resists present a different developing condition. The two regions, polymerized and unpolymerized, have a different dissolving rate. This means that during the developing step some resist is always lost from the polymerized region. Use of developers that are too aggressive or that have overly long developing times result in an unacceptable thinning of the resist. Two types of chemical developers used with positive resists in accordance with the present disclosure are alkaline-water solutions and nonionic solutions. The alkaline-water solutions can be sodium hydroxide or potassium hydroxide. Typical nonionic solutions include, but are not limited to, tetramethylamrnonimum hydroxide (TMAH). The rinse chemical for positive-resist developers is water. A rinse is used for both positive and negative resists. This rinse is used to rapidly dilute the developer chemical to stop the developing action.

There are several methods in which a developer is applied to resist in order to develop the latent image. Such methods include, but are not limited to, immersion, spray development, and puddle development. In some embodiments of the present disclosure, wet development methods are not used. Rather, a dry (or plasma) development is used. In such dry processes, a plasma etcher uses energized ions to chemically dissolve away either exposed or unexposed portions of the resist layer without first developing the resist layer using wet chemical techniques.

In some embodiments, in particular when an organic compound is used as the photoresist, the chemical reaction in the resist layer needs to be controlled to ensure the image fidelity. This can be achieved by controlling the exposure time, the development time, or other processing parameters. Image fidelity herein refers to the ability of a lithographic process to render an image accurately, without any visible distortion or information loss.

8.9 Hard Baking

In some embodiments of the present disclosure, resist is hard baked after it has been developed. The purpose of the hard bake is to achieve good adhesion of the resist layer to the underlying layer to be patterned. In some embodiments, a hard bake is accomplished using a convection oven, in-line or manual hot plates, infrared tunneling ovens, moving-belt convection ovens, vacuum ovens and the like. General baking temperature and baking times are provided by the resist manufacture. Therefore, specific baking temperatures and times is application dependent. Usually the hard baking temperature is the hottest or highest temperature among all of the processes. Nominal hard bake temperatures are from 130° C. to 200° C. for thirty minutes in a convection oven. The hard baking sets the resist and enhances mechanical stability of the resist for the subsequent etch or implant process. At this point, the image fidelity is usually measured and fed back to the preceding lithographic steps.

8.10 Etching

After development, an etching step is used for patterning. A number of etching methods are available. Etching can be divided into dry and wet etching. The following disclosure provides examples of such etching. It will be understood by one of skill in the art that the disclosed etching methods can be used independently of the preceding lithographic steps in accordance with some embodiments. It will be further understood by one of skill in the art that the disclosed etching methods can be used with the preceding lithographic steps in accordance with some embodiments. Wet etching is the use of acidic or basic solutions to solvate away a specific reacted species. Examples are silicon dioxide being etched in hydrofluoric acid, or $Si_3N_4$ in hot phosphoric acid, or mono-crystalline silicon in potassium hydroxide (KOH)). Photoresist materials are removed by acid or base materials (depending on polarity and resist chemistry).

The following list is a generic categorization of the classifications of etch methods. Each etch method has specialized equipment for optimization of the process. Complexity has evolved to the point where some of the terms and techniques are interchangeable. For example, there are terms depending on the vendor, for inductive coupled plasma (ICP) etch or transformer coupled plasma (TCP), each which improves an ion etcher Wet Etching.

In wet etching, etchant is introduced either as a liquid bath with submersion or a surface spray/mist. Material is removed as a function of solvation of the etch intermediate or byproduct. A limitation of wet etching is the wetting function of the chemical. Some etchants are two step reactions such as oxidation of a material then solvation of the oxide.

Wet etches can also be used in combination with the dry etches as a preparatory step for surface cleaning or contaminate removal. An example is organic material removal prior to a reactive ion etch. Wet etches are typically isotropic or follow crystal lattices.

In one embodiment of the present disclosure, the structure to be patterned is immersed in a tank of an etchant for a specific time. Then the structure is transferred to a rinse station for acid removal, and transferred to a station for final rinse and a spin dry step.

Wet spray etching or vapor etching. In some embodiments of the present disclosure, wet spray etching or vapor etching is used for patterning. Wet spray etching offers several advantages over immersion etching including the added definition gained from the mechanical pressure of the spray. In vapor etching, the wafer is exposed to etchant vapors such as hydrofloric acid vapors.

Dry Etching—Reactive-Ion Etching.

Dry etching encompasses other methods outside the wet etch environment. Basic mechanics includes excitation of a chemical to an ionic state and then reaction with the substrate and films. Material is removed either by physical/mechanical methods or chemical conversion and solvation into the gas stream.

Sputter (physical/mechanical). In sputter approaches, ions or elements are accelerated to a high energy and directed toward a surface. Surfaces are removed due to the collisions of these highly charged ions, much like a nanoscale sandblasting method. Sputter etching is facilitated by charging the ion and then establishing a high bias towards to the substrate. Removal is line of sight from the target in the direction of the bias. Sputter etching is a method to achieve anisotropic etch profiles. Sputtering can also be accomplished by directional ion bombardment by 'ion guns'. Examples include focused ion beam (FIB) or other direct write approaches.

Chemical (solvation—liquid or gas). Chemical enhanced etching exploits generation of intermediate species that can be solvated in the solution or vaporized in the low pressure chamber. Chemical etching is tuned to generate the solvated states due to the chemicals included in the reaction mixture. For example, chlorine is used for most metals. A fluorine based chemical such as carbontetrafluoride ($CF_4$) or sulfurfluoride ($SF_6$) is used for etching silicon or silicon oxide. Oxide etches with $CF_4$ or $SF_6$ follows the same reaction mechanism as the wet etch with HF acid.

Chemical etch is more isotropic in nature than the corresponding sputtering systems. A technique of alternating and combining the two methods can sculpt complex side wall profiles. The present disclose encompasses the use of such methods to generate the specific nodes for functionality. An example is the 'wine glass' structure disclosed FIG. 7 of related application No. 61/802,006, filed Mar. 15, 2013, which is hereby incorporated by reference herein for its disclosure of such structures.

Ion beam etching. Another type of etcher that is used to perform etching in accordance with various aspects of the present disclosure is ion beam etching. Unlike chemical plasma systems, ion beam etching is a physical process. The structure to be etched is placed on a holder in a vacuum chamber and a stream of argon is introduced into the chamber. Upon entering the chamber, the argon is subjected to a stream of high-energy electrons from a set of cathode (−)-anode (+) electrodes. The electrons ionize the argon atoms to a high-energy state with a positive charge. The wafers are held on a negatively grounded holder that attracts the ionized argon atoms. As the argon atoms travel to the wafer holder they accelerate, picking up energy. At the wafer surface, they crash into the exposed wafer layer and blast small amounts from the wafer surface. No chemical reaction takes place between the argon atoms and the wafer material. The material removal (etching) is highly directional (anisotropic), resulting in good definition in small openings.

Plasma etching. Plasma generation is a method for ionization in the dry etch process. Plasmas can be tuned and controlled for the different gases used. Plasma can be struck with one gas and maintained by another. Relative location of the plasma can increase etch rate or impact resultant damage. Some systems apply remote plasma generation sources while others control the confinement and immersion in the plasma. Generally there is a dilution or carrier gas that maintains the plasma and then a small volume of reactive gas is introduced. Vacuum levels define the type of plasma etching and complexity for control. Power of the generator is a control factor as well as the frequency.

In some embodiments, plasma etching is performed using a plasma etcher. Physically, a plasma etcher comprises a chamber, vacuum system, gas supply, and a power supply. The structure to be etched is loaded into the chamber and the pressure inside is reduced by the vacuum system. After the vacuum is established, the chamber is filled with the reactive gas. For the etching of silicon dioxide, for example, the gas is usually $CF_4$ that is mixed with oxygen. A power supply creates a radio frequency (RF) field through electrodes in the chamber. The field energizes the gas mixture to a plasma state. In the energized state, the fluorine attacks the silicon dioxide, converting it into volatile components that are removed from the system by the vacuum system.

Any of a wide variety of plasma etchers is used to perform etching, in accordance with various embodiments of the present disclosure. Such etchers include, but are not limited to, barrel etchers, plasma planar systems, electron cyclotron resonance sources, high density reflected electron sources, helicon wave sources, inductively coupled plasma sources, and transformer coupled plasma sources. In some embodiments, a reactive ion etcher system combines plasma etching and ion beam etching principles. The systems are similar in construction to the plasma systems but have a capability of ion milling. The combination brings the benefits of chemical plasma etching along with the benefits of directional ion milling. See, e.g., Van Zant, Microchip Fabrication, Fourth Edition, McGraw-Hill, New York, 2000, pp. 256-270, which is hereby incorporated herein by reference for more information on etching techniques and etching equipment that can be used in accordance with the present disclosure.

8.11 Characteristics of an Etch Process

The etch process generates an artifact or signature of the processing employed. Knowledge of how to apply etching methods determines the final profile of the structure. Definitions for the following terms are provided in order to convey an understanding of etch processing characteristics.

Isotropic etching. Isotropic implies equal etching in all directions. The two references are vertical and horizontal directions. An isotropic etch 'undercuts' the mask at a ratio to the vertical depth etched. Impact is that a circular opening of 1 micron when etched to a 0.5 micron depth would have a bowl like shape that is 2 microns at the top of the bowl, 1 micron at the bottom, with rounded side walls. An important consideration here is that if a conformal film were deposited over a topography/structure, an isotropic etch would remove the horizontal material as well as the side wall/vertical material. There is no shadowing or off line of sight protection from an isotropic etch (excluding rate limiting or aspect ratio physical diffusivity barriers). This characteristic is used in cleans and sacrificial film removals. One trick is to use isotopic etching to consume the side walls, thereby reducing the critical dimension.

Anisotropic etching. Anisotropic etching is preferential etching in one direction over the other. Hence the term anisotropic: not isotropic. Ability to produce anisotropic etch chemistries allows for denser packing of devices. Anisotropy is limited by the bias and directionality of the tool utilized. The mask image is transferred into the substrate with fidelity: a 1 micron circular opening etched to 0.5 micron depth is 1 micron by 0.5 micron feature in the substrate.

An application for the disclosed technology is considering the etching of a conformal coating. If the deposited film is 0.25 microns over a 0.8 micron step, an anisotropic etch removes the 0.25 microns on the surface (horizontal surface) but leaves the side wall (vertical surface) material. Thereby an anisotropic etch results in a new structure of the deposited material where an isotropic etch would remove all material. Limitations on anisotropic etches are physical limitations that inhibit reactive species reaching the bottom surface of the etch location. These topics are defined in 'aspect ratio', 'poisoning', 'etch stops' and other terms below.

Etching Definitions and Examples

Etch rate—A function of the process recipe which quantifies how fast a material is removed. Units are expressed in removed thickness per time, e.g. Angstroms per second. Etch rate includes lateral calculation as well as the vertical component. Etch rate can be reduced by addition of diluents or carrier gases that do no enhance the etch reaction. Etch rate is modified to compensate for reaction chamber design where the etch rate in the center may be higher than on the outer edge. Etch rate is sacrificed for uniformity and repeatability. High etch rates are desirable for manufacturability. However, etch rate is only one part of the grand compromise for a final etch process.

Selectivity—A comparative etch rate ratio of the desired material to be etched and the protective mask material (ratio of material etch rate over mask etch rate). A high selectivity is desired to maintain transfer of the lithography into the substrate. If the selectivity is low the differentiation between starting structure and final structure is compromised due to loss of mask. Etch chemistries are adjusted to achieve the highest selectivity possible without compromising process time for the material etch rate. High selectivity with an Angstrom per hour etch rate is not practical in typical embodiments.

Side wall slope—A desired etch profile could be a perfect transfer of the mask image into the substrate material with vertical sidewalls. The most common etch artifact is an oblique angle slope where the top is wider than the bottom. This can be caused from various etch conditions. A primary mechanism for this is that the etch reaction is hindered by diffusivity of the etchant, by-product interference, loss of ionization states, or competitive nonproductive reactions. In the instant disclosure, both vertical side wall, oblique and re-entry angled structures are contemplated through the disclosed etching techniques.

Re-entrant side wall—The opposite of the oblique angle side wall is the re-entrant side wall angle. Here the bottom is wider than the top masked surface. This profile can be obtained by segmented etching with increasingly isotropic etch recipes. The isotropic undercuts by the lateral etch nature. The resultant structure resembles the dove tail joint in wood working Another method for reentrant side walls is the enhancement of the etch rate in the trench as a function of dopant materials.

Inhibitor sidewall protection due to byproduct re-deposition. Another control method for side wall profile is due to the nature of the etchant reaction. The etch reaction may generate a by-product that is not highly volatile. These compounds redeposit on the side wall during the reaction. In an isotropic etch it stops the lateral etch at the top but does not hinder at the bottom area. Re-deposition is viewed as both a positive and negative aspect of the process. Such re-deposition is advantageously used in the present disclosure.

Erosion. A method to increase the oblique slope of a side wall during an etch process is to erode the masking material at the edges. This is usually a function of heating the mask material during the etch process. This has the impact that the edge acuity of the resist is lost, resulting in the feature size being gradually reduced with etch time. Resist erosion reduces the critical dimension at the top of the feature. Examples of extreme erosion would produce teepee or pyramid like structures Etch stop. An etch stop material is a material that has a very low etch rate that is built as a sandwich structure in a device. As the target material is etched the structure is defined. However when the etchant hits the etch stop material the maximum depth is reached. This is a method to control the depth of an etch material with high precision. Deposition sandwich can be controlled uniformly across the substrate regardless of the etch reactor design or non uniformity. A second artifact is that the amount of over etch time can be extended and only the lateral etch will continue. Lateral etch results in re-entrant slopes or critical dimension reduction.

Self limiting or poisoning. An etch recipe can be designed in which there is a limitation of the etchant material. Then due to physical constraint such as aspect ratio, dilution, power or bias, the effective etch is restricted. Evidence of this artifact is in deep trench, 10 to 15 microns, where there is tapering and closure. Regardless of the additional time provided the etch depth does not progress. Poisoning of the reaction has the same results but can be observed by additions to the gas stream that inhibits conversion to the desired species, or a competitive reaction that consumes the reactive species in a nonproductive reaction.

Crystalline specific (lattice orientation). For mono crystalline or highly ordered lattice structures, etchants can be used to highlight and accentuate the lattice structure. For example, iodine based wet etches are used for defect analysis due to different etch rates on the crystal lattice. In some embodiments, crystalline specific etches for special substrate enhancements and for specific devices are used. In some embodiments, metallic etches can improve the surface area for the graphene growth. Moreover, nucleation approaches make use of faceting etch for graphene growth.

Secondary Etch Functions and Utilization

The following provides additional uses for the disclosed etching processes that are used in accordance with some embodiments of the present disclosure.

Cleaning. Etch removal of contaminates accumulated during previous processing steps can be performed. Examples of a standard etch clean process such as the RCA Clean is 1) application of distilled water, 2) application of buffered ammonium hydroxide, 3) application of dilute HF for ancient oxide, and 4) application of HCl for metallic clean. Clean procedures can also be plasma based prior to a deposition process. A clean process is removing the unwanted films prior to the following step. Cleans can be before etch steps (remove inhibitors), deposition and lithography.

Polish. A light etch step to change the profile slightly or remove unwanted residuals. For segmented film deposition a slight polish removes undesired side wall material and fine tunes by reduction of material the final film thickness.

Structure definition. Previous discussion highlighted the side wall slope as nominal/vertical, oblique, or reentrant angled. Functional nodes can be sculpted in the profile by tuning the etch process. A simple example is the wine glass structure which was designed for metal flow into contact views. As the structures became more complex such as for plasmonics, nodes are defined by crevices or protrusion. Full structures such as a rib or ribbon can be generated by an anisotropic etch of a conformally deposited film. These concepts are captured in our portfolio as related to side walls, segmented film deposition, or fine structure lithography to name a few.

Deep trench and isolation of structures. State of the art technologies have advanced to do deep trench etches with aspect ratios of 20:1 to greater. One of the benefits of trench formation is the ability to isolate structures on the same substrate. The isolation can be by air or a back fill material (dielectric or oxides. The etch process defines the isolation and the resultant critical dimension of the rib or pillar. Polarity is important because the device functionality can be buried in the bottom of the trench and the wall portions can act as thermal radiators, wave guides, or particulate traps.

Aspect ratios. Aspect ratio is defined by the height of the structure over the width. In the etch process this impacts the diffusivity of the etchant in a narrow trench (10:1) which will slow the etchant reaction. A secondary concern is the physical stability of a tall feature on a narrow base. Such features are impacted by the microfluidic forces of subsequent processing resulting in toppling or cleavage of the structure.

Side wall deposition. Depending on the application and process engineering this can be a benefit or a detriment. The majority of re-deposition material during an etch process is difficult to remove with later steps (especially metal halides) which is a detriment. The rate of re-deposition can impact the profile of the structure. A benefit of re-deposition is an organic re-deposition or interaction with the photo resist that maintains the resist mask and image fidelity. This re-deposition is a corrective action for undesired resist erosion. Another example of re-deposition being beneficial is when the byproduct material can be formed for a device functionality or structure.

Etch passivation. Slight differentiation, or subset of side wall re-deposition. During an etch step and oxidizing ambient may be used as the etchant chemistry. If there are other layers exposed such as metals (aluminum) a thin oxide will be formed which passivates the secondary surface. Other etch byproducts passivates other materials.

Tool Types

The present disclosure encompasses the use of a wide variety of etch tool configurations. Manufactures of such tools include, but are not limited to, Applied materials, Lam Research, Tegal, Hitachi, Oxford, Plasma Therm, and Branson to name a few. Each company has improvements or enhancements over the competitors. The following list highlights some of the designs and types of reactors on the market: barrel etchers, parallel plate, downstream etchers, ICP, TCP, sinks, spray dispense, oxidation, EBEAM oxidation, and direct write systems. For wet etch (wet sinks) there are numbers of designs for recirculation, purity, automation of multiple baths and inclusion of spin rinse dryers. Note also in the literature some tools are refined to the substrate or material designed to be etched: metal etchers, oxide etchers, etc.

8.12 Residual Layer Removal

The result of the etching process described above is the formation of grooves. Next, the residual layer is removed in a process known as resist stripping in order to yield the patterned structure. In some embodiments, the resist is stripped off with a strong acid such as $H_2SO_4$ or an acid oxidant combination, such as $H_2SO_4$—$Cr_2O_3$, attacking the resist but not the groove to yield the fully patterned structure. Other liquid strippers include organic solvent strippers (e.g., phenolic organic strippers and solventlamine strippers) and alkaline strippers (with or without oxidants). In some embodiments of the present disclosure, a dry plasma process is applied to remove a resist. In such embodiments, the device is placed in a chamber and oxygen is introduced. The plasma field energizes the oxygen to a high energy state, which, in turn, oxidizes the resist components to gases that are removed from the chamber by the vacuum pump. In dry strippers, the plasma is generated by microwave, radio frequency, or ultraviolet-ozone sources. More information on photolithographic processes that can be used to pattern devices is found in Madou, Fundamentals of Microfabrication, Second Edition, CRC Press, Boca Raton, Fla., 2002, pp. 2-65; Van Zant, Microchip Fabrication, Fourth Edition, McGraw-Hill, New York, 2000, Wolf and Tauber, Silicon Processing for the VLSI Era, Second Edition, Lattice Press, Sunset Beach, Calif., 2002; and SZE and Ng, Physics of Semiconductor Devices, Third Edition, Wiley-Interscience, 2007, each of which are hereby incorporated by reference herein in their entireties. Such methods include the use of a positive photoresist rather than a negative photoresist as well as extreme ultraviolet lithography, x-ray lithography, charged-particle-beam lithography, scanning probe lithography, soft lithography, and three-dimensional lithographic methods.

9. REFERENCES CITED

All references cited herein are incorporated herein by reference in their entirety and for all purposes to the same extent as if each individual publication or patent or patent application was specifically and individually indicated to be incorporated by reference in its entirety for all purposes.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

What is claimed is:

1. A method of forming a graphite-based structure on a patterned substrate, the patterned substrate comprising a plurality of initial elements and a plurality of initial trenches, wherein each respective initial element in the plurality of initial elements is separated from an adjacent initial element in the plurality of initial elements by a corresponding initial trench in the plurality of initial trenches, the method comprising:

(A) conformally depositing a first material on the patterned substrate, thereby producing a first thin film overlaying the patterned substrate, wherein the first thin film is characterized by a first thickness that does not exceed (a) a minimum initial element width of the plurality of initial elements, or (b) a minimum initial trench width of the plurality of initial trenches;

(B) anisotropically etching the substrate to remove other portions of the first thin film while retaining portions of the first thin film overlaid on side walls of the plurality of initial elements, thereby producing a plurality of processed elements, wherein
  (i) each respective processed element in the plurality of processed elements is characterized by a retained portion of the first thin film on a side wall of a corresponding initial element in the plurality of initial elements, and
  (ii) the plurality of processed elements has a reduced width that corresponds to the first thickness and does not exceed (a) the minimum initial element width or (b) the minimum initial trench width; and (C) concurrently generating a first plurality of graphene layers, wherein each respective graphene layer in the first plurality of graphene layers is generated on a top surface of a corresponding processed element in the plurality of processed elements, thereby producing said refined graphite-based structure with isolated graphene layers having the reduced width.

2. The method of claim 1, further comprising:

(D) removing the plurality of initial elements by selectively etching the patterned substrate, thereby producing a refined pattern on the patterned substrate that comprises the plurality of processed elements and a plurality of processed trenches, wherein
  (i) a trench in the plurality of processed trenches is a void space produced by (a) the removal of an initial element in the plurality of initial elements or (b) the anisotropically etching of the substrate to remove other portions of the first thin film, and (ii) each respective processed element in the plurality of processed elements is separated from an adjacent processed element in the plurality of processed elements by a corresponding processed trench in the plurality of processed trenches; and (E) repeating steps (A) and (B) on the patterned substrate having the refined pattern, wherein both steps (D) and (E) are conducted prior to the concurrently generating the first plurality of graphene layers (C).

3. The method of claim 2, wherein the repeating steps (A) and (B) on the patterned substrate produces a plurality of pitches, wherein each pitch in the plurality of pitches does not exceed an initial pitch of the initial patterned substrate, wherein each pitch in the plurality of pitches is defined by a distance between the centers of neighboring processed elements in the plurality of processed elements.

4. The method of claim 3, wherein a first pitch and a second pitch in the plurality of pitches differ from each other.

5. The method of claim 3, wherein at least a first pitch, a second pitch, and a third pitch in the plurality of pitches differ from each other.

6. The method of claim 1, wherein the plurality of processed elements is defined by retained portions of the first thin film on first and second side walls of each initial element in the plurality of initial elements, wherein (i) retained portions of the first thin film on the first and second side walls of a first initial element in the plurality of initial elements defines first and second processed elements in the plurality of processed elements, respectively, and (ii) retained portions of the first thin film on the first and second side walls of a second initial element in the plurality of initial elements defines third and fourth processed elements in the plurality of processed elements.

7. The method of claim 1, wherein the first thin film comprises a foundation material.

8. The method of claim 7, wherein the foundation material comprises a catalytic metal or a non-metal material.

9. The method of claim 7, wherein the foundation material is Si, SiC, doped Si, or doped SiC.

10. The method of claim 1, wherein the concurrently generating the first plurality of graphene layers (C) comprises an epitaxial growth, a chemical vapor deposition (CVD) growth, or a combination thereof.

11. The method of claim 10, wherein the atomic layer deposition is repeated in order to collectively deposit the first material at the first thickness.

12. The method of claim 1, wherein the conformally depositing (A) is performed using atomic layer deposition.

13. The method of claim 1, wherein the reduced width is between 2 nm and 100 nm.

14. The method of claim 1, wherein a graphene layer in the first plurality of graphene layers consists of between 1 and 500 graphene sheets.

15. The method of claim 1, wherein a processed element in the plurality of processed elements has a substantially same height as a corresponding initial element in the plurality of initial elements.

16. The method of claim 1, wherein a processed element in the plurality of processed elements has a different height than a corresponding initial element in the plurality of initial elements.

17. The method of claim 1, wherein a processed element in the plurality of processed elements is taller than a corresponding initial element in the plurality of initial elements by between 2 nm and 300 nm.

18. The method of claim 1, wherein a processed element in the plurality of processed elements is taller than a corresponding initial element in the plurality of initial elements by between 2 nm and 100 nm.

19. The method of claim 1, wherein a processed element in the plurality of processed elements is taller than a corresponding initial element in the plurality of initial elements by between 100 nm and 300 nm.

20. The method of claim 1, wherein a processed element in the plurality of processed elements has a height that is between 25 nm and 1000 nm.

21. The method of claim 1, wherein a processed element in the plurality of processed elements has a height that is between 1 μm and 5 μm.

22. The method of claim 1, wherein a processed element in the plurality of processed elements has a height that is between 5 μm and 10 μm.

23. The method of claim 1, wherein the plurality of initial elements comprises a foundation material, the method further comprising:

generating a second plurality of graphene layers on the plurality of initial elements, concurrently or sequentially with the generating the first plurality of graphene layers on the plurality of processed elements, thereby producing said graphite-based structure with isolated graphene layers having initial element widths and the reduced width.

24. A method of forming a graphite-based structure on a patterned substrate, the patterned substrate comprising a plurality of initial elements and a plurality of initial trenches, wherein each respective initial element in the plurality of initial elements is separated from an adjacent initial element in the plurality of initial elements by a corresponding initial trench in the plurality of initial trenches, the method comprising:

(A) conformally depositing a first material on the patterned substrate, thereby producing a first thin film overlaying the patterned substrate, wherein the first thin film is characterized by a first thickness that does not exceed (a) a minimum initial element width or (b) a minimum initial trench width;

(B) anisotropically etching the substrate to remove other portions of the first thin film while retaining portions of the first thin film overlaid on side walls of the plurality of initial elements, thereby producing a plurality of processed elements and exposing a portion of each initial trench in the plurality of initial trenches to the substrate, wherein (i) each respective processed element in the plurality of processed elements is defined by a retained portion of the first thin film on a side wall of a corresponding initial element in the plurality of initial elements, and (ii) each processed element in the plurality of processed elements has a reduced width that corresponds to the first thickness and does not exceed (a) the minimum initial element width or (b) the minimum initial trench width;

(C) backfilling, subsequent to the anisotropically etching of the substrate (B), the exposed portion of each initial trench in the plurality of initial trenches;

(D) removing the plurality of processed elements by selectively etching the substrate, thereby exposing portions of the substrate that were underneath the plurality of processed elements, wherein each of the exposed portions of the substrate that was underneath a corresponding processed element in the plurality of processed elements is characterized by the reduced width; and
(F) concurrently generating a plurality of graphene layers, wherein each respective graphene layer in the plurality of graphene layers is generated on a corresponding exposed portion of the substrate that was underneath a processed element in the plurality of processed elements, thereby producing said graphite-based structure with isolated graphene layers having the reduced width.

25. The method of claim 24, further comprising conducting a planarization process subsequent to the backfilling that planarizes a backfill in the plurality of trenches, relative to the plurality of processed elements.

26. The method of claim 24, wherein the exposed portion of the substrate that was underneath a processed element comprises a foundation material.

27. The method of claim 24, the method further comprising depositing a foundation material on the exposed portions of the substrate after the anisotropically etching (B) and before the generating the plurality of graphene layers (F).

28. The method of claim 24, further comprising:
(G) removing the plurality of initial elements by selectively etching the substrate, thereby producing a refined pattern on the patterned substrate that comprises the plurality of processed elements and a plurality of processed trenches, wherein
   (i) a trench in the plurality of processed trenches is a void space produced by step (G) or step (B), and
   (ii) each respective processed element in the plurality of processed elements is separated from an adjacent processed element in the plurality of processed elements by a corresponding processed trench in the plurality of processed trenches; and
(H) repeating steps (A) and (B) on the patterned substrate having the refined pattern,
wherein both steps (G) and (H) are conducted prior to the backfilling.

29. A method of forming a graphite-based structure on a patterned substrate, the patterned substrate comprising a plurality of initial elements and a plurality of initial trenches, wherein each respective initial element in the plurality of initial elements is separated from an adjacent initial element in the plurality of initial elements by a corresponding initial trench in the plurality of initial trenches, the method comprising:
(A) conformally depositing a plurality of thin films on the patterned substrate, wherein the depositing is conducted sequentially thereby sequentially depositing respective thin films of the plurality of thin films, wherein
   (i) each thin film in the plurality of thin films has a thickness that does not exceed a minimum initial element width of the plurality of initial elements,
   (ii) a sum of the thicknesses of each thin film in the plurality of thin films does not exceed a minimum initial trench width of the plurality of initial trenches, and
   (iii) each thin film in the plurality of thin films comprises a material that is different than an adjacent thin film in the plurality of thin films;
(B) anisotropically etching the substrate to remove portions of the plurality of thin films overlaid on the tops of initial elements in the plurality of initial elements while retaining portions of the plurality of thin films overlaid on side walls of the plurality of initial elements, thereby producing a plurality of processed element sets, wherein
   (i) each respective set in the plurality of processed element sets comprises a plurality of processed elements that are defined by retaining portions of a corresponding thin film in the plurality of thin films, and
   (ii) the plurality of processed elements in each respective processed element set has a respective reduced width that corresponds to the thickness of a corresponding thin film and does not exceed (a) the minimum initial element width or (b) the minimum initial trench width; and
(C) generating one or more pluralities of graphene layers on one or more selected processed element sets in the plurality of processed element sets, wherein each respective graphene layer in the one or more pluralities of graphene layers is generated on a top surface of a corresponding processed element in the one or more selected processed element sets, thereby producing said refined graphite-based structure with isolated graphene layers having one or more reduced widths.

30. The method of claim 29, wherein a processed element in one processed element set has a top surface at an elevation different than an elevation of a corresponding top surface of a processed element in another processed element set in the plurality of processed element sets.

31. The method of claim 29, wherein a processed element in one processed element set in the plurality of processed element sets has a top surface at a same elevation as a top surface of a processed element in another processed element set in the plurality of processed element sets.

32. The method of claim 29, wherein the conformally depositing comprises successively depositing a first thin film comprising a foundation material and a second thin film comprising a non-foundation material.

33. The method of claim 32, wherein the non-foundation material is glass, silicon dioxide, neoceram, or sapphire.

34. The method of claim 32, wherein the foundation material is Pt, Au, Fe, Rh, Ti, Ir, Ru, Ni, or Cu.

35. The method of claim 29, wherein the plurality of the initial elements comprises a non-foundation material, wherein
(a) the plurality of thin films comprises a first thin film, a second thin film and a third thin film, wherein
   (i) the first thin film is overlaid on the patterned substrate, has a first thickness, and comprises a first foundation material,
   (ii) the second thin film is overlaid on the first thin film, has a second thickness and comprises a non-foundation material, and
   (iii) the third thin film is overlaid on the second thin film, has a third thickness and comprises a second foundation material;
(b) the plurality of processed element sets comprises a first processed element set, a second processed element set and a third processed element set, wherein
   (i) the first processed element set comprises a plurality of processed elements that are defined by retaining portions of the first thin film in the plurality of thin films and have a first reduced width that corresponds to the first thickness,
   (ii) the second processed element set comprises a plurality of processed elements that are defined by retaining portions of the second thin film in the plurality of thin films and have a second reduced width that corresponds to the second thickness, (iii) the third processed element set comprises a plurality of processed elements that are defined by retaining portions of the third thin film in the plurality of thin films and have a third reduced width that corresponds to the third thickness, and (iv) a respective processed element in the first processed element set is separated from an adjacent processed element in the third processed element set by a corresponding processed element in the second processed element set; and (c) the generating (C) produces the one or more pluralities of graphene layers comprising first and second pluralities of graphene layers, thereby producing said refined graphite-based structure with isolated graphene layers having the first and third reduced width, wherein (i) each respective graphene layer in the first plurality of graphene layers is generated on a top surface of a corresponding processed element in the first set, and (ii) each respective graphene layer in the second plurality of graphene layers is generated on a top surface of a corresponding processed element in the third set.

36. The method of claim 35, wherein the first processed element set or the third processed element set has a substantially same height as the plurality of initial elements.

37. The method of claim 35, wherein the second processed element set or the fourth processed element set has a substantially same height as the plurality of initial elements.

38. The method of claim 35, wherein the first foundation material is the same as the second foundation material.

39. The method of claim 35, wherein the first foundation material is different than the second foundation material.

40. The method of claim 35, wherein the first foundation material comprises nickel (Ni), the non-foundation material comprises silicon dioxide (SiO$_2$) and the second foundation material comprises copper (Cu).

41. The method of claim 29, wherein the plurality of the initial elements comprises a foundation material, the method further comprising:

generating a plurality of graphene layers on the plurality of the initial elements, concurrently or sequentially with the generating the one or more pluralities of graphene layers on one or more selected sets in the plurality of processed element sets, thereby producing said refined graphite-based structure with at least one isolated graphene layer having an initial element width and one or more isolated graphene layers having reduced widths.

42. The method of claim 29, wherein (a) the plurality of thin films comprises a first thin film, a second thin film, a third thin film and a fourth thin film, wherein (i) the first thin film is overlaid on the patterned substrate, has a first thickness, and comprises a first non-foundation material, (ii) the second thin film is overlaid on the first thin film, has a second thickness, and comprises a first foundation material, (iii) the third thin film is overlaid on the second thin film, has a third thickness, and comprises a second non-foundation material, and (iv) the fourth thin film is overlaid on the third thin film, has a fourth thickness and comprises a second foundation material;

(b) the plurality of processed element sets comprises a first processed element set, a second processed element set, a third processed element set and a fourth processed element set, wherein (i) the first processed element set comprises a plurality of processed elements that are defined by retaining portions of the first thin film in the plurality of thin films and have a first reduced width that corresponds to the first thickness, (ii) the second processed element set comprises a plurality of processed elements that are defined by retaining portions of the second thin film in the plurality of thin films and have a second reduced width that corresponds to the second thickness, (iii) the third processed element set comprises a plurality of processed elements that are defined by retaining portions of the third thin film in the plurality of thin films and have a third reduced width that corresponds to the third thickness, (iv) the fourth processed element set comprises a plurality of processed elements that are defined by retaining portions of the fourth thin film in the plurality of thin films and have a fourth reduced width that corresponds to the fourth thickness, (v) a respective processed element in the first processed element set is separated from an adjacent processed element in the third processed element set by a corresponding processed element in the second processed element set, and (vi) a respective processed element in the second processed element set is separated from an adjacent processed element in the fourth processed element set by a corresponding processed element in the third processed element set; and (c) the generating (C) produces one or more pluralities of graphene layers comprising first and second pluralities of graphene layers, thereby producing said refined graphite-based structure with isolated graphene layers having the second or the fourth reduced width, wherein (i) each respective graphene layer in the first plurality of graphene layers is generated on a top surface of a corresponding processed element in the second set, and (ii) each respective graphene layer in the second plurality of graphene layers is generated on a top surface of a corresponding processed element in the fourth set.

43. The method of claim 42, wherein the first processed element set or the third processed element set has a different height than the plurality of initial elements.

44. The method of claim 42, wherein the second processed element set or the fourth processed element set has a different height than the plurality of initial elements.

45. The method of claim 42, wherein the first foundation material is the same as the second foundation material.

46. The method of claim 42, wherein the first foundation material is different than the second foundation material.

47. The method of claim 42, wherein the first and second non-foundation materials comprise silicon dioxide (SiO$_2$), the first foundation material comprises nickel (Ni), and the second foundation material comprises copper (Cu).

48. The method of claim 29, wherein each processed element set in the plurality of processed element sets has a reduced width that is between 2 nm and 100 nm.

49. The method of claim 29, wherein each processed element set in the plurality of processed element sets has a substantially same height as the plurality of initial elements.

50. The method of claim 29, wherein at least one processed element set in the plurality of processed element sets has a different height than the plurality of initial elements.

\* \* \* \* \*